(12) United States Patent
Ueno

(10) Patent No.: US 7,985,996 B2
(45) Date of Patent: Jul. 26, 2011

(54) SEMICONDUCTOR DEVICE COMPRISING CAPACITIVE ELEMENTS

(75) Inventor: Maya Ueno, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 140 days.

(21) Appl. No.: 12/505,597

(22) Filed: Jul. 20, 2009

(65) Prior Publication Data

US 2010/0032741 A1 Feb. 11, 2010

(30) Foreign Application Priority Data

Aug. 6, 2008 (JP) ................................ 2008-202554

(51) Int. Cl.
*H01L 29/94* (2006.01)
(52) U.S. Cl. ................. 257/296; 257/532; 257/E29.342
(58) Field of Classification Search ................. 257/296, 257/298, 532, E29.342; 438/239
See application file for complete search history.

(56) References Cited

U.S. PATENT DOCUMENTS

| | | | |
|---|---|---|---|
| 6,351,020 B1 * | 2/2002 | Tarabbia et al. | 257/532 |
| 6,777,776 B2 * | 8/2004 | Hieda | 257/532 |
| 7,855,431 B2 * | 12/2010 | Park et al. | 257/532 |
| 7,884,409 B2 * | 2/2011 | Kim et al. | 257/306 |
| 2008/0283889 A1 * | 11/2008 | Haraguchi et al. | 257/296 |
| 2009/0159946 A1 * | 6/2009 | Huang et al. | 257/296 |

FOREIGN PATENT DOCUMENTS

JP 2003-060042 A 2/2003

* cited by examiner

*Primary Examiner* — Tuan N. Quach

(74) *Attorney, Agent, or Firm* — Miles & Stockbridge P.C.

(57) ABSTRACT

A technology capable of reducing the fraction defective of a MOS capacitor without the need to perform a screening is provided. A MOS capacitor MOS1 and a MOS capacitor MOS2 are coupled in series between a high potential and a low potential to form a series capacitive element. Then, a polysilicon capacitor PIP1 and a polysilicon capacitor PIP2 are coupled in parallel with the series capacitive element. Specifically, a high-concentration semiconductor region HS1 constituting a lower electrode of the MOS capacitor MOS1 and a high-concentration semiconductor region HS2 constituting a lower electrode of the MOS capacitor MOS2 are coupled. Further, an electrode E1 constituting an upper electrode of the MOS capacitor MOS1 is coupled to the low potential (for example, GND) and an electrode E3 constituting an upper electrode of the MOS capacitor MOS2 is coupled to the high potential (for example, power source potential).

16 Claims, 33 Drawing Sheets

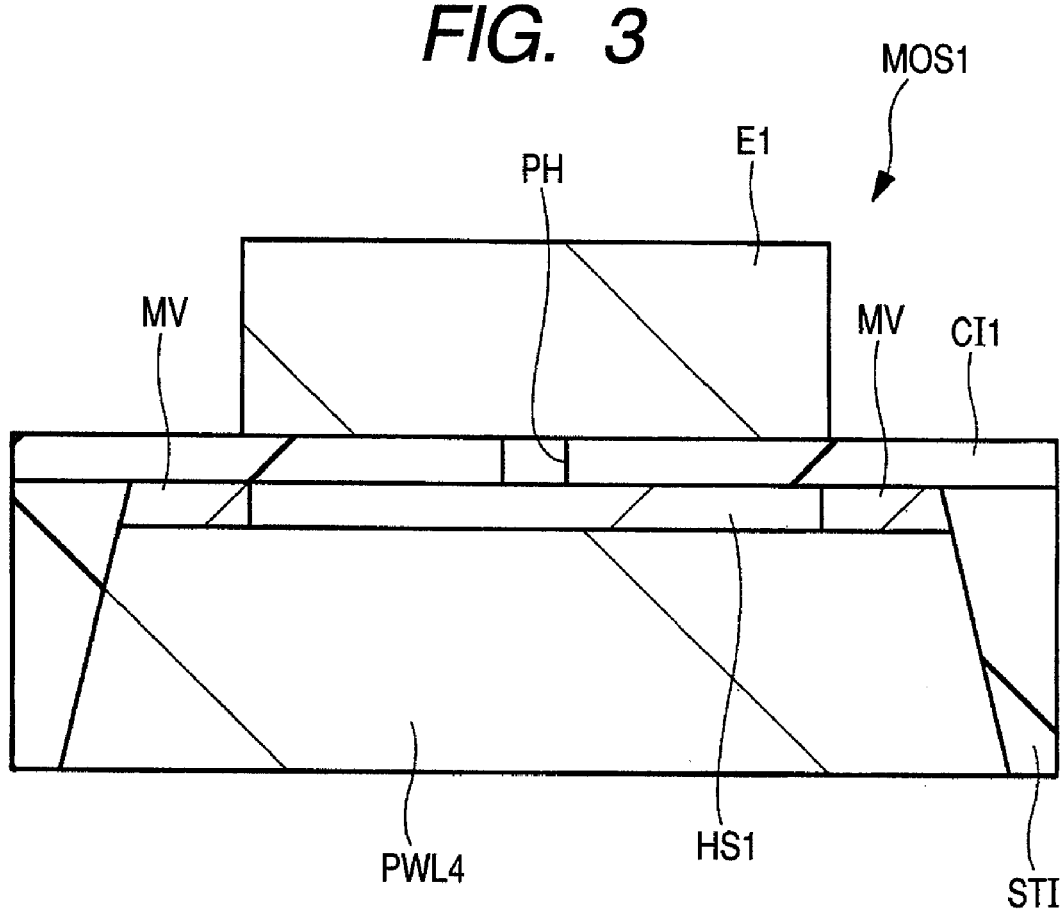

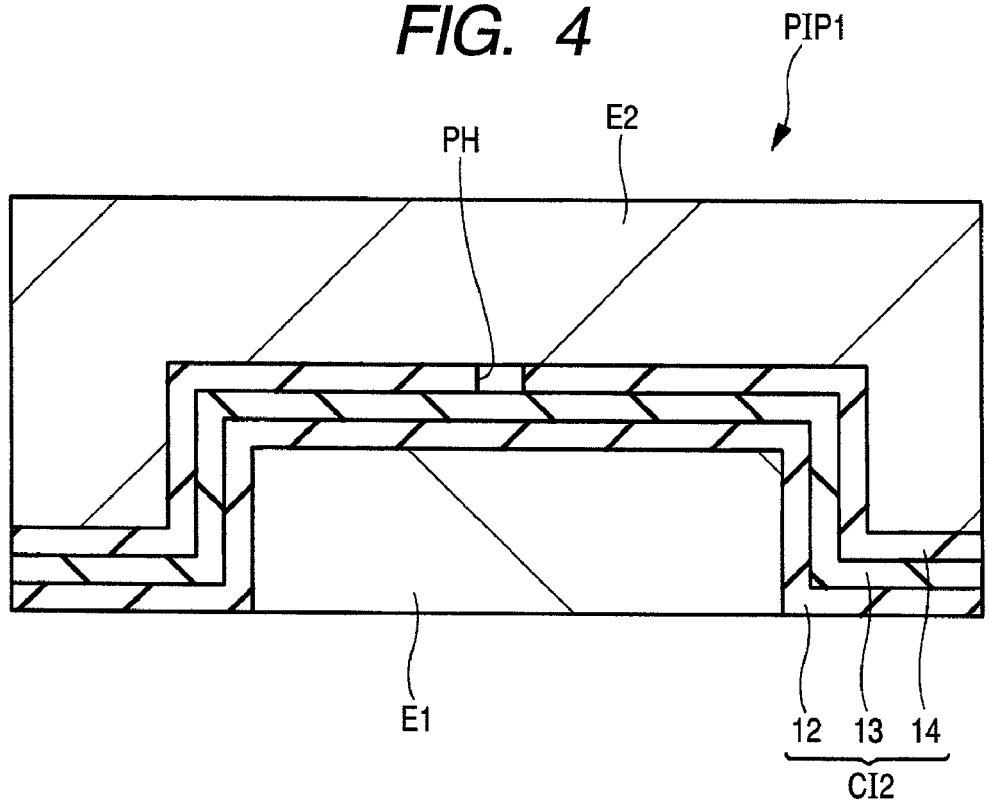
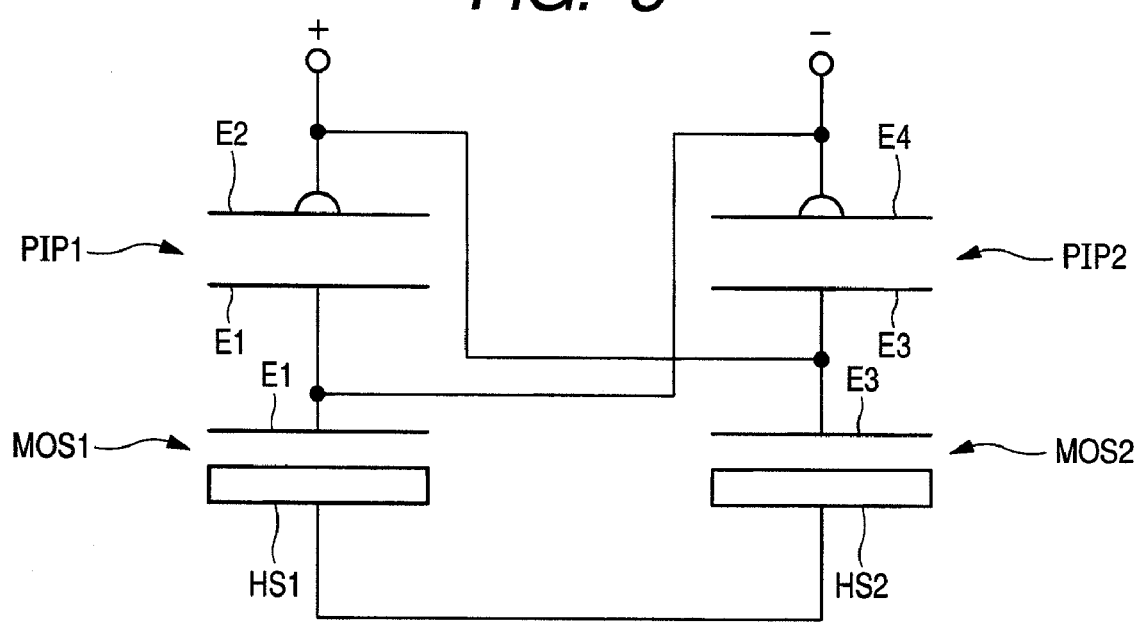

FIG. 13
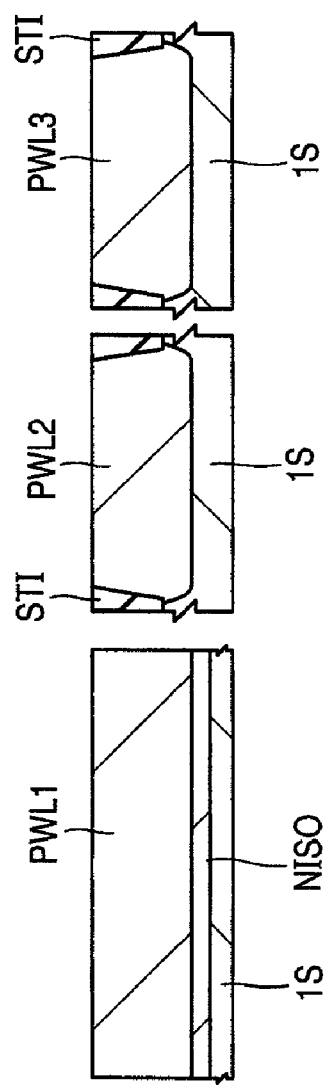
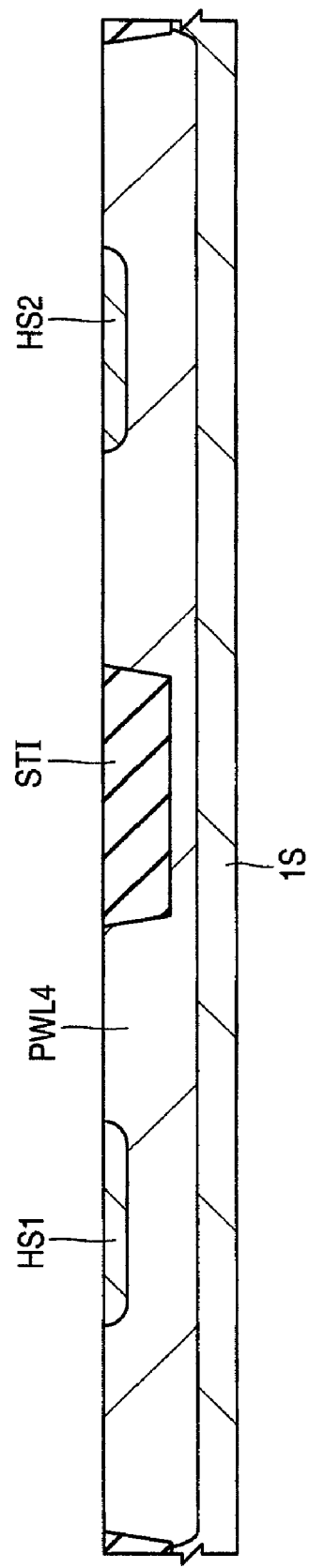

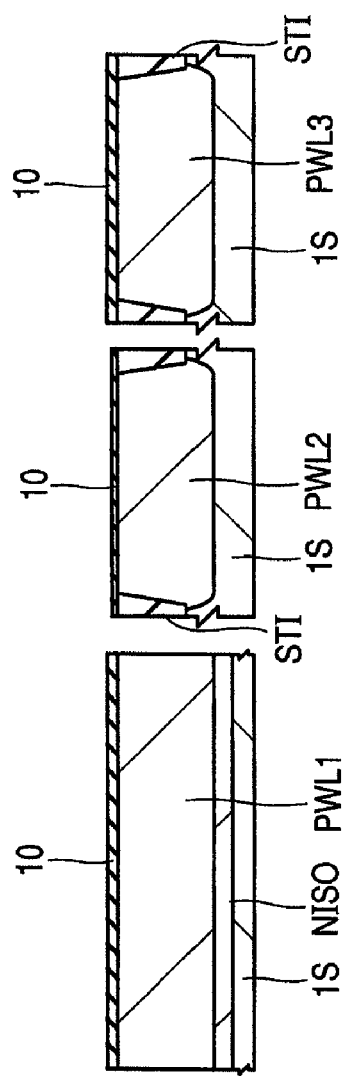
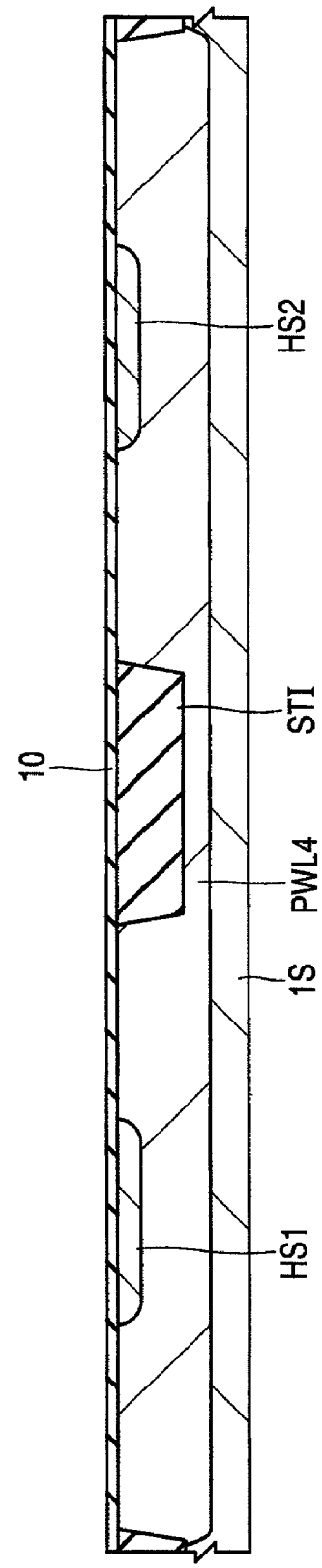
FIG. 14

FIG. 15
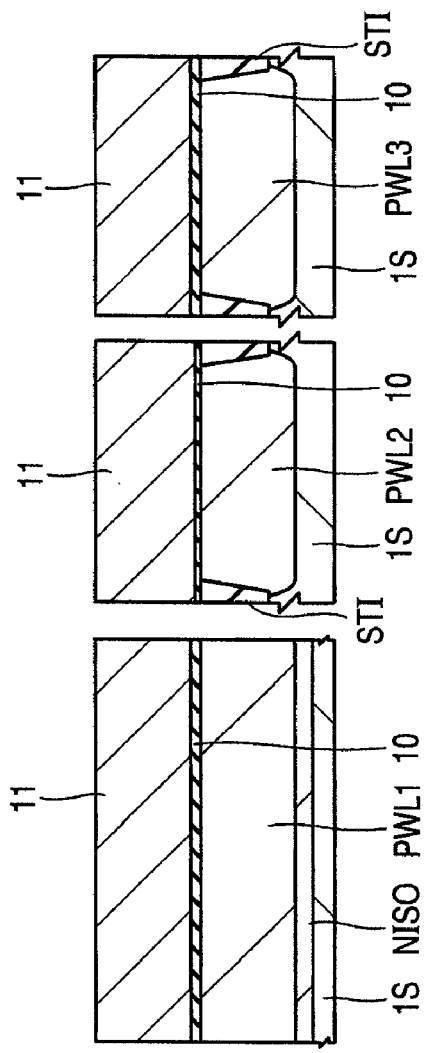
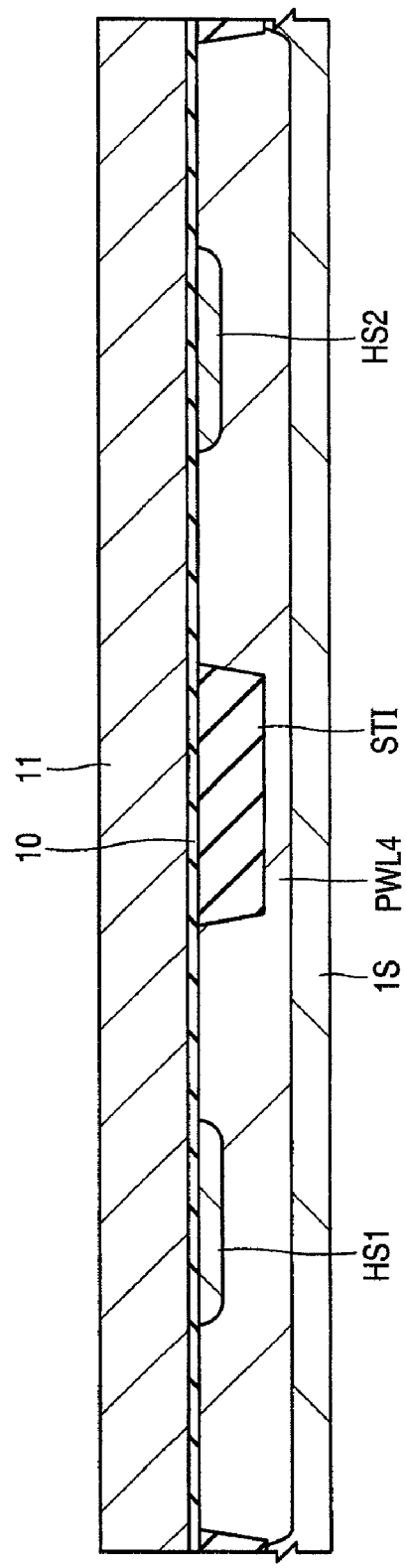

FIG. 17
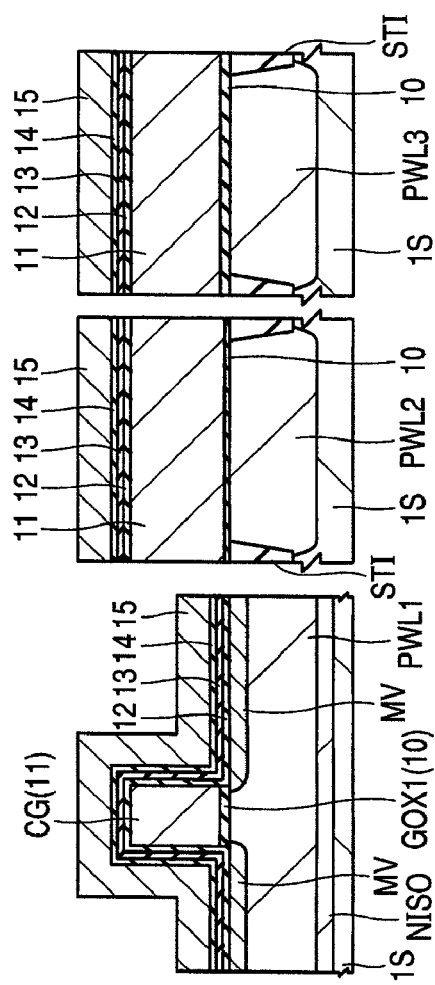
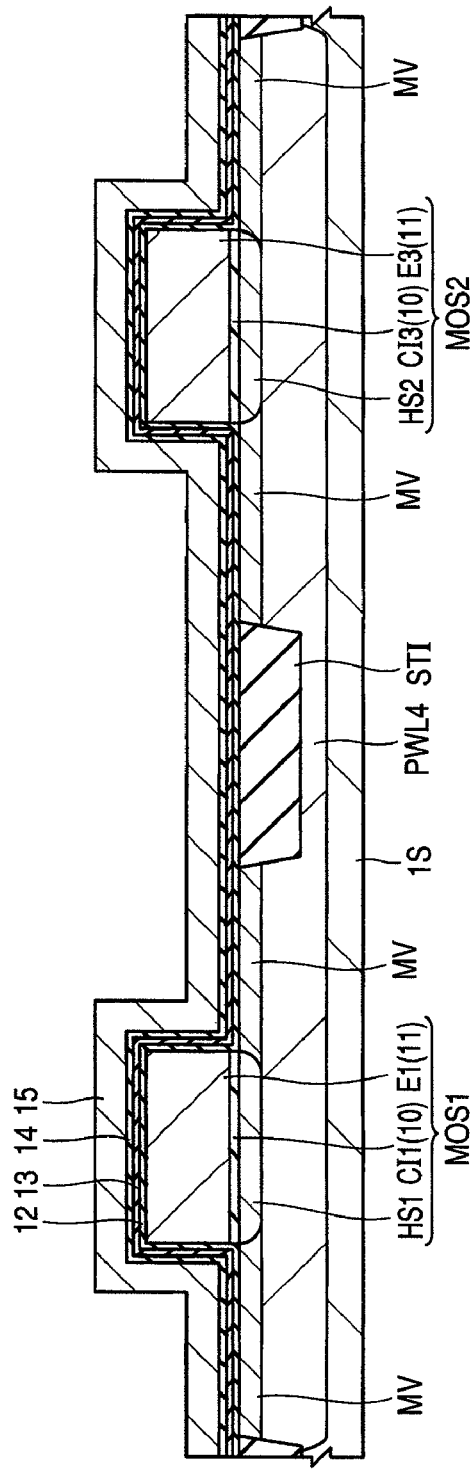

FIG. 19
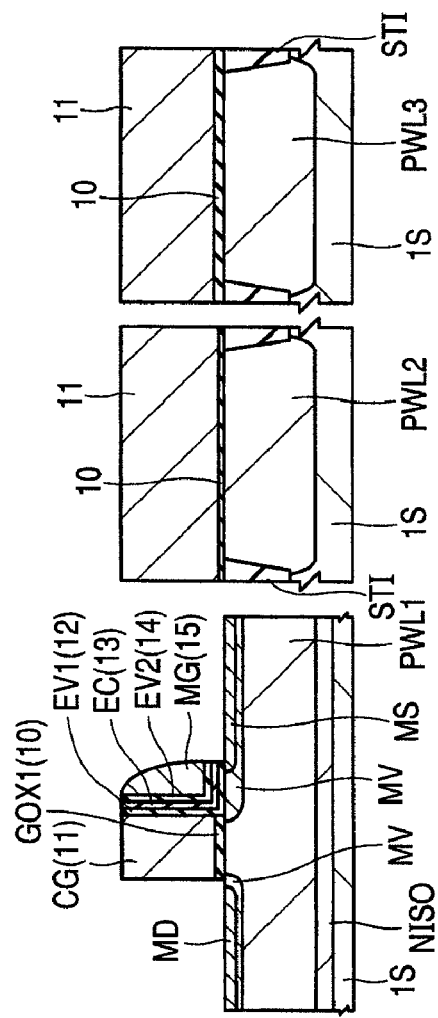
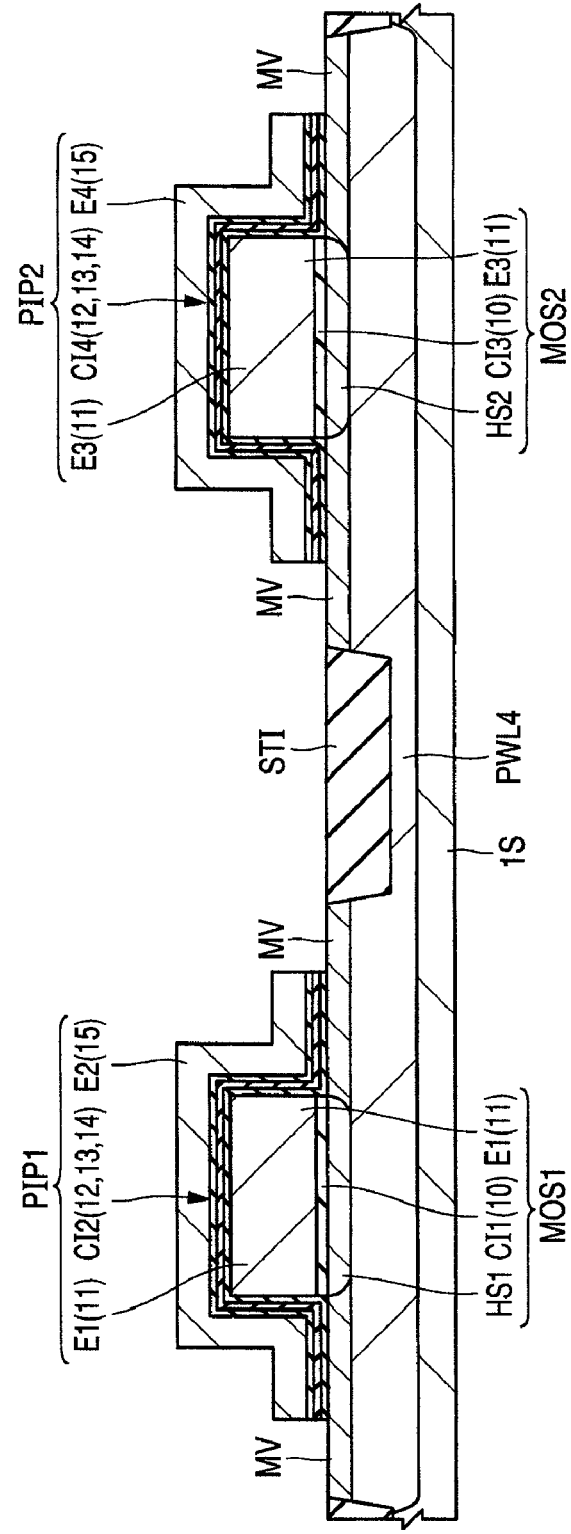

FIG. 29
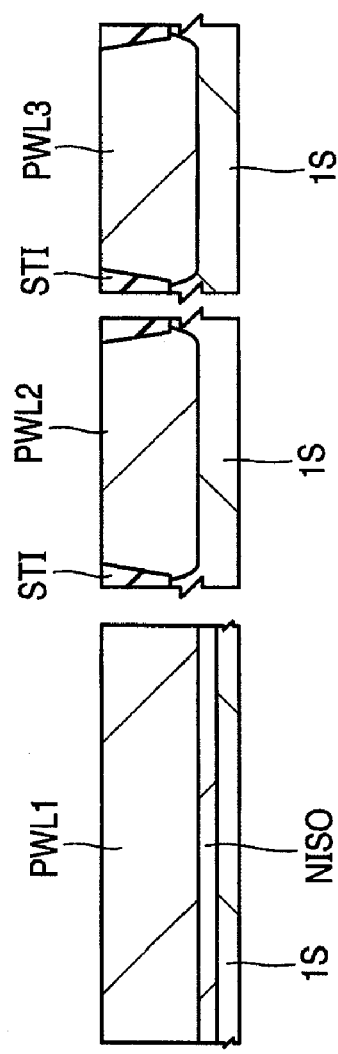
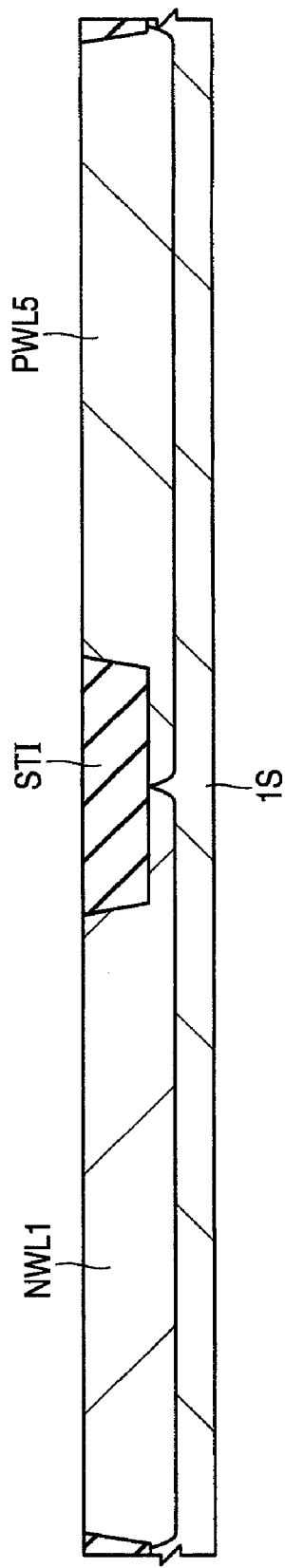

FIG. 30
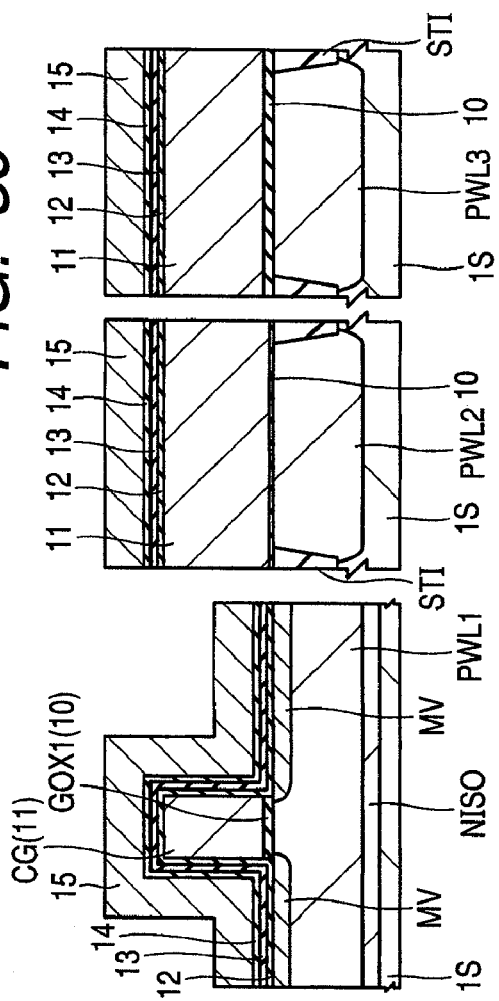
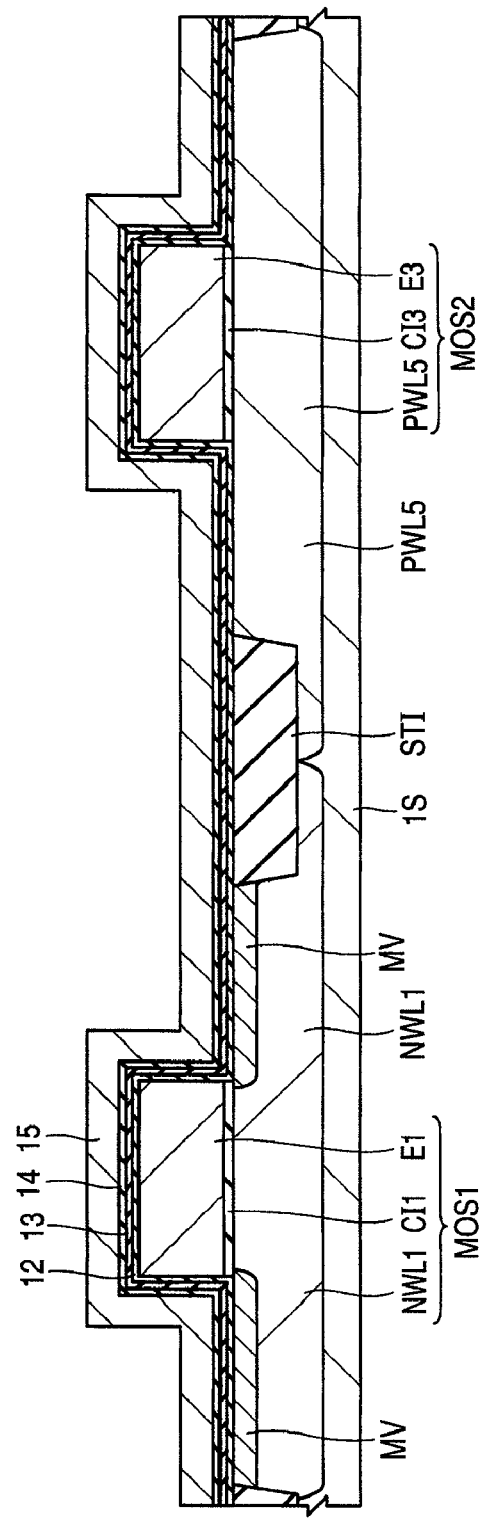

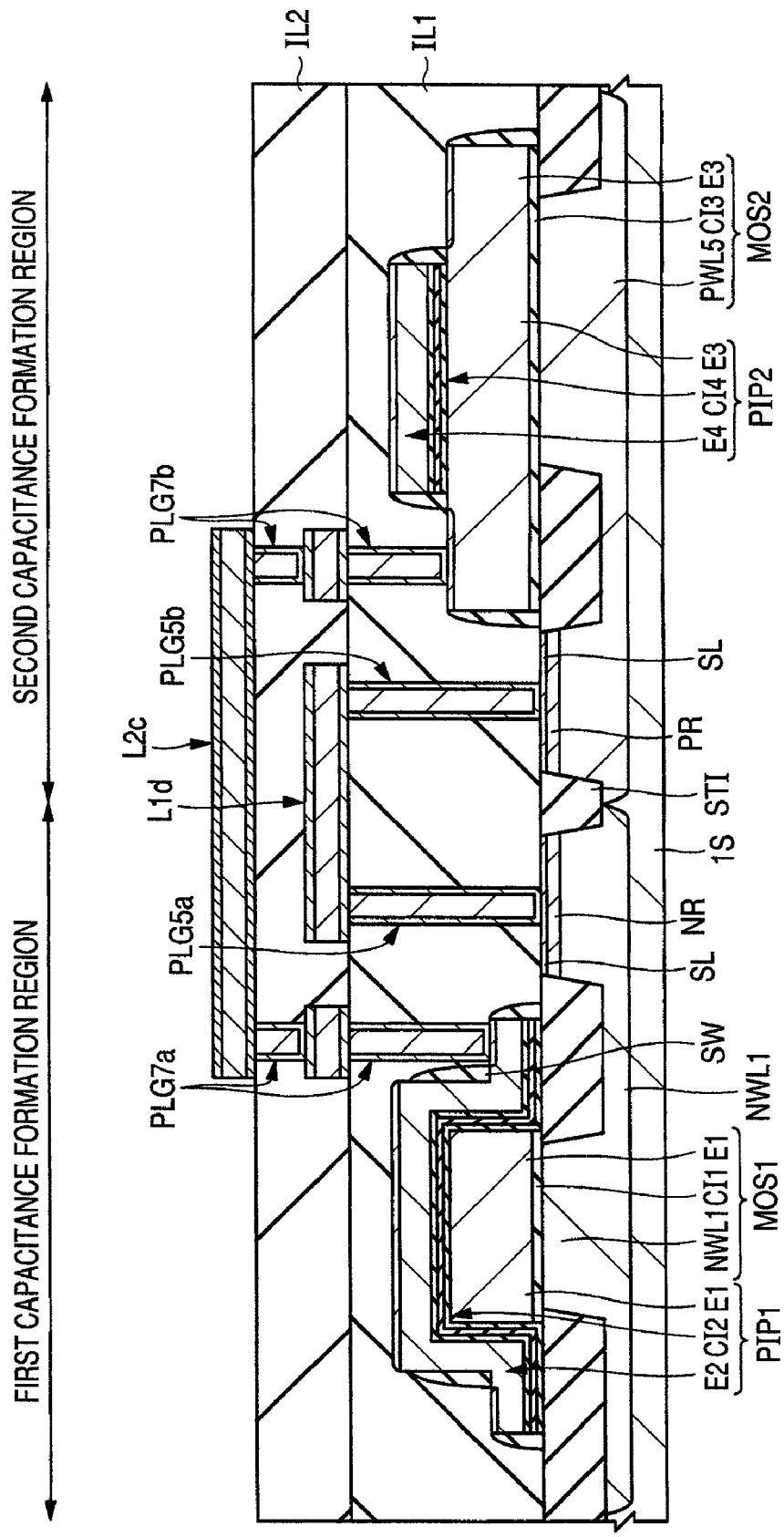

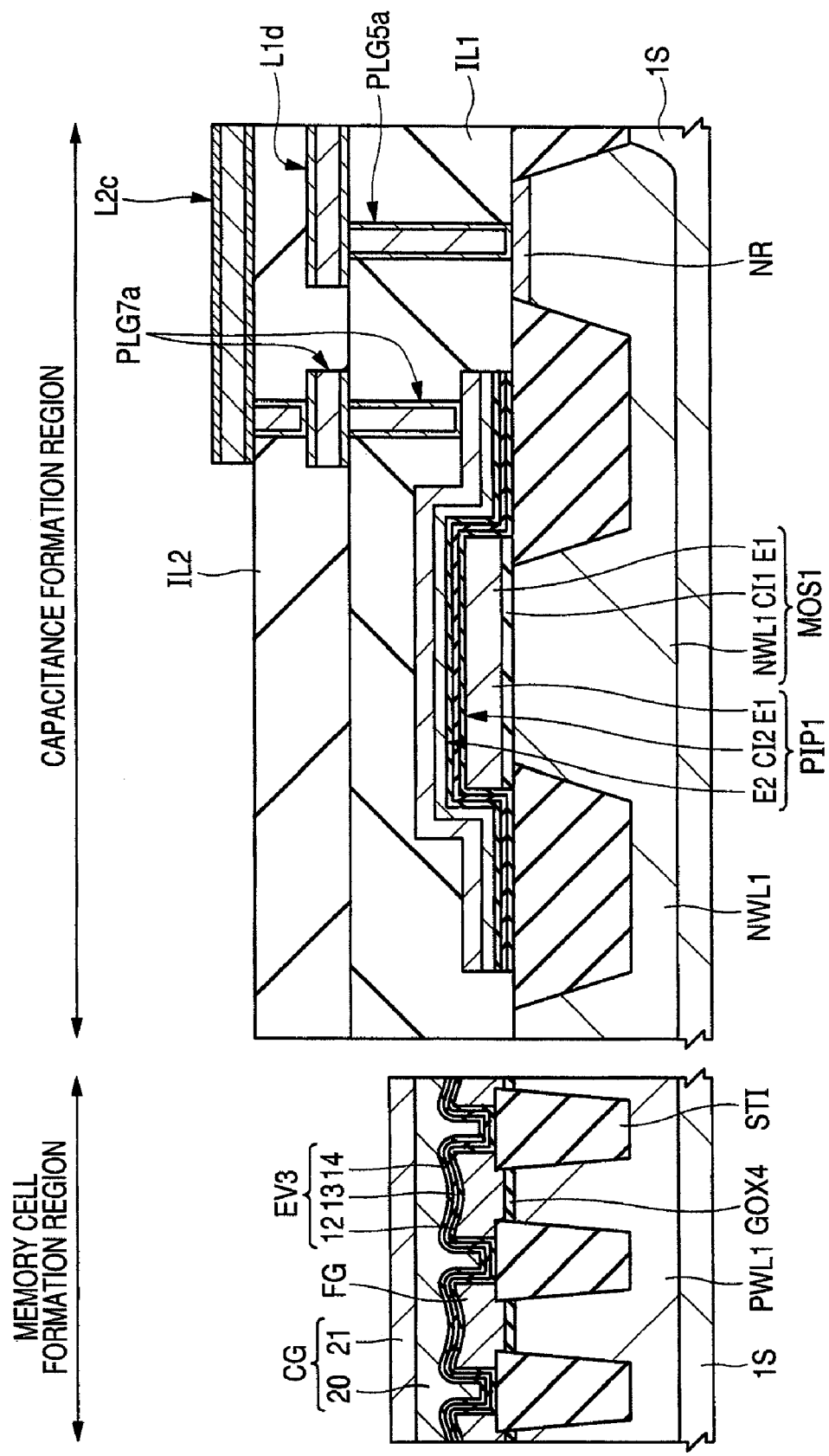

SEMICONDUCTOR DEVICE COMPRISING CAPACITIVE ELEMENTS

CROSS-REFERENCE TO RELATED APPLICATION

The disclosure of Japanese Patent Application No. 2008-202554 filed on Aug. 6, 2008 including the specification, drawings and abstract is incorporated herein by reference in its entirety.

BACKGROUND OF THE INVENTION

The present invention relates to a semiconductor device and its manufacturing technology and, more particularly, to a semiconductor device including a plurality of capacitive elements and a technology effective when applied to its manufacture.

In Japanese patent laid-open No. 2003-60042 (patent document 1), a technology is described, which forms a capacitive element (capacitor) by laminating it over a semiconductor substrate. Specifically, a structure is disclosed, which is formed by laminating a MOS (Metal Oxide Semiconductor) capacitor including a well (first electrode) formed in the semiconductor substrate and a second electrode including a polysilicon film formed over the well via an insulating film and a PIP (Polysilicon Insulator Polysilicon) capacitor including the second electrode and a third electrode including a polysilicon film formed over the second electrode via an insulating film.

SUMMARY OF THE INVENTION

Conventionally, a capacitive element which functions as a passive element in an integrated circuit is formed over a semiconductor substrate. At this time, there may be a case where a plurality of capacitive elements is formed by lamination over the semiconductor substrate in order to increase capacitance per unit area. The formation of the capacitive elements by lamination over a semiconductor substrate is performed by, for example, laminating a MOS capacitor and a PIP capacitor.

A MOS capacitor is a capacitive element in which a well (semiconductor region) formed in a semiconductor substrate is used as a lower electrode and a polysilicon film formed over the well via an insulating film is used as an upper electrode. A PIP capacitor is a capacitive element in which both electrodes, that is, the lower electrode and the upper electrode, are formed from a polysilicon film and it can be realized by, for example, forming the upper electrode including a polysilicon film over the lower electrode including a polysilicon film via an insulating film. Consequently, it is possible to form the capacitive elements by lamination over a semiconductor substrate by forming a MOS capacitor over the semiconductor substrate and forming a PIP capacitor over the MOS capacitor.

The MOS capacitor and the PIP capacitor are thus formed by lamination, however, it is known that a pin hole defect tends to occur in a capacitor insulating film formed between the upper electrode and the lower electrode particularly in the MOS capacitor, which is formed in the lower layer. If a pin hole defect occurs in a capacitor insulating film, a state is brought about where the upper electrode and the lower electrode are brought into conduction via the pin hole defect when a potential difference is applied between the upper electrode and the lower electrode and it no longer functions as a capacitive element. That is, if a pin hole defect occurs in a capacitor insulating film, a withstand voltage failure between the upper electrode and the lower electrode constituting the MOS capacitor becomes a problem.

Because of this, in order to sort out a MOS capacitor in which a pin hole defect exists in advance before the shipment of the product, a reliability test called a screening is performed. This screening is performed to distinguish conforming products from nonconforming products based on a certain standard or criterion and a variety of defects that potentially remain in the finished product are revealed by a nondestructive test. As described above, a screening is an effective means to reduce the initial failure rate of product.

Specifically, for example, for a MOS capacitor, in order to reduce the market fraction defective to or below 1 ppm, a screening is performed, in which a voltage of 4.5 V is applied between the upper electrode and the lower electrode of the MOS capacitor and this state where the voltage is applied is maintained for 16 hours. Consequently, if the screening with the above-described conditions is performed for a MOS capacitor, it is possible to sort out a MOS capacitor having the pin hole defect and reduce the market fraction defective to or below 1 ppm.

In this screening, a voltage of 4.5 V is applied to the MOS capacitor, however, it is not possible to perform the screening by applying a voltage of 4.5 V to all of the MOS capacitors. For example, a MOS capacitor functions as a passive element in an integrated circuit and there exist circuits that operate at a variety of power source voltages in the integrated circuit. For example, in a MOS capacitor used in a high-voltage circuit having the power source voltage of 4.5 V or more, the application of a voltage of 4.5 V or more to a high-voltage circuit including the MOS capacitor is supposed, and therefore, there arises no problem even if a voltage of 4.5 V is applied to the MOS capacitor (high-voltage circuit) in the screening. In contrast to this, for example, when the MOS capacitor is used in a low-voltage circuit having the power source voltage of 1.5 V, it is basically supposed that only a voltage not more than the power source voltage is applied to the low-voltage circuit including the MOS capacitor. Because of this, if a voltage higher than the power source voltage is applied in the screening of the MOS capacitor used in the low-voltage circuit, there is a possibility that the low-voltage circuit is destroyed. As described above, the MOS capacitor is used in circuits driven at a variety of voltages, and therefore, it is not possible to uniformly specify a voltage to be used in a screening.

For example, when a screening is performed for a MOS capacitor used in a low-voltage circuit having the power source voltage of 1.5 V, it is required to set a voltage to be applied to the low-voltage circuit in the screening to 1.5 V or less. In this case, a long screening is required to reduce the market fraction defective to 1 ppm or less. That is, in the screening with a voltage of 1.5 V or less, many hours are necessary to obtain the same screening effect as that of the screening in which a voltage of 4.5 V is applied for 16 hours and it is not practical. However, if the application time of the voltage is reduced, the screening is not sufficient and it is no longer possible to satisfactorily sort out a MOS capacitor in which a pin hole defect exists.

An object of the present invention is to provide a technology capable of reducing the fraction defective of MOS capacitors without the need to perform a screening.

The other purposes and the novel feature of the present invention will become clear from the description of the present specification and the accompanying drawings.

The following describes briefly the outline of a typical invention among the inventions disclosed in the present application.

A semiconductor device according to a typical embodiment of the preset invention has a first capacitance formation region and a second capacitance formation region in a semiconductor substrate. In the first capacitance formation region, a first capacitive element is formed which includes (a1) a first lower electrode having a first semiconductor region formed in the semiconductor substrate, (a2) a first capacitor insulating film formed over the semiconductor substrate, and (a3) a first upper electrode having a first conductive film formed over the first capacitor insulating film. Further, in the first capacitance formation region, a second capacitive element is formed which includes (b1) a second lower electrode including the first conductive film, (b2) a second capacitor insulating film formed over the first conductive film, and (b3) a second upper electrode including a second conductive film formed over the second capacitor insulating film. On the other hand, in the second capacitance formation region, a third capacitive element is formed which includes (c1) a third lower electrode having a second semiconductor region formed in the semiconductor substrate, (c2) a third capacitor insulating film formed over the second semiconductor substrate and (c3) a third upper electrode having a first conductive film formed over the first capacitor insulating film. Then, furthermore, in the second capacitance formation region, a fourth capacitive element is formed which includes (d1) a fourth lower electrode having the first conductive film, (d2) a fourth capacitor insulating film formed over the first conductive film, and (d3) a fourth upper electrode having a second conductive film formed over the second capacitor insulating film.

Here, the semiconductor device is characterized in that the first capacitive element and the third capacitive element are coupled in series to form a series capacitive element and, at the same time, the series capacitive element and the second capacitive element are coupled in parallel and the series capacitive element and the fourth capacitive element are also coupled in parallel.

A manufacturing method of a semiconductor device according to a typical embodiment of the present invention relates to a method for manufacturing a semiconductor device over a semiconductor substrate having a first capacitance formation region, a second capacitance formation region, and a memory cell formation region. The method includes a step of (a) forming a first semiconductor region in the semiconductor substrate in the first capacitance formation region and forming a second semiconductor region in the semiconductor substrate in the second capacitance formation region, and thereby forming a first lower electrode including the first semiconductor region in the first capacitance formation region and forming a third lower electrode including the second semiconductor region in the second capacitance formation region. Subsequently, the method includes a step of (b), after the step (a), forming a first insulating film over the semiconductor substrate in the first capacitance formation region, the second capacitance formation region, and the memory cell formation region, and thereby forming a gate insulating film including the first insulating film in the memory cell formation region and, at the same time, forming a first capacitor insulating film including the first insulating film in the first capacitance formation region, and forming a third capacitor insulating film including the first insulating film in the second capacitance formation region. Next, the method includes the steps of (c), after the step (b), forming a first conductive film over the first insulating film, and (d), after the step (c), patterning the first conductive film, and thereby forming a control gate electrode in the memory cell formation region and, at the same time, forming a first upper electrode in the first capacitance formation region and forming a third upper electrode in the second capacitance formation region. Then, the method includes a step of (e), after the step (d), forming a laminated insulating film over the semiconductor substrate including the first capacitance formation region, the second capacitance formation region, and the memory cell formation region, and thereby forming a first potential barrier film, a charge storage film, and a second potential barrier film including the laminated insulating film in the memory cell formation region and, at the same time, forming a second capacitor insulating film including the laminated insulating film in the first capacitance formation region and forming a fourth capacitor insulating film including the laminated insulating film in the second capacitance formation region. Further, the method includes the steps of (f), after the step (e), forming a second conductive film over the laminated insulating film and (g), after the step (f), patterning the second conductive film, and thereby leaving the second conductive film on the sidewall on both sides of the control gate electrode in the memory cell formation region and, at the same time, forming a second upper electrode including the second conductive film over the second capacitor insulating film in the first capacitance formation region and forming a fourth upper electrode including the second conductive film over the fourth capacitor insulating film in the second capacitance formation region. Subsequently, the method includes the steps of (h), after the step (g), leaving the second conductive film only on one side of the sidewalls of the control gate electrode in the memory cell formation region, and thereby forming a memory gate electrode including the second conductive film and (i), after the step (h), forming a plurality of wires over the semiconductor substrate via an interlayer insulating film.

Here, the method is characterized as follows. That is, a first capacitive element including the first lower electrode, the first capacitor insulating film, and the first upper electrode and a third capacitive element including the third lower electrode, the third capacitor insulating film, and the third upper electrode are coupled in series using the wires to form a series capacitive element. Then, the first upper electrode is used as a second lower electrode, and a second capacitive element including the second lower electrode, the second capacitor insulating film, and the second upper electrode, and the series capacitive element are coupled in parallel using the wires. Similarly, the third upper electrode is used as a fourth lower electrode, and a fourth capacitive element including the fourth lower electrode, the fourth capacitor insulating film, and the fourth upper electrode and the series capacitive element are coupled in parallel using the wires.

The following describes briefly the effect acquired by the typical invention among the inventions disclosed in the present application.

It is possible to reduce the fraction defective without the need to perform a screening.

BRIEF DESCRIPTION OF THE DRAWINGS

FIG. 3 illustrates a pin hole defect that occurs in a MOS capacitor;

FIG. 4 is a section view showing a configuration of a polysilicon capacitor;

FIG. 5 is a circuit diagram illustrating a configuration of a capacitive element in a first embodiment of the present invention;

FIG. 13 is a section view illustrating a manufacturing process of the semiconductor device, following FIG. 12;

FIG. 14 is a section view illustrating a manufacturing process of the semiconductor device, following FIG. 13;

FIG. 15 is a section view illustrating a manufacturing process of the semiconductor device, following FIG. 14;

FIG. 17 is a section view illustrating a manufacturing process of the semiconductor device, following FIG. 16;

FIG. 19 is a section view illustrating a manufacturing process of the semiconductor device, following FIG. 18;

FIG. 29 is a section view illustrating a manufacturing process of a semiconductor device in the second embodiment;

FIG. 30 is a section view illustrating a manufacturing process of the semiconductor device, following FIG. 29;

FIG. 33 is a section view cut along A-A line in FIG. 32; and

FIG. 34 is a section view illustrating a nonvolatile memory and capacitive elements in a fourth embodiment.

DETAILED DESCRIPTION OF THE PREFERRED EMBODIMENTS

The following embodiments will be described, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

First Embodiment

Figure 1:
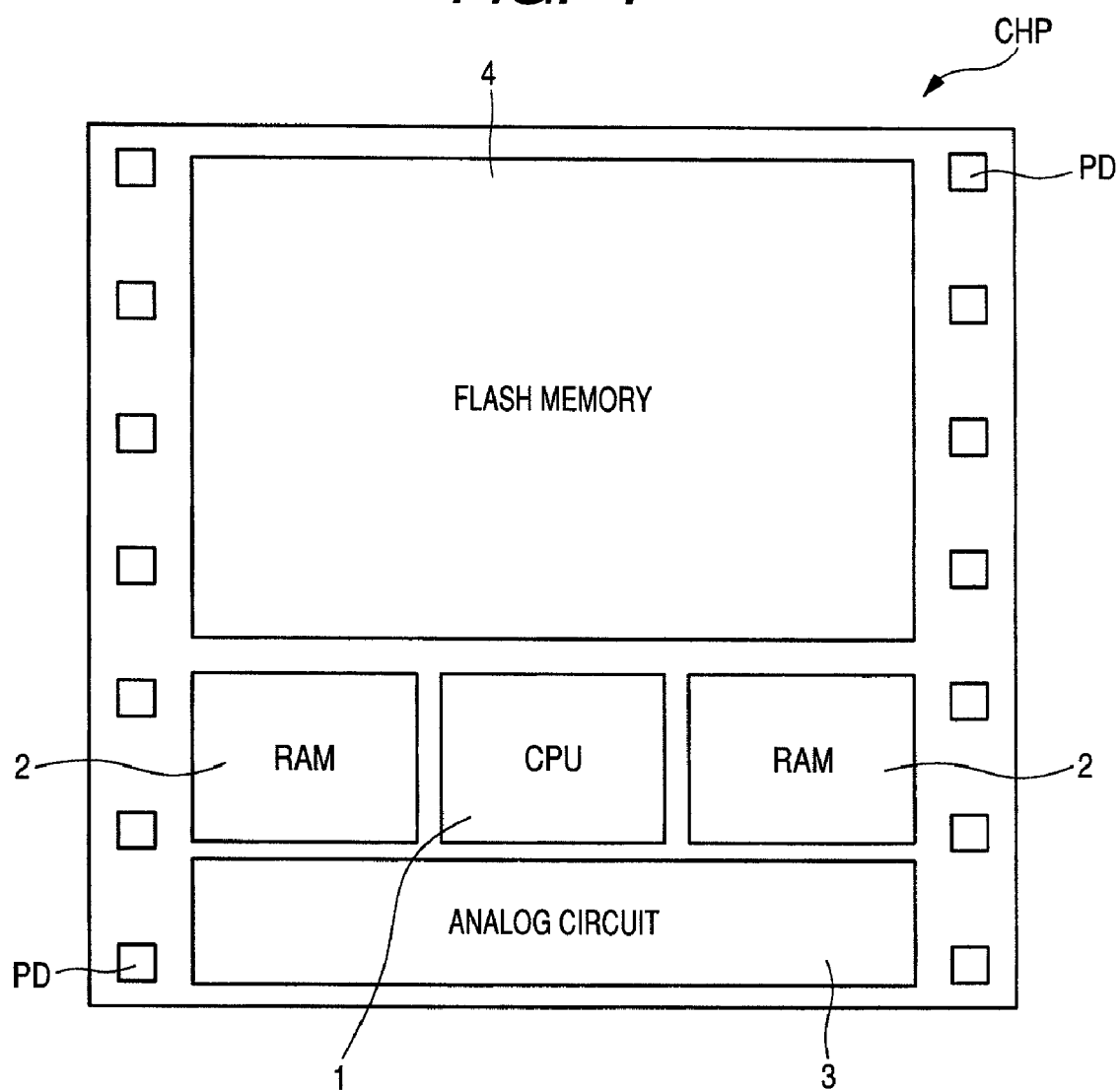
FIG. 1 is a plan view showing a semiconductor chip forming a microcomputer, and a diagram illustrating a layout configuration of each element formed over the semiconductor chip.

FIG. 1, for example, is a plan view showing a semiconductor chip (semiconductor substrate) CHP that forms a microcomputer, and a diagram showing a layout configuration of each element formed in the semiconductor chip CHP. In FIG. 1, the semiconductor chip CHP has a CPU (Central Processing Unit) 1, a RAM (Random Access Memory) 2, an analog circuit 3, and a flash memory 4. Then, on the periphery of the semiconductor chip, pads PD that are input/output external terminals to couple these circuits and external circuits are formed.

The CPU (circuit) 1 is also called a central processing unit and plays an important role as the heart of a computer etc. The CPU 1 reads and decodes a command from a storage device and performs a variety of operations and controls based thereon and high-speed of processing is required. Consequently, a MISFET (Metal Insulator Semiconductor Field Effect Transistor) constituting the CPU 1 requires a relatively larger current drive force than other elements formed in the semiconductor chip CHP. That is, the CPU 1 is formed by a low withstand voltage MISFET.

The RAM (circuit) 2 is a memory capable of randomly reading memory information, that is, reading stored memory information at any time and of newly writing memory information, and is also called a memory capable of reading/writing at any time. There are two kinds of RAM as an IC memory: a DRAM (Dynamic RAM) that uses a dynamic circuit and an SRAM (Static RAM) that uses a static circuit. A DRAM is a memory capable of reading/writing at any time that requires a memory holding operation and an SRAM is a memory capable of reading/writing at any time that does not require a memory holding operation. This RAM 2 is also required to be capable of high-speed operation, and therefore, a MISFET constituting the RAM 2 requires a relatively large current drive force. That is, the RAM 2 is formed by a low withstand voltage MISFET.

The analog circuit 3 is a circuit that handles a signal of voltage or current that continuously changes with time, that is, an analog signal and includes, for example, an amplifier circuit, a converter circuit, a modulation circuit, an oscillation circuit, a power source circuit, etc. In the analog circuit 3, a relatively high withstand voltage MISFET is used among elements formed in the semiconductor chip CHP.

The flash memory 4 is one kind of nonvolatile memory capable of being electrically rewritten in both the write operation and the erase operation and also called a programmable read-only memory that can be electrically erased. The memory cell of the flash memory 4 includes a MISFET for memory cell selection and, for example, an FET of MONOS (Metal Oxide Nitride Oxide Semiconductor) type for storage (memory). The write operation of a flash memory makes use of, for example, the hot-electron injection or the Fowler-Nordheim tunneling phenomenon and the erase operation makes use of the Fowler-Nordheim tunneling phenomenon or the hot-hole injection. It is obvious that the hot-electron injection and the hot-hole injection can be reversed.

In order to operate the above-described flash memory 4, a drive circuit, such as a step-up circuit, is formed in the semiconductor chip CHP. This drive circuit requires a high-precision capacitive element. Further, the peripheral circuits of the CPU 1 and the RAM 2 described above and the analog circuit 3 also require a high-precision capacitive element. Consequently, in the semiconductor chip CHP, capacitive elements are formed in addition to the memory cell of the flash memory 4 and MISFET described above.

Next, the configuration of the memory cell formed in the memory cell formation region of the flash memory 4, the low withstand voltage MISFET formed in the low withstand voltage MISFET formation region, the high withstand voltage MISFET formed in the high withstand voltage MISFET, and the capacitive element formed in the capacitive element formation region will be described.

Figure 2:
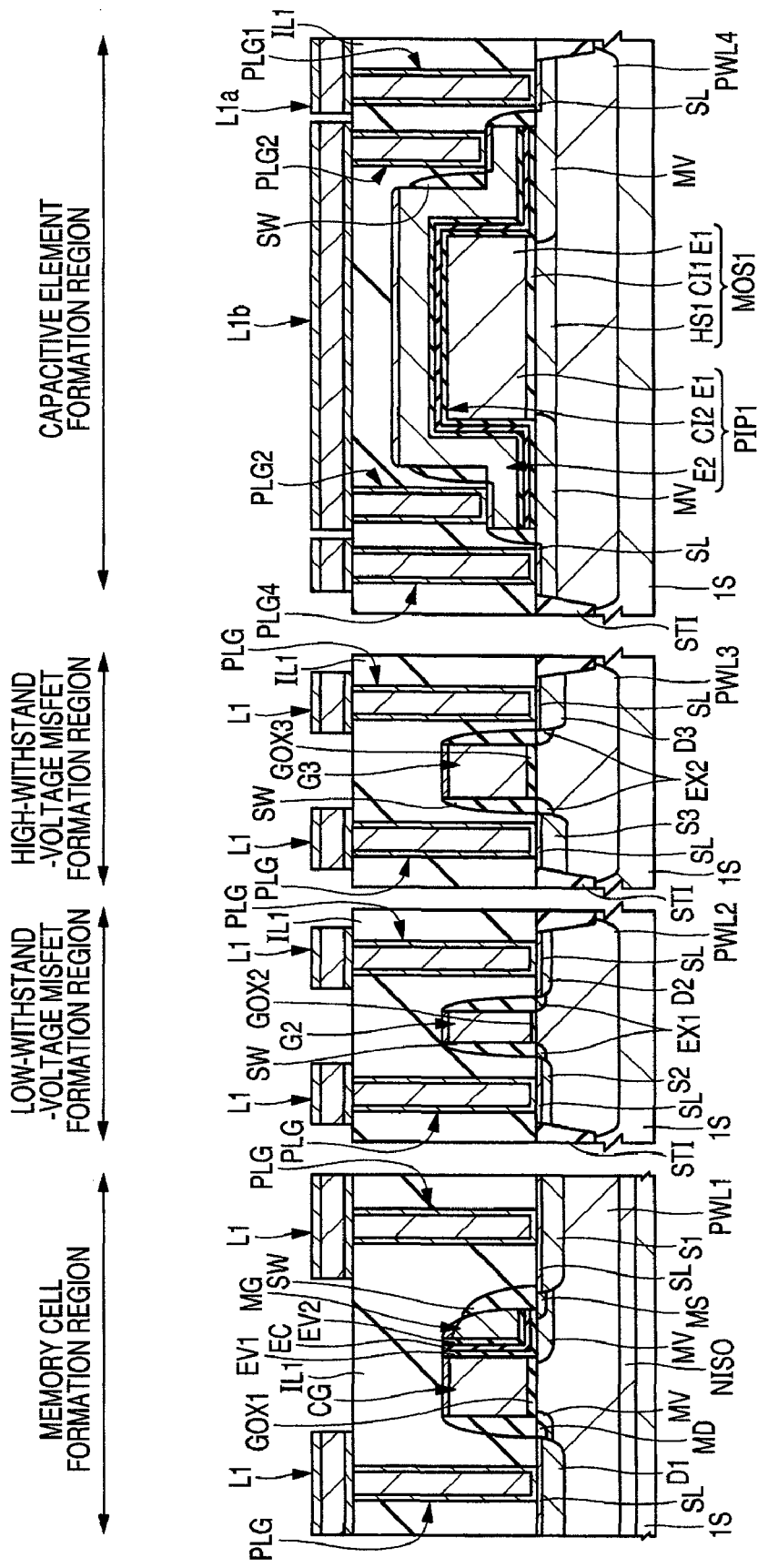
FIG. 2 is a section view showing a memory cell formed in a memory cell formation region, a low withstand voltage MISFET formed in a low withstand voltage MISFET formation region, a high withstand voltage MISFET formed in a high withstand voltage MISFET formation region, and capacitive elements formed in a capacitive element formation region, respectively.

FIG. 2 is a section view showing the memory cell formed in the memory cell formation region, the low withstand voltage MISFET formed in the low withstand voltage MISFET formation region, the high withstand voltage MISFET formed in the high withstand voltage MISFET formation region, and the capacitive element formed in the capacitive element formation region, respectively.

First, the structure of the memory cell of a flash memory will be described. As shown in FIG. 2, in the memory cell formation region, a well isolation layer NISO including an n-type semiconductor region is formed over a semiconductor substrate 1S and a p-type well PWL 1 is formed over the well isolation layer NISO. Then, a memory cell is formed over the p-type well PWL1. This memory cell includes a selection part that selects a memory cell and a storage part that stores information. First, the configuration of the selection part that selects a memory cell will be described. A memory cell has a gate insulating film (first gate insulating film) GOX1 formed over the semiconductor substrate 1S (p-type well PWL1) and over the gate insulating film GOX1, a control gate electrode (control electrode) CG is formed. The gate insulating film GOX1 is formed, for example, from a silicon oxide film and the control gate electrode CG is formed, for example, from a polysilicon film and a cobalt silicide film formed over the polysilicon film. The cobalt silicide film is formed for the purpose of reducing the resistance of the control gate electrode CG. The control gate electrode CG has a function to select a memory cell. That is, a specific memory cell is selected by the control gate electrode CG and the selected memory cell is subjected to the write operation, the erase operation, and the read operation.

Next, the configuration of the storage part of the memory cell will be described. On one of the sidewalls of the control gate electrode CG, a memory gate electrode MG is formed via a laminated film including an insulating film. The memory gate electrode MG has the shape of a sidewall formed on one of the sidewalls of the control gate electrode CG and formed from a polysilicon film and a cobalt silicide film formed over the polysilicon film. The cobalt silicide film is formed for the purpose of reducing the resistance of the memory gate electrode MG.

A laminated film is formed between the control gate electrode CG and the memory gate electrode MG and between the memory gate electrode MG and the semiconductor substrate 1S. The laminate film includes a potential barrier film EV1 formed over the semiconductor substrate 1S, a charge storage film EC formed over the potential barrier film EV1, and a potential barrier film EV2 formed over the charge storage film EC. The potential barrier film EV1 is formed, for example, from a silicon oxide film and functions as a gate insulating film formed between the memory gate electrode MG and the semiconductor substrate 1S. The potential barrier film including a silicon oxide film also has a function as a tunnel insulating film. For example, the storage part of the memory cell injects electrons to the charge storage film EC from the semiconductor substrate 1S via the potential barrier film EV1, or injects holes to the charge storage film EC to store or delete information, and therefore, the potential barrier film EV1 functions as a tunnel insulating film.

Then, the charge storage film EC formed over the potential barrier film EV1 has a function to store charges. Specifically, in the first embodiment, the charge storage film EC is formed from a silicon nitride film. The storage part of the memory cell in the first embodiment stores information by controlling a current that flows through the semiconductor substrate 1S under the memory gate electrode MG depending on the presence/absence of charges to be stored in the charge storage film EC. That is, information is stored by making use of the change of the threshold voltage of the current that flows through the semiconductor substrate 1S under the memory gate electrode MG depending on the presence/absence of charges to be stored in the charge storage film EC.

In the first embodiment, an insulating film having a trap level is used as the charge storage film EC. An example of an insulating film having a trap level includes a silicon nitride film, however, not limited to a silicon nitride film, and for example, a high-k dielectric film having a dielectric constant higher than that of a silicon nitride film, such as an aluminum oxide film (alumina), a hafnium oxide film, and a tantalum oxide film, may be used. When an insulating film having a trap level is used as the charge storage film EC, charges are trapped at the trap level formed in the insulating film. In this manner, by trapping charges at the trap level, charges are stored in the insulating film.

Conventionally, a polysilicon film is mainly used as the charge storage film EC, however, when a polysilicon film is used as the charge storage film EC, if there is a defect in part of the potential barrier film EV1 or the potential barrier film EV2 surrounding the charge storage film EC, there may be a case where all the charges stored in the charge storage film EC are discharged due to abnormal leak because the charge storage film EC is a conductive film.

Because of this, a silicon nitride film, which is an insulator, is used as the charge storage film EC. In this case, charges that contribute to data storage are stored at discrete trap levels that exist in the silicon nitride film. Consequently, even if a defect occurs in part of the potential barrier film EV1 or the potential barrier film EV2 surrounding the charge storage film EC, it is unlikely that all the charges are discharged from the charge storage film EC because charges are stored at the discrete trap levels of the charge storage film EC. As a result, it is possible to improve the reliability of data holding.

For the above reason, it is possible to improve the reliability of data holding by using a film including discrete trap levels as the charge storage film EC, not limited to a silicon nitride film.

Next, on one of the sidewalls of the control gate electrode CG, the memory gate electrode MG is formed and, on the other sidewall, a sidewall SW including a silicon oxide film is formed. Similarly, on one of the sidewalls of the memory gate electrode MG, the control gate electrode CG is formed and, on the other sidewall, the sidewall SW including a silicon oxide film is formed.

Within the semiconductor substrate 1S, an n-type semiconductor region MV is formed in alignment with the control gate electrode CG and further within the semiconductor substrate 1S immediately under the sidewall SW, a pair of shallow low-concentration impurity diffusion regions MS, MD, which is an n-type semiconductor region, is formed and in an exterior region in contact with the pair of shallow low-concentration impurity diffusion regions MS, MD, a pair of deep high-concentration impurity diffusion regions S1, D1 is formed. The deep high-concentration impurity diffusion regions S1, D1 are also an n-type semiconductor region and on the surface of the high-concentration impurity diffusion regions S1, D1, a cobalt silicide film SL is formed. By the pair of low-concentration impurity diffusion regions MS, MD and the pair of high-concentration impurity diffusion regions S1, D1, a source region or a drain region of the memory cell is formed. By forming the source region and the drain region by the low-concentration impurity diffusion regions MS, MD and the high-concentration impurity diffusion regions S1, D1, it is possible to cause the source region and the drain region to have an LDD (Lightly Doped Drain) structure. Here, a transistor including the gate insulating film GOX1, the control gate electrode CG formed over the gate insulating film GOX1, and the source region and the drain region described above is referred to as a selection transistor. On the other hand, a transistor including the laminated film including the potential barrier film EV1, the charge storage film EC, and the potential barrier film EV2, the memory gate electrode MG formed over the laminated film, and the source region and the drain region described above is referred to as a memory transistor. Because of this, it can be said that the selection part of the memory cell includes a selection transistor and the storage part of the memory cell includes a memory transistor. In this manner, the memory cell is configured.

Subsequently, the wiring structure connected with the memory cell will be described. Over the memory cell, an interlayer insulating film IL1 including a silicon oxide film is formed so as to cover the memory cell. In the interlayer insulating film IL1, a contact hole is formed, which penetrates through the interlayer insulating film IL1 and reaches the cobalt silicide film SL constituting the source region and the drain region. Within the contact hole, a titanium/titanium nitride film, which is a barrier conductive film, is formed and a tungsten film is formed so as to be embedded in the contact hole. In this manner, by embedding the titanium/titanium nitride film and the tungsten film in the contact hole, a conductive plug PLG is formed. Then, over the interlayer insulating film IL1, a wire L1 is formed and the wire L1 and the plug PLG are electrically connected. The wire L1 is formed from a laminated film of, for example, a titanium/titanium nitride film, an aluminum film, and a titanium/titanium nitride film.

The memory cell in the first embodiment is configured as described above and the operation of the memory cell will be described below. Here, it is assumed that a voltage to be applied to the control gate electrode CG is Vcg and a voltage to be applied to the memory gate electrode MG is Vmg. Further, voltages to be applied to the source region and the drain regions are assumed to be Vs, Vd, respectively, and a voltage to be applied to the semiconductor substrate 1S (p-type well PWL1) is assumed to be Vb. Injection of electrons into a silicon nitride film, which is a charge storage film, is defined as "write" and injection of holes into the silicon nitride film is defined as "erase".

First, the write operation will be described. The write operation is performed by hot-electron writing, a so-called source side injection method. As to the write voltage, for example, the voltage Vs to be applied to the source region is set to 6 V, the voltage Vmg to be applied to the memory gate electrode MG is set to 12 V, and the voltage Vcg to be applied to the control gate electrode CG is set to 1.5 V. Then, the voltage Vd to be applied to the drain region is controlled so that the channel current at the time of the write operation has a certain set value. At this time, the voltage Vd is determined by the set value of the channel current and the threshold voltage of the selection transistor having the control gate electrode CG and it is, for example, about 1 V. The voltage Vb to be applied to the p-type well PWL1 (semiconductor substrate 1S) is 0 V.

The movement of charges when the write operation is performed by applying such voltages is shown. As described above, by giving a potential difference between the voltage Vs to be applied to the source region and the voltage Vd to be applied to the drain region, electrons flow through a channel region formed between the source region and the drain region. The electrons that flow through the channel region are accelerated in a channel region under the vicinity of the boundary between the control gate electrode CG and the memory gate electrode MG (between the source region and the drain region) and become hot electrons. Then, by an electric field in the vertical direction due to the positive voltage (Vmg=12 V) applied to the memory gate electrode MG, the hot electrons are injected into the silicon nitride film (charge storage film EC) under the memory gate electrode MG. The injected hot electrons are trapped at a trap level in the silicon nitride film and as a result, electrons are accumulated in the silicon nitride film and thus the threshold voltage of the memory transistor rises. In this manner, the write operation is performed.

Subsequently, the erase operation will be described. The erase operation is performed by, for example, a BTBT (Band to Band Tunneling) erase that uses a band-to-band tunneling phenomenon. In the BTBT erase, for example, the voltage Vmg to be applied to the memory gate electrode MG is set to −6 V, the voltage Vs to be applied to the source region is set to 6 V, the voltage Vcg to be applied to the control gate electrode CG is set to 0 V, and 0 V is applied to the drain region. Due to this, by the voltage applied between the source region and the memory gate electrode, holes generated by the band-to-band tunneling phenomenon at the end part of the source region are accelerated by the high voltage applied to the source region and become hot holes. Then, part of the hot holes is attracted by the negative voltage applied to the memory gate electrode MG and injected into the silicon nitride film. The injected hot holes are trapped at a trap level in the silicon nitride film and thus the threshold voltage of the memory transistor decreases. In this manner, the erase operation is performed.

Next, the read operation will be described. The read operation is performed by setting the voltage Vd to be applied to the drain region to Vdd (1.5 V), the voltage Vs to be applied to the source region to 0 V, the voltage Vcg to be applied to the control gate electrode CG to Vdd (1.5 V), and the voltage Vmg to be applied to the memory gate electrode MG to Vdd (1.5 V), and by causing a current to flow in the opposite direction to that at the time of write operation. It may also be possible to perform the read operation with a current in the same direction as that at the time of write operation by replacing the voltage Vd to be applied to the drain region and the voltage Vs to be applied to the source region with each other and setting them to 0 V and 1.5 V, respectively. At this time, when the memory cell is in the write state and the threshold voltage is high, no current flows through the memory cell. On the other hand, when the memory cell is in the erase state and the threshold voltage is low, a current flows through the memory cell.

As described above, it is possible to determine whether the memory cell is in the write state or the erase state by detecting the presence/absence of a current that flows through the memory cell. Specifically, a sense amplifier is used to detect the presence/absence of a current that flows through the memory cell. For example, a reference current is used to detect the presence/absence of a current that flows through the memory cell. That is, when the memory cell is in the erase state, a read current flows at the time of read operation and this read current is compared with the reference current. The reference current is set smaller than the read current in the erase state and when the read current is found to be larger than the reference current as the result of comparison between the read current and the reference current, it is possible to determine that the memory cell is in the erase state. On the other hand, when the memory cell is in the write state, no read current flows. That is, when the read current is found to be smaller than the reference current as the result of comparison between the read current and the reference current, it is possible to determine that the memory cell is in the write state. In this manner, the read operation can be performed.

Next, the configuration of the low withstand voltage MISFET formed in the low withstand voltage MISFET formation region will be described. The low withstand voltage MISFET is, for example, a MISFET that can be driven by a relatively small voltage, such as a power source voltage of 1.5 V, and is used in the CPU 1 and RAM 2 shown in FIG. 1.

First, as shown in FIG. 2, an element isolation region STI is formed in the semiconductor substrate 1S and a p-type well PWL2 is formed in an active region defined by the element isolation region STI. Over the p-type well PWL2, a gate insulating film GOX2 is formed and a gate electrode G2 is formed over the gate insulating film GOX2. The gate insulating film GOX2 is formed, for example, from a silicon oxide film. The gate insulating film GOX2 of the low withstand voltage MISFET is formed thinner than a gate insulating film GOX3 of the high withstand voltage MISFET, to be described later, so that it can operate even if a drive voltage to be applied to the gate electrode G2 is low. The film thickness of the gate insulating film GOX2 of the low withstand voltage MISFET is, for example, about 7 nm. The gate electrode G2 is formed, for example, from a laminated film of a polysilicon film and a cobalt silicide film, and the cobalt silicide film is formed for the purpose of reducing the resistance of the gate electrode G2.

On the sidewalls on both sides of the gate electrode G2, for example, the sidewall SW including a silicon oxide film is formed and within the semiconductor substrate 1S immediately under the sidewall SW, a low-concentration impurity diffusion region EX1 is formed. The low-concentration impurity diffusion region EX1 is an n-type semiconductor region. On the outside of the low-concentration impurity diffusion region EX1, high-concentration impurity diffusion regions S2, D2 are formed. The high-concentration impurity diffusion regions S2, D2 are also an n-type semiconductor region and over the surface of the high-concentration impurity diffusion regions S2, D2, the cobalt silicide film SL for the purpose of reducing the resistance is formed. As described above, in the low withstand voltage MISFET also, the source region is formed by the low-concentration impurity diffusion region EX1 and the high-concentration impurity diffusion region S2, and the drain region is formed by the low-concentration impurity diffusion region EX1 and the high-concentration impurity diffusion region D2.

The low withstand voltage MISFET is configured in this manner. The characteristics of the low withstand voltage MISFET are that the film thickness of the gate insulating film GOX2 is reduced and that the gate length of the gate electrode G2 (length in the direction in which the channel is formed) is reduced. In addition, the depths of the source region and the drain region are reduced. By adopting such a configuration for the low withstand voltage MISFET, it is possible to obtain a MISFET the current drive force of which is high and which operates at a high speed even with a low drive power source.

Next, the wiring structure connected with the low withstand voltage MISFET will be described. Over the low withstand voltage MISFET, the interlayer insulating film IL1 including a silicon oxide film is formed so as to cover the memory cell. In the interlayer insulating film IL1, a contact hole is formed, which penetrates through the interlayer insulating film IL1 and reaches the cobalt silicide film SL constituting the source region and the drain region. Within the contact hole, a titanium/titanium nitride film, which is a barrier conductive film, is formed and a tungsten film is formed so as to be embedded in the contact hole. In this manner, by embedding the titanium/titanium nitride film and the tungsten film in the contact hole, the conductive plug PLG is formed. Then, over the interlayer insulating film IL1, the wire L1 is formed and the wire L1 and the plug PLG are electrically connected. The wire L1 is formed, for example, from a laminated film of a titanium/titanium nitride film, an aluminum film, and a titanium/titanium nitride film.

Next, the configuration of the high withstand voltage MISFET formed in the high withstand voltage MISFET formation region will be described. The high withstand voltage MISFET is a MISFET that operates by, for example, a relatively large voltage, such as a power source voltage of 5 V, and is used in the peripheral circuits (for example, a step-up circuit) of the analog circuit 3 and the flash memory 4 shown in FIG. 1.

First, as shown in FIG. 2, the element isolation region STI is formed in the semiconductor substrate 1S and a p-type well PWL3 is formed in an active region defined by the element isolation region STI. Over the p-type well PWL3, the gate insulating film GOX3 is formed and a gate electrode G3 is formed over the gate insulating film GOX3. The gate insulating film GOX3 is formed, for example, from a silicon oxide film. The gate insulating film GOX3 of the high withstand voltage MISFET is formed thicker than the gate insulating film GOX2 of the low withstand voltage MISFET described above so that it can ensure the withstand voltage even if a drive voltage to be applied to the gate electrode G3 is high. The film thickness of the gate insulating film GOX3 of the high withstand voltage MISFET is, for example, about 14 nm. The gate electrode G3 is formed, for example, from a laminated film of a polysilicon film and a cobalt silicide film, and the cobalt silicide film is formed for the purpose of reducing the resistance of the gate electrode G3.

On the sidewalls on both sides of the gate electrode G3, for example, the sidewall SW including a silicon oxide film is formed and within the semiconductor substrate 1S immediately under the sidewall SW, a low-concentration impurity diffusion region EX2 is formed. The low-concentration impurity diffusion region EX2 is an n-type semiconductor region. On the outside of the low-concentration impurity diffusion region EX2, high-concentration impurity diffusion regions S3, D3 are formed. The high-concentration impurity diffusion regions S3, D3 are also an n-type semiconductor region and over the surface of the high-concentration impurity diffusion regions S3, D3, the cobalt silicide film SL for the purpose of reducing the resistance is formed. As described above, in the high withstand voltage MISFET also, the source region is formed by the low-concentration impurity diffusion region EX2 and the high-concentration impurity diffusion region S3, and the drain region is formed by the low-concentration impurity diffusion region EX2 and the high-concentration impurity diffusion region D3.

The high withstand voltage MISFET is configured in this manner. The characteristics of the high withstand voltage MISFET are that the film thickness of the gate insulating film GOX3 is increased and that the gate length of the gate electrode G3 (length in the direction in which the channel is formed) is lengthened. In addition, the depths of the source region and the drain region are greater than that of the low withstand voltage MISFET. By adopting such a configuration for the high withstand voltage MISFET, it is possible to ensure the withstand voltage even with a high drive power source.

Subsequently, the wiring structure connected with the high withstand voltage MISFET will be described. Over the high withstand voltage MISFET, the interlayer insulating film IL1 including a silicon oxide film is formed so as to cover the memory cell. In the interlayer insulating film IL1, a contact hole is formed, which penetrates through the interlayer insulating film IL1 and reaches the cobalt silicide film SL constituting the source region and the drain region. Within the contact hole, a titanium/titanium nitride film, which is a barrier conductive film, is formed and a tungsten film is formed so as to be embedded in the contact hole. In this manner, by embedding the titanium/titanium nitride film and the tungsten film in the contact hole, the conductive plug PLG is formed. Then, over the interlayer insulating film IL1, the wire L1 is formed and the wire L1 and the plug PLG are electrically connected. The wire L1 is formed, for example, from a laminated film of a titanium/titanium nitride film, an aluminum film, and a titanium/titanium nitride film.

Next, the configuration of the capacitive element formed in the capacitive element formation region will be described. The capacitive element is used in, for example, a low-voltage circuit, such as a peripheral circuit of the CPU 1 and RAM 2, or in a high-voltage circuit, such as a peripheral circuit (for example, a step-up circuit) of the flash memory 4 and the analog circuit 3. That is, the capacitive element in the first embodiment is used not only in a high-voltage circuit combined with the high withstand voltage MISFET but also in a low-voltage circuit combined with the low withstand voltage MISFET.

First, as shown in FIG. 2, in the semiconductor substrate 1S, the element isolation region STI is formed and a p-type well PWL4 is formed in an active region defined by the element isolation region STI. Over the surface of the p-type well PWL4, a high-concentration semiconductor region HS1 including an $n^{++}$-type semiconductor region is formed. Then, the n-type semiconductor region MV is formed so as to sandwich the high-concentration semiconductor region HS1.

Over the high-concentration semiconductor region HS1, a capacitor insulating film CI1 including, for example, a silicon oxide film is formed and over the capacitor insulating film CI1, an electrode E1 is formed. The electrode E1 is formed, for example, from a polysilicon film. In this manner, a MOS capacitor MOS1 is formed in the semiconductor substrate 1S. That is, the MOS capacitor MOS1 is a capacitive element that uses the high-concentration semiconductor region HS1 as a lower electrode and the electrode E1 as an upper electrode.

Subsequently, in the capacitive element in the first embodiment, a polysilicon capacitor PIP1 is formed over the MOS capacitor MOS1. Specifically, the polysilicon capacitor PIP1 uses the above-described electrode E1 as a lower electrode. Then, a capacitor insulating film CI2 is formed so as to cover the electrode E1 and an electrode E2 is formed over the capacitor insulating film CI2. The polysilicon capacitor PIP1 thus configured uses the electrode E2 as an upper electrode. The electrode E2 has a polysilicon film as its main component and over the surface of the polysilicon film, a cobalt silicide film is formed. At a step part of the electrode E2, for example, the sidewall SW including a silicon oxide film is formed.

In the first embodiment, the structure is such that the MOS capacitor MOS1 and the polysilicon capacitor PIP1 are laminated, and by laminating the MOS capacitor MOS1 and the polysilicon capacitor PIP1 into a laminated structure, it is possible to increase the capacitance value that occupies in the unit area. That is, by arranging capacitive elements by lamination over the semiconductor substrate 1S, it is possible to increase the capacitance value compared to the case where the capacitive elements are arranged in a single layer over the semiconductor substrate 1S. Because of this, in the first embodiment, the MOS capacitor MOS1 and the polysilicon capacitor PIP1 are laminated.

Next, the wiring structure connected with the capacitive element in the first embodiment will be described. As shown in FIG. 2, the n-type semiconductor region MV formed on the outside of the high-concentration semiconductor region HS1 is drawn out to the outside of the MOS capacitor MOS1 and coupled with a plug PLG4 formed in the interlayer insulating film IL1. Over the surface of the n-type semiconductor region MV coupled with the plug PLG4, the cobalt silicide film SL is formed. Then, over the interlayer insulating film IL1 in which the plug PLG4 is formed, a wire L1a is formed and the plug PLG4 and the wire L1a are electrically connected. On the other hand, over the upper electrode E2 of the polysilicon capacitor PIP1, a plug PLG2 that penetrates through the interlayer insulating film IL1 is formed and by this plug PLG2, the upper electrode E2 of the polysilicon capacitor PIP1 and a wire L1b are electrically connected.

The plug PLG2 and the plug PLG4 are formed by embedding a titanium/titanium nitride film and a tungsten film in a contact hole and the wire L1a and the wire L1b are formed from a laminated film of a titanium/titanium nitride film, an aluminum film, and a titanium/titanium nitride film.

As described above, over the semiconductor substrate 1S, the memory cell, the low withstand voltage MISFET, the high withstand voltage MISFET, and the capacitive element are formed. In the first embodiment, for example, these elements are formed in one manufacturing process, and therefore, components constituting each element are formed from common members. Specifically, the gate insulating film GOX1 of the memory cell, the gate insulating film GOX2 of the low withstand voltage MISFET, the gate insulating film GOX3 of the high withstand voltage MISFET, and the capacitor insulating film CI1 of the MOS capacitor MOS1 are formed from the same silicon oxide film. Then, the control gate electrode CG of the memory cell, the gate electrode G2 of the low withstand voltage MISFET, the gate electrode G3 of the high withstand voltage MISFET, and the electrode E1, which is the upper electrode of the MOS capacitor MOS1, are formed from the same polysilicon film. Further, the laminated film constituting the potential barrier film EV1, the charge storage film EC, and the potential barrier film EV2 of the memory cell is formed from the same film as that from which the capacitor insulating film CI2 of the polysilicon capacitor PIP1 is formed. That is, the laminated film constituting the memory cell and the capacitor insulating film CI2 constituting the polysilicon capacitor PIP1 include the laminated film of the silicon oxide film, the silicon nitride film, and the silicon oxide film. The memory gate electrode MG of the memory cell and the electrode E2, which functions as the upper electrode of the polysilicon capacitor PIP1, includes the same polysilicon film.

In the first embodiment, attention is focused on the capacitive element and an object thereof is to make an attempt to reduce the fraction defective of the capacitive element. Hereinafter, the causes to reduce the fraction defective of capacitive element will be described. As described above, the capacitive element has a laminated structure of the MOS capacitor MOS1 and the polysilicon capacitor PIP1 and in particular, the pin hole defect of the MOS capacitor MOS1 causes a problem.

FIG. 3 schematically shows a pin hole defect that occurs in the MOS capacitor MOS1. As shown in FIG. 3, the MOS capacitor MOS1 has a structure in which the high-concentration semiconductor region HS1 formed over the surface of the p-type well PWL4 functions as the lower electrode and the electrode E1, which functions as the upper electrode, is formed over the lower electrode via the capacitor insulating film CI1. The capacitor insulating film CI1 is formed, for example, from a silicon oxide film. As shown in FIG. 3, there may be a case where a pin hole PH occurs in the capacitor insulating film CI1 including a silicon oxide film depending on the conditions (condition of film formation of a silicon oxide film etc.) of the manufacturing process. In this case, the silicon oxide film has been removed in the pin hole PH, and therefore, there arises a problem that the withstand voltage properties between the high-concentration semiconductor region HS1 (lower electrode) and the electrode E1 (upper electrode) are deteriorated. That is, when the capacitor insulating film CI1 is formed normally, there occurs no withstand voltage failure between the high-concentration semiconductor region HS1 and the electrode E1 because an insulating member is interposed therebetween, however, if the pin hole PH occurs in the capacitor insulating film CI1, the insulating member is no longer interposed in the pin hole PH, and therefore, the withstand voltage properties between the high-concentration semiconductor region HS1 and the electrode E1 are deteriorated. Further, there is a possibility that the electrode E1 comes into the pin hole PH to bring the high-concentration semiconductor region HS1 and the electrode E1 into conduction (short circuit failure) If this occurs, the upper electrode and the lower electrode are electrically connected and no longer function as a capacitive element. Consequently, if a product is shipped, in which the pin hole PH is formed in the capacitor insulating film CI1 of the MOS capacitor MOS1, it will be a defective product, and therefore, it is necessary to sort out and remove the defective product in advance.

Here, the pin hole defect of the MOS capacitor MOS1 is described, however, it can be thought that the pin hole defect will bring about a problem similarly in the case of the polysilicon capacitor PIP1. However, in the case of the polysilicon capacitor PIP1, the pin hole defect does not become actual as a big problem, and this will be described below.

FIG. 4 is a cross section showing a configuration of the polysilicon capacitor PIP1. As shown in FIG. 4, in the polysilicon capacitor PIP1, the capacitor insulating film CI2 is formed so as to cover the electrode E1, which is the lower electrode, and over the capacitor insulating film CI2, the electrode E2, which functions as the upper electrode, is formed. In this case, the electrode E1 and the electrode E2 are formed from a polysilicon film. In the polysilicon capacitor PIP1 configured as described above, the electrode E1 and the electrode E2 are also formed via the capacitor insulating film CI2, and therefore, if the pin hole PH occurs in the capacitor insulating film CI2, it can be thought that the withstand voltage properties between the electrode E1 and the electrode E2 are deteriorated. However, the capacitor insulating film CI2 of the polysilicon capacitor PIP1 includes a laminated film of a silicon oxide film 12, a silicon nitride film 13, and a silicon oxide film 14. Because of this, as shown in FIG. 4, for example, even if the pin hole PH occurs in the silicon oxide film 14, the silicon nitride film 13 of different film quality is formed in the lower layer of the silicon oxide film 14, and therefore, it hardly occurs that the pin hole PH is formed so as to penetrate through the silicon nitride film 13. That is, the capacitor insulating film CI2 constituting the polysilicon capacitor PIP1 includes a laminated film of films of different film qualities, and therefore, it is unlikely that the pin hole PH that penetrates through the laminated film is formed. In particular, the etching characteristic of the silicon oxide film 14 also differs from that of the silicon nitride film 13, and therefore, it can be thought that even if the pin hole PH occurs in the silicon oxide film 14, the pin hole hardly occurs in the silicon nitride film 13 at the same position.

When the pin hole PH is formed so as to penetrate through the capacitor insulating film CI2, the withstand voltage properties between the electrode E1 and the electrode E2 are deteriorated, however, as shown in FIG. 4, even if the pin hole PH is formed, it is possible to ensure the withstand voltage between the electrode E1 and the electrode E2 unless the pin hole PH penetrates through the capacitor insulating film CI2. For the above-described reason, in the polysilicon capacitor PIP1 forming the capacitor insulating film CI2 from a laminated film of a silicon oxide film and a silicon nitride film different in film quality, the pin hole defect does not become actual as a problem of withstand voltage failure. In contrast to this, in the MOS capacitor MOS1, the capacitor insulating film CI1 is formed from a single layer film, and therefore, the pin hole PH that penetrates through the capacitor insulating film CI1 is likely to be formed and the pin hole PH formed so as to penetrate through the capacitor insulating film CI1 reveals the withstand voltage failure between the upper electrode and the lower electrode. Because of this, the capacitive element in the first embodiment has the laminated structure of the MOS capacitor MOS1 and the polysilicon capacitor PIP1, and in particular, it can be seen that the pin hole defect in the MOS capacitor MOS1 brings about a problem. That is, in order to reduce the fraction defective of capacitive element, it is essential to remove the MOS capacitor MOS1 in which the pin hole defect occurs from the products.

In the circumstances described above, in order to sort out the MOS capacitor MOS1 in which the pin hole defect exists in advance before the shipment of the product, a reliability test called a screening is performed. A screening is performed to distinguish conforming products from nonconforming products based on a certain standard or criterion and a variety of defects that potentially remain in the finished product are revealed by a nondestructive test. As described above, a screening is an effective means to reduce the initial failure rate of product.

Specifically, for example, for the MOS capacitor MOS1, in order to reduce the product fraction defective to or below 1 ppm, a screening is performed, in which a voltage of 4.5 V is applied between the upper electrode and the lower electrode of the MOS capacitor MOS1 and this state where the voltage is applied is maintained for 16 hours. Consequently, if the screening with the above-described conditions is performed for the MOS capacitor, it is possible to sort out the MOS capacitor having the pin hole defect and reduce the product fraction defective to or below 1 ppm.

In this screening, a voltage of 4.5 V is applied to the MOS capacitor MOS1, however, it is not possible to perform the screening in which a voltage of 4.5 V is applied to all of the MOS capacitors MOS1. For example, the MOS capacitor functions as a passive element in an integrated circuit and there exist circuits that operate at a variety of power source voltages in the integrated circuit. For example, for the MOS capacitor MOS1 used in a high-voltage circuit (analog circuit 3 etc.) having the power source voltage of 4.5 V or more, the application of a voltage of 4.5 V or more to the high-voltage circuit including the MOS capacitor MOS1 is supposed, and therefore, there arises no problem even if a voltage of 4.5 V is applied to the MOS capacitor MOS1 and the high withstand voltage MISFET constituting the high-voltage circuit in the screening. In contrast to this, for example, when the MOS capacitor MOS1 is used in a low-voltage circuit (CPU 1 etc.) having the power source voltage of 1.5 V, it is basically supposed that only a voltage not more than the power source voltage is applied to the low-voltage circuit including the MOS capacitor MOS1. Because of this, if a voltage higher than the power source voltage is applied in the screening of the MOS capacitor MOS1 used in the low-voltage circuit, there is a possibility that the low withstand voltage MISFET constituting the low-voltage circuit is destroyed. As described above, the MOS capacitor MOS1 is used in circuits driven at a variety of voltages, and therefore, it is not possible to uniformly specify a voltage to be used in a screening.

For example, when a screening is performed for the MOS capacitor MOS1 used in a low-voltage circuit having the power source voltage of 1.5 V, it is required to set a voltage to be applied to the low-voltage circuit in the screening to 1.5 V or less. In this case, a long screening is required to reduce the product fraction defective to 1 ppm or less. That is, in the screening with a voltage of 1.5 V or less, many hours are necessary to obtain the same screening effect as that of the screening in which a voltage of 4.5 V is applied for 16 hours and it is not practical. However, if the application time of the voltage is reduced, the screening is not sufficient and it is no longer possible to satisfactorily sort out a MOS capacitor in which a pin hole defect exists. That is, in particular, when the MOS capacitor MOS1 is used in a low-voltage circuit, it is not possible to efficiently reduce the fraction defective of capacitive element by the screening.

In the first embodiment, there is proposed a technology capable of reducing the fraction defective of capacitive element without the need to perform a screening. Hereinafter, its technical concept will be described. The technical concept in the first embodiment is characterized in that the connection relationship between one capacitor cell and another capacitor cell is devised, wherein the capacitor cell is a capacitive element in which a MOS capacitor and a polysilicon capacitor are laminated.

FIG. 5 is a circuit diagram showing a configuration of a capacitive element in the first embodiment. As shown in FIG. 5, a capacitive element constituting one capacitor cell is formed from the MOS capacitor MOS1 and the polysilicon capacitor PIP1, and a capacitive element constituting another capacitor cell is formed from a MOS capacitor MOS2 and a polysilicon capacitor PIP2. That is, in FIG. 5, a connection relationship between two capacitor cells is shown.

In FIG. 5, in the capacitor cell including the MOS capacitor MOS1 and the polysilicon capacitor PIP1, the electrode E1 constituting the upper electrode of the MOS capacitor MOS1 functions also as the lower electrode of the polysilicon capacitor PIP1. Then, the electrode E2 constituting the upper electrode of the polysilicon capacitor PIP1 is coupled to a high potential (for example, power source potential). On the other hand, also in another capacitor cell including the MOS capacitor MOS2 and the polysilicon capacitor PIP2, an electrode E3 constituting the upper electrode of the MOS capacitor MOS2 functions also as the lower electrode of the polysilicon capacitor PIP2. Then, an electrode E4 constituting the upper electrode of the polysilicon capacitor PIP2 is coupled to a low potential (for example, reference potential).

Subsequently, the high-concentration semiconductor region HS1 constituting the lower electrode of the MOS capacitor MOS1 and a high-concentration semiconductor region HS2 constituting the lower electrode of the MOS capacitor MOS2 are electrically connected. Further, the electrode E2 constituting the upper electrode of the polysilicon capacitor PIP1 and the electrode E3 that functions as the lower electrode of the polysilicon capacitor PIP2 or the upper electrode of the MOS capacitor MOS2 are electrically connected. Further, the electrode E4 constituting the upper electrode of the polysilicon capacitor PIP2 and the electrode E1 that functions as the lower electrode of the polysilicon capacitor PIP1 or the upper electrode of the MOS capacitor MOS1 are electrically connected.

Figure 6:
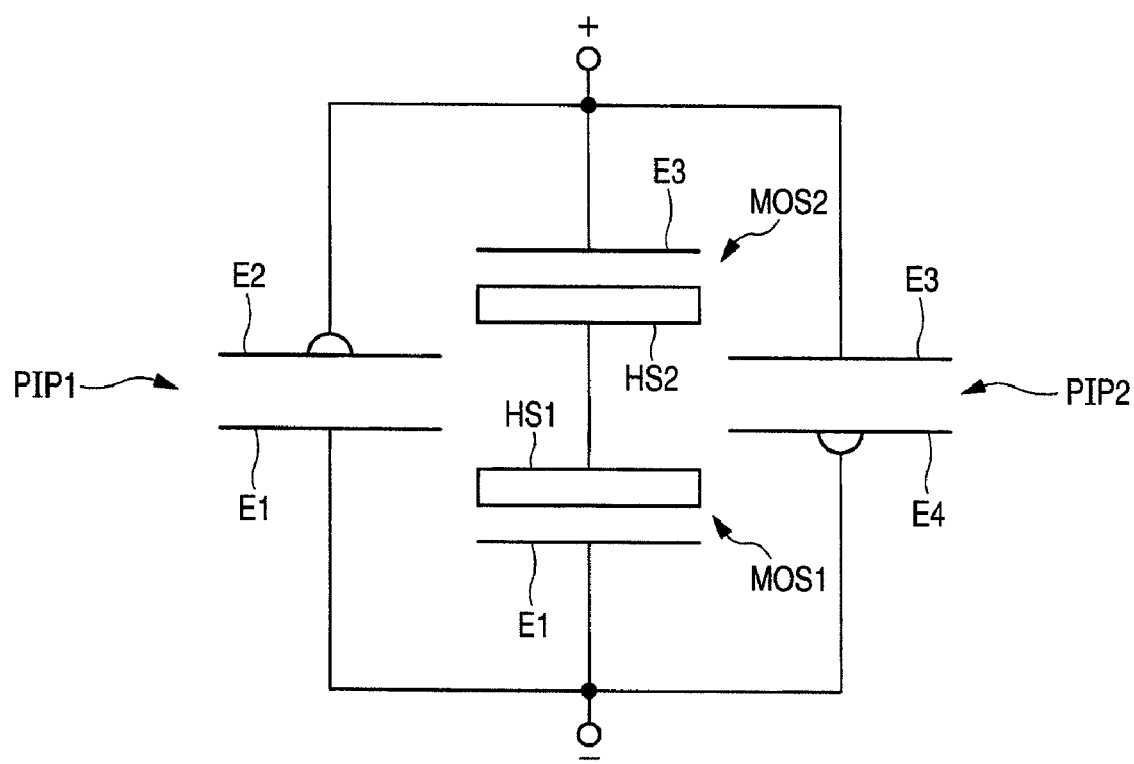
FIG. 6 is a diagram illustrating a circuit diagram equivalent to that in FIG. 5.

As shown in FIG. 5, two capacitor cells are electrically connected, and an equivalent circuit diagram is shown in order to make the connection relationship in the circuit diagram shown in FIG. 5 easy-to-understand. FIG. 6 is a diagram showing an equivalent circuit diagram of the circuit diagram shown in FIG. 5. As shown in FIG. 6, the MOS capacitor MOS1 and the MOS capacitor MOS2 are coupled in series between the high potential (for example, power source potential) and the low potential (for example, reference potential). Specifically, the electrode E1 of the MOS capacitor MOS1 is coupled to the low potential and the high-concentration semiconductor region HS1 of the MOS capacitor MOS1 and the high-concentration semiconductor region HS2 of the MOS capacitor MOS2 are electrically connected. Then, the electrode E3 of the MOS capacitor MOS2 is coupled to the high potential. As described above, the MOS capacitor MOS1 and the MOS capacitor MOS2 are coupled in series between the high potential and the low potential and thus the series capacitive element is configured. The polysilicon capacitor PIP1 is coupled between the high potential and the low potential so as to be coupled in parallel with the series capacitive element. Similarly, the polysilicon capacitor PIP2 is coupled between the high potential and the low potential so as to be coupled in parallel with the series capacitive element. That is, in the first embodiment, as shown in the equivalent circuit diagram in FIG. 6, the MOS capacitor MOS1 and the MOS capacitor MOS2 are coupled in series to constitute the series capacitive element, and the series capacitive element, the polysilicon capacitor PIP1, and the polysilicon capacitor PIP2 are configured so as to be coupled in parallel with one another. The capacitive element shown in the equivalent circuit diagram in FIG. 6 can be used in, for example, a low-voltage circuit that uses the low withstand voltage MISFET. In this case, it is possible to use the capacitive element with the high potential as a power source voltage to operate the low withstand voltage MISFET and the low potential as a reference potential, such as GND. Further, it is also possible to use the capacitive element shown in the equivalent circuit diagram in FIG. 6 in a high-voltage circuit that uses the high withstand voltage MISFET not only in a low-voltage circuit that uses the low withstand voltage MISFET. In this case also, it may also be possible to use the capacitive element with the high potential as a power source voltage to operate the high withstand voltage MISFET and the low potential as a reference potential, such as GND.

In the capacitive element thus configured, a first characteristic of the first embodiment is that the MOS capacitor MOS1 and the MOS capacitor MOS2 are coupled in series. For example, suppose a case where only the MOS capacitor MOS1 is coupled between the high potential and the low potential. At this time, if a pin hole defect occurs in the capacitor insulating film of the MOS capacitor MOS1, the probability becomes high that a short circuit failure occurs between the electrode E1 constituting the upper electrode of the MOS capacitor MOS1 and the high-concentration semiconductor region HS1 constituting the lower electrode of the MOS capacitor MOS1. If a short circuit failure occurs between the electrode E1 of the MOS capacitor MOS1 and the high-concentration semiconductor region HS1 of the MOS capacitor MOS1, the high potential and the low potential are short-circuited and the circuit itself that uses the MOS capacitor MOS1 is destroyed besides that the MOS capacitor MOS1 no longer functions as a capacitive element.

In contrast to this, suppose a case where the MOS capacitor MOS1 and the MOS capacitor MOS2 are coupled in series as in the first embodiment. At this time, for example, if a pin hole defect occurs in the capacitor insulating film of the MOS capacitor MOS1 and a short circuit failure occurs, the electrode E1 of the MOS capacitor MOS1 and the high-concentration semiconductor region HS1 are electrically connected and the MOS capacitor MOS1 no longer functions as a capacitive element. However, the normal MOS capacitor MOS2 is coupled in series with the MOS capacitor MOS1, and therefore, the high potential and the low potential are electrically insulated by the normal MOS capacitor MOS2. That is, in the first embodiment, even if a short circuit failure occurs resulting from a pin hole defect in the MOS capacitor MOS1, since the normal MOS capacitor MOS2 is connected in series, it is possible to prevent a short circuit failure from occurring between the high potential and the low potential. That is, in the configuration in which only the MOS capacitor MOS1 is coupled between the high potential and the low potential, if a pin hole defect occurs in the MOS capacitor MOS1, the entire circuit (semiconductor device) becomes defective as a whole. In contrast to this, as shown in the first embodiment, by inserting the MOS capacitor MOS1 and the MOS capacitor MOS2 in series between the high potential and the low potential, it is possible to suppress a short circuit failure between the high potential and the low potential even if a short circuit failure resulting from a pin hole defect occurs in one of the MOS capacitors.

This means that the product fraction defective can be reduced because the entire circuit does not become short circuit defective as a whole even if a pin hole defect occurs in one of the MOS capacitor MOS1 and the MOS capacitor MOS2. In other words, even if a pin hole defect occurs in one of the MOS capacitor MOS1 and the MOS capacitor MOS2, it functions normally as a capacitive element, and therefore, it is no longer necessary to sort out it as a nonconforming product. That is, it is possible to suppress a product from becoming nonconforming one immediately after a pin hole defect occurs in the MOS capacitor, and as a result, the product fraction defective can be reduced.

For example, suppose that the pin hole fraction defective of the MOS capacitor is 1%. In this case, if the MOS capacitor is used alone between the high potential and the low potential, a pin hole defect in the MOS capacitor directly leads to a nonconforming product, and therefore, the product fraction defective is 1%. In contrast to this, if two or more MOS capacitors (for example, two MOS capacitors) are inserted between the high potential and the low potential as in the first embodiment, a product does not become nonconforming one even if a pin hole defect occurs in either one of the MOS capacitors. The product becomes nonconforming one when both of the two MOS capacitors become pin hole defective simultaneously. If it is assumed that the pin hole fraction defective of one MOS capacitor is 1%, the probability that a pin hole defect occurs simultaneously in both of the two MOS capacitors coupled in series is 1%×1%=0.01%. Consequently, by coupling two MOS capacitors in series, it is possible to reduce the product fraction defective to, for example, one hundredth.

From the above, it is possible to reduce the product fraction defective by, for example, coupling the MOS capacitor MOS1 and the MOS capacitor MOS2 in series as shown in FIG. 6. By adopting a configuration in which the MOS capacitor MOS1 and the MOS capacitor MOS2 are coupled in series as described above, the product fraction defective can be reduced, and therefore, it is possible to keep the product fraction defective not more than a specified value without the need to perform a screening to sort out in advance a MOS capacitor in which a pin hole defect has occurred. In particular, when a capacitive element is used in a low-voltage circuit, a voltage that can be applied to the capacitive element in a screening is low, and therefore, it is not possible to sufficiently perform screening in order to achieve a product fraction defective not more than a specified value unless the time for a screening is lengthened. However, it is not practical to lengthen the time for a screening, and therefore, it becomes difficult to keep the product fraction defective of a capacitive element used in a low-voltage circuit not more than a specified value. Because of this, as in the first embodiment, it is effective to adopt a configuration in which MOS capacitors are coupled in series. Due to this, the product fraction defective can be reduced without the need to perform a screening, and therefore, it is possible to obtain a remarkable effect to sufficiently keep the product fraction defective not more than a specified value even when the capacitive element is used in a low-voltage circuit.

However, as shown in FIG. 6, when the MOS capacitor MOS1 and the MOS capacitor MOS2 are coupled in series, the capacitance of the entire capacitive element is reduced as a result. That is, when a series capacitive element is configured by coupling the MOS capacitor MOS1 and the MOS capacitor MOS2 in series, the capacitance value is reduced compared to the case where the MOS capacitor MOS1 is provided alone between the high potential and the low potential.

Consequently, a second characteristic of the first embodiment lies in that the polysilicon capacitor PIP1 and the polysilicon capacitor PIP2 are coupled so as to be coupled in parallel with the series capacitive element configured by coupling the MOS capacitor MOS1 and the MOS capacitor MOS2 in series. Due to this, the capacitance is increased by an amount corresponding to the polysilicon capacitor PIP1 and the polysilicon capacitor PIP2 coupling so as to be in parallel with the series capacitive element.

Figure 7:
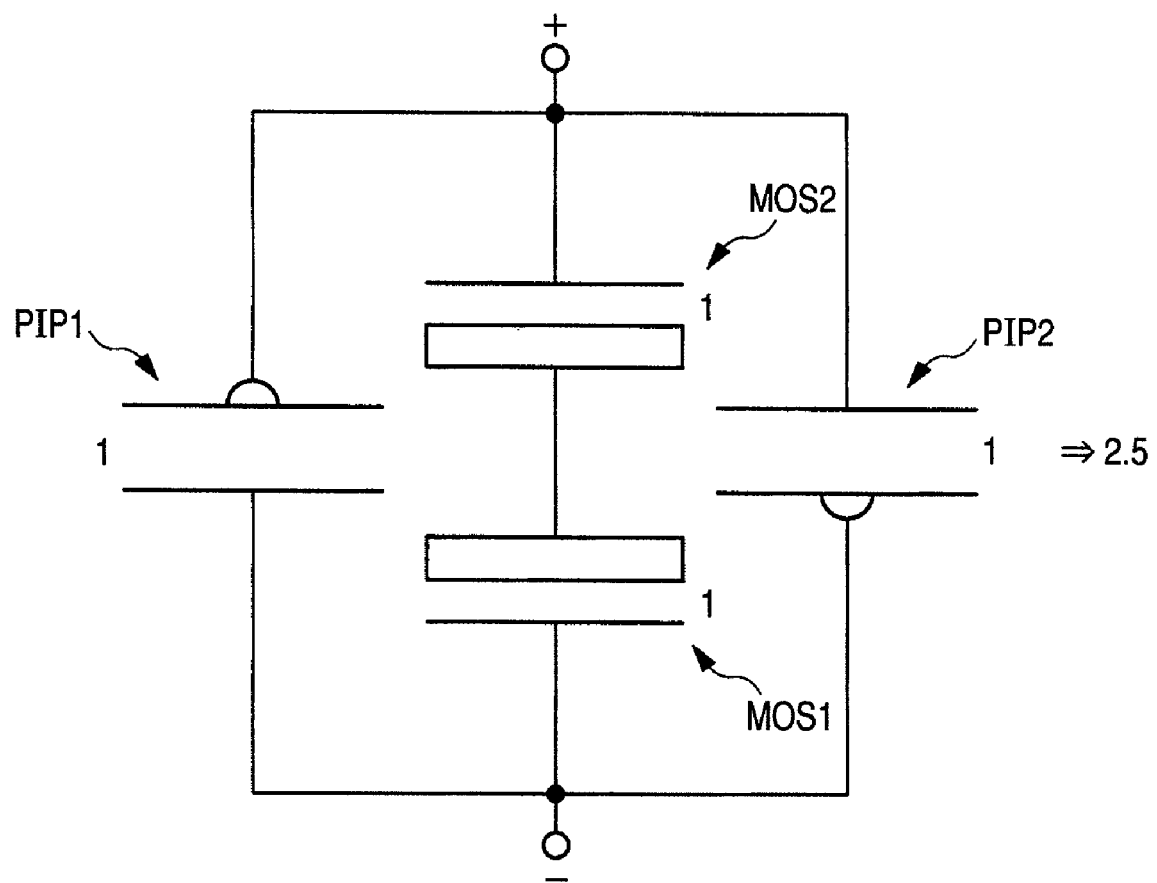
FIG. 7 is a diagram for explaining a capacitance value in the equivalent circuit diagram shown in FIG. 6.

Specific description will be given using FIG. 7. As shown in FIG. 7, it is assumed that each of the capacitance values of the MOS capacitor MOS1, the MOS capacitor MOS2, the polysilicon capacitor PIP1, and the polysilicon capacitor PIP2 is "1" for simplicity. At this time, the MOS capacitor MOS1 and the MOS capacitor MOS2 are coupled in series, and therefore, the capacitance value of the series capacitive element including the MOS capacitor MOS1 and the MOS capacitor MOS2 is reduced to "0.5". However, the polysilicon capacitor PIP1 and the polysilicon capacitor PIP2 are coupled in parallel with the series capacitive element, and therefore, the combined capacitance value of the series capacitive element, the polysilicon capacitor PIP1, and the polysilicon capacitor PIP2 is "0.5"+"1"+"1"="2.5". In this case, two capacitor cells are considered, and therefore, for example, the capacitance value of one capacitor cell is "1.25", which is larger than the capacitance value of the MOS capacitor MOS1 "1". Consequently, it is possible to make the capacitance value per unit capacitor cell larger than the capacitance value of the MOS capacitor MOS1.

According to the technical concept of the first embodiment, first of all, due to the first characteristic that the MOS capacitor MOS1 and the MOS capacitor MOS2 are coupled in series, it is possible to reduce the fraction defective of product that uses a capacitive element. Although the capacitance value of the series capacitive element configured by coupling the MOS capacitor MOS1 and the MOS capacitor MOS2 in series is reduced, it is possible to increase the capacitance value per unit capacitor cell due to the second characteristic that the polysilicon capacitor PIP1 and the polysilicon capacitor PIP2 are coupled in parallel with the series capacitive element. That is, according to the technical concept of the first embodiment, it is possible to reduce the product fraction defective resulting from the pin hole defect in the MOS capacitor and exhibit a remarkable effect for making large the capacitance value per unit capacitor cell.

Figure 8:
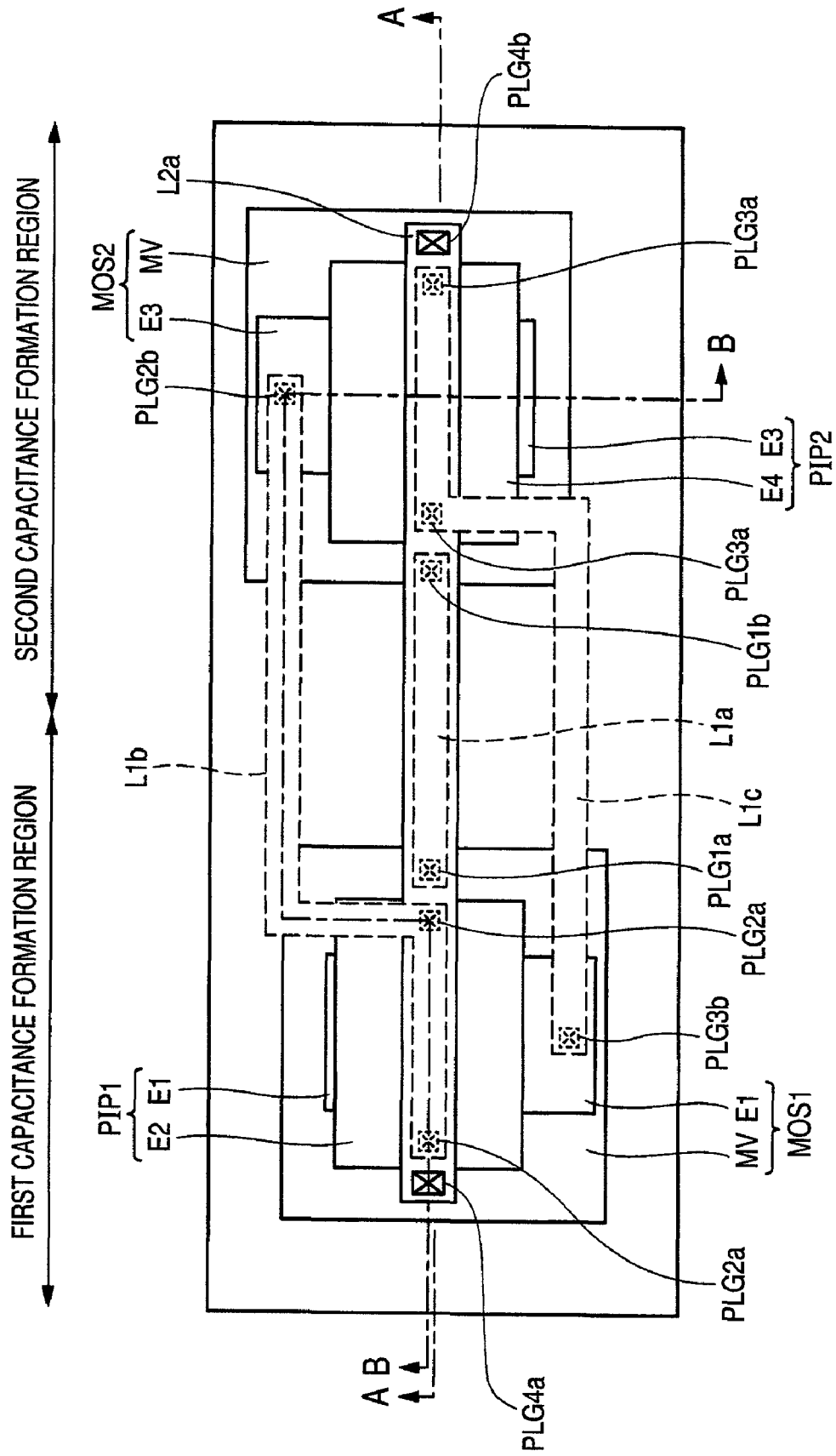
FIG. 8 is a plan view illustrating a layout configuration of capacitive elements in the first embodiment.

Subsequently, a layout configuration of the capacitive element which realizes the circuit configuration shown in FIG. 5 and FIG. 6 will be described. FIG. 8 is a plan view showing a connection configuration of the capacitive element in the first embodiment. On the left-hand side in FIG. 8, a first capacitance formation region is formed and on the right-hand side in FIG. 8, a second capacitance formation region is formed. First, in the first capacitance formation region formed on the left-hand side in FIG. 8, a capacitive element having a laminated structure of the MOS capacitor MOS1 and the polysilicon capacitor PIP1 is formed. Although the high-concentration semiconductor region, which is the lower electrode of the MOS capacitor MOS1, is not seen, the n-type semiconductor region MV formed on the outside of the high-concentration semiconductor region is shown. Then, on the upper part of the high-concentration semiconductor region, not shown, the electrode E1 is formed. As described above, in the MOS capacitor MOS1, the high-concentration semiconductor region coupled with the n-type semiconductor region MV is used as the lower electrode and the electrode E1 formed over the high-concentration semiconductor region via a capacitor insulating film, not shown, is used as the upper electrode. Further, over the electrode E1, the electrode E2 is formed via a capacitor insulating film, not shown. In the polysilicon capacitor PIP1, the electrode E1 is used as the lower electrode and the electrode E2 is used as the upper electrode.

Similarly, in the second capacitance formation region formed on the right-hand side in FIG. 8, a capacitive element having a laminated structure of the MOS capacitor MOS2 and the polysilicon capacitor PIP2 is formed. Although the high-concentration semiconductor region, which is the lower electrode of the MOS capacitor MOS2, is not seen, the n-type semiconductor region MV formed on the outside of the high-concentration semiconductor region is shown. Then, on the upper part of the high-concentration semiconductor region, not shown, the electrode E3 is formed. As described above, in the MOS capacitor MOS2, the high-concentration semiconductor region over with the n-type semiconductor region MV is used as the lower electrode and the electrode E3 formed over the high-concentration semiconductor region via a capacitor insulating film, not shown, is used as the upper electrode. Further, over the electrode E3, the electrode E4 is formed via a capacitor insulating film, not shown. In the polysilicon capacitor PIP2, the electrode E3 is used as the lower electrode and the electrode E4 is used as the upper electrode.

A connection relationship of the two capacitive elements configured as described above will be described in association with FIG. 5 and FIG. 8. First, a connection configuration of the high-concentration semiconductor region HS1 used as the lower electrode of the MOS capacitor MOS1 and the high-concentration semiconductor region HS2 used as the lower electrode of the MOS capacitor MOS2 connected in the circuit diagram shown in FIG. 5 will be described. This connection is formed by the wire L1$a$ via a plug PLG1$a$ and a plug PLG1$b$ and a wire L2$a$ via a plug PLG4$a$ and a plug PLG4$b$. The n-type semiconductor regions MV formed in the first capacitance formation region and the second capacitance formation region are electrically connected by the wire L1$a$ via the plug PLG1$a$ or the plug PLG1$b$. Due to this, in the first capacitance formation region on the left-hand side, the high-concentration semiconductor region (high-concentration semiconductor region HS1 in FIG. 5) formed in the lower layer of the electrode E1 is connected, as a result, with the wire L1$a$ via the n-type semiconductor region MV and the plug PLG1$a$ formed on the outside. Similarly, in the second capacitance formation region on the right-hand side also, the high-concentration semiconductor region (high-concentration semiconductor region HS2 in FIG. 5) formed in the lower layer of the electrode E3 is connected, as a result, with the wire L1$a$ via the n-type semiconductor region MV and the plug PLG1$b$ formed on the outside. Consequently, the high-concentration semiconductor region (formed in the lower layer of the electrode E1 in FIG. 8) constituting the lower electrode of the MOS capacitor MOS1 and the high-concentration semiconductor region (formed in the lower layer of the electrode E3 in FIG. 8) constituting the lower electrode of the MOS capacitor MOS2 are electrically connected by the wire L1$a$.

Further, in order to ensure the connection between the lower electrode of the MOS capacitor MOS1 and the lower electrode of the MOS capacitor MOS2, the n-type semiconductor region MV formed in the first capacitance formation region on the left-hand side is connected with the wire L2$a$ via the plug PLG4$a$ and similarly, the n-type semiconductor region MV formed in the second capacitance formation region on the right-hand side is also connected with the wire L2$a$ via the plug PLG4$b$. Due to this, the n-type semiconductor regions MV formed in the first capacitance formation region and the second capacitance formation region are electrically connected by the wire L2$a$.

Subsequently, a connection configuration of the electrode E2 and the electrode E3 connected in the circuit diagram shown in FIG. 5 will be described. This connection is formed by the wire L1$b$ via a plug PLG2$a$ and a plug PLG2$b$ in FIG. 8. First, the electrode E2 formed in the first capacitance formation region on the left-hand side is connected with the wire L1b via the plug PLG2a as a result. On the other hand, the electrode E3 formed in the second capacitance formation region on the right-hand side is also connected with the wire L1b via the plug PLG2b. Due to this, the electrode E2 formed in the first capacitance formation region on the left-hand side and the electrode E3 formed in the second capacitance formation region on the right-hand side are electrically connected by the wire L1b as a result.

Next, a connection configuration of the electrode E1 and the electrode E4 connected in the circuit diagram shown in FIG. 5 will be described. This connection is formed by a wire L1c via a plug PLG3a and a plug PLG3b in FIG. 8. First, the electrode E1 formed in the first capacitance formation region on the left-hand side is connected with the wire L1c via the plug PLG3b as a result. On the other hand, the electrode E4 formed in the second capacitance formation region on the right-hand side is also connected with the wire L1c via the plug PLG3a. Due to this, the electrode E1 formed in the first capacitance formation region on the left-hand side and the electrode E4 formed in the second capacitance formation region on the right-hand side are electrically connected by the wire L1c as a result.

In the first capacitance formation region, the plug PLG2a is coupled with the electrode E2, however, the connection portion is formed in a region where the electrode E1 and the electrode E2 do not overlap in a planar view. This is because the PLG2a is formed in the contact hole in the interlayer insulating film, however, there is a possibility that each ion seed used in etching at the time of formation of the contact hole damages the capacitor insulating film of the polysilicon capacitor PIP1. Because of this, in the present embodiment, the above-described possibility is avoided by forming the position at which the PLG2a is formed in a region where the electrode E1 and the electrode E2 do not overlap in a planar view. This also applies to the plug PLG3a in the second capacitance formation region. Further, this also applies to subsequent embodiments.

Figure 9:
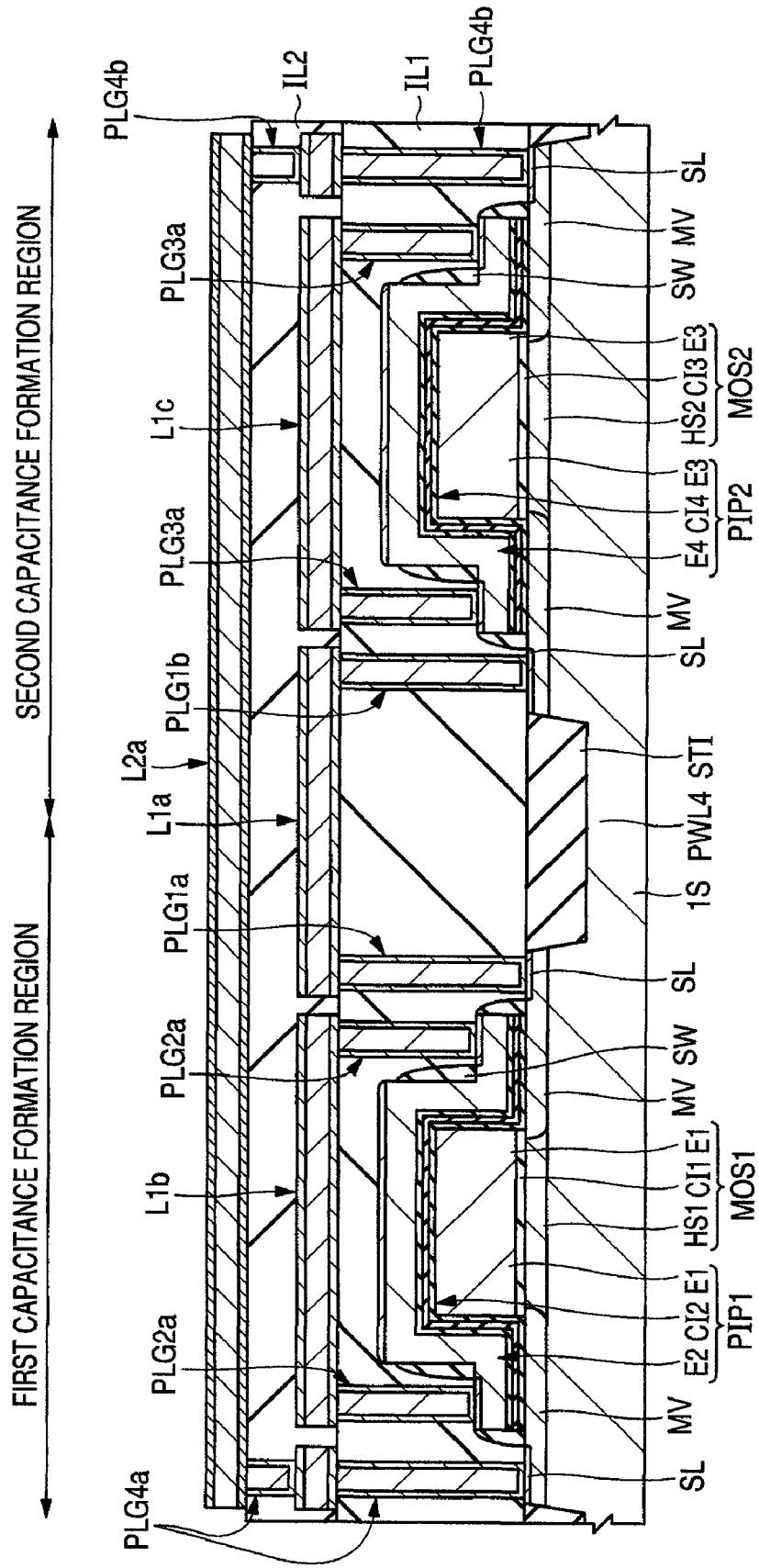
FIG. 9 is a section view cut along A-A line in FIG. 8.

FIG. 9 is a section view cut by A-A line in FIG. 8. As shown in FIG. 9, in the semiconductor substrate 1S, the first capacitance formation region and the second capacitance formation region exist. First, the configuration of the capacitive element formed in the first capacitance formation region will be described. As shown in FIG. 9, in the semiconductor substrate 1S, the element isolation region STI is formed and in an active region defined by the element isolation region STI, the p-type well PWL4 is formed. Over the surface of the p-type well PWL4, the high-concentration semiconductor region HS1 including an $n^{++}$-type semiconductor region is formed. Then, the n-type semiconductor region MV is formed so as to sandwich the high-concentration semiconductor region HS1.

Over the high-concentration semiconductor region HS1, the capacitor insulating film CI1 including, for example, a silicon oxide film is formed and over the capacitor insulating film CI1, the electrode E1 is formed. The electrode E1 is formed, for example, from a polysilicon film. In this manner, the MOS capacitor MOS1 is formed in the semiconductor substrate 1S. That is, the MOS capacitor MOS1 is a capacitive element that uses the high-concentration semiconductor region HS1 as a lower electrode and the electrode E1 as an upper electrode. At this time, the high-concentration semiconductor region HS1 is formed so that the impurity concentration is the highest of the semiconductor regions that exist in the semiconductor substrate 1S in the first capacitance formation region.

Subsequently, in the capacitive element in the first embodiment, the polysilicon capacitor PIP1 is formed over the MOS capacitor MOS1. Specifically, the polysilicon capacitor PIP1 uses the above-described electrode E1 as a lower electrode. Then, the capacitor insulating film CI2 is formed so as to cover the electrode E1 and the electrode E2 is formed over the capacitor insulating film CI2. The polysilicon capacitor PIP1 thus configured uses the electrode E2 as an upper electrode. The electrode E2 has a polysilicon film as its main component and over the surface of the polysilicon film, a cobalt silicide film is formed. At a step part of the electrode E2, for example, the sidewall SW including a silicon oxide film is formed.

Similarly, the configuration of the capacitive element formed in the second capacitance formation region will be described. As shown in FIG. 9, in the semiconductor substrate 1S, the element isolation region STI is formed and in an active region defined by the element isolation region STI, the p-type well PWL4 is formed. Over the surface of the p-type well PWL4, the high-concentration semiconductor region HS2 including an $n^{++}$-type semiconductor region is formed. Then, the n-type semiconductor region MV is formed so as to sandwich the high-concentration semiconductor region HS2.

Over the high-concentration semiconductor region HS2, a capacitor insulating film CI3 including, for example, a silicon oxide film is formed and over the capacitor insulating film CI3, the electrode E3 is formed. The electrode E3 is formed, for example, from a polysilicon film. In this manner, the MOS capacitor MOS2 is formed in the semiconductor substrate 1S. That is, the MOS capacitor MOS2 is a capacitive element that uses the high-concentration semiconductor region HS2 as a lower electrode and the electrode E3 as an upper electrode. At this time, the high-concentration semiconductor region HS2 is formed so that the impurity concentration is the highest of the semiconductor regions that exist in the semiconductor substrate 15 in the second capacitance formation region. It is possible to form the high-concentration semiconductor region HS1 formed in the first capacitance formation region and the high-concentration semiconductor region HS2 formed in the second capacitance formation region as a semiconductor region having the same concentration.

In the capacitive element in the first embodiment, the polysilicon capacitor PIP2 is formed over the MOS capacitor MOS2. Specifically, the polysilicon capacitor PIP2 uses the above-described electrode E3 as a lower electrode. Then, a capacitor insulating film CI4 is formed so as to cover the electrode E3 and the electrode E4 is formed over the capacitor insulating film CI4. The polysilicon capacitor PIP2 thus configured uses the electrode E4 as an upper electrode. The electrode E4 has a polysilicon film as its main component and over the surface of the polysilicon film, a cobalt silicide film is formed. At a step part of the electrode E4, for example, the sidewall SW including a silicon oxide film is formed.

Here, the connection configuration of the lower electrode of the MOS capacitor MOS1 and the lower electrode of the MOS capacitor MOS2 will be described. First, the high-concentration semiconductor region HS1 constituting the lower electrode of the MOS capacitor MOS1 is electrically connected with the n-type semiconductor region MV formed on the outside. Then, this n-type semiconductor region MV is coupled with the plug PLG1a penetrating through the interlayer insulating film IL1. At this time, between the plug PLG1a and the n-type semiconductor region MV, the cobalt silicide film SL is formed. The plug PLG1a is connected with the wire L1a formed over the interlayer insulating film IL1. On the other hand, the high-concentration semiconductor region HS2 constituting the lower electrode of the MOS capacitor MOS2 is electrically connected with the n-type semiconductor region MV formed on the outside. Then, this n-type semiconductor region MV is coupled with the plug PLG1b penetrating through the interlayer insulating film IL1. At this time, between the plug PLG1b and the n-type semiconductor region MV, the cobalt silicide film SL is formed. The plug PLG1b is connected with the wire L1a formed over the interlayer insulating film IL1. Because of this, it can be seen that the high-concentration semiconductor region HS1 constituting the lower electrode of the MOS capacitor MOS1 and the high-concentration semiconductor region HS2 constituting the lower electrode of the MOS capacitor MOS2 are electrically connected via the wire L1a connected with the plug PLG1a and the plug PLG1b. Further, it can be seen that the high-concentration semiconductor region HS1 constituting the lower electrode of the MOS capacitor MOS1 and the high-concentration semiconductor region HS2 constituting the lower electrode of the MOS capacitor MOS2 are connected also by the wire L2a formed over the interlayer insulating film IL2 via the plug PLG4a and the plug PLG4b.

Figure 10:
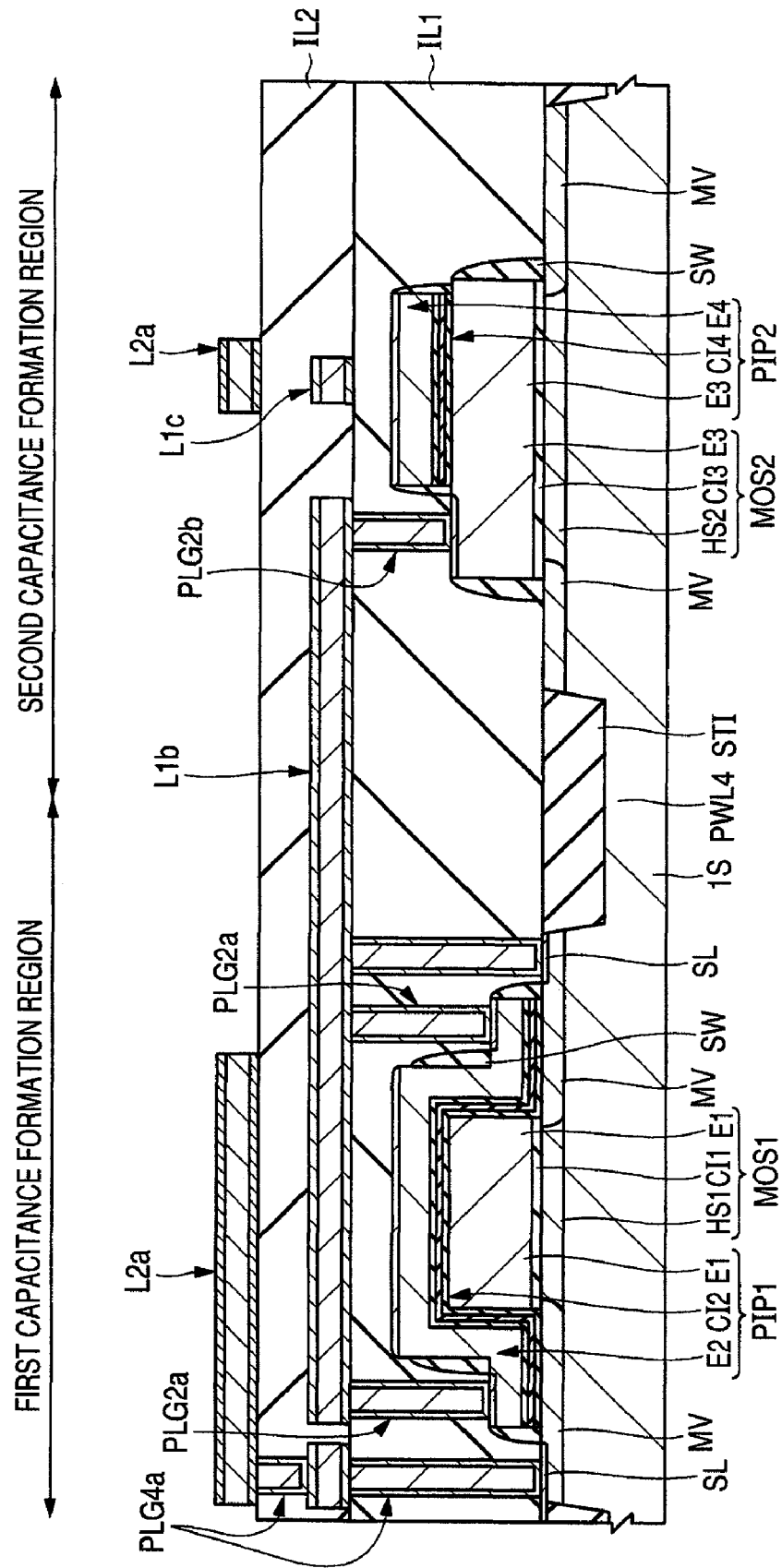
FIG. 10 is a section view cut along B-B line in FIG. 8.

Next, the connection relationship between the electrode E2 constituting the upper electrode of the polysilicon capacitor PIP1 and the electrode E3 constituting the lower electrode of the polysilicon capacitor PIP2 will be described with reference to FIG. 10. FIG. 10 is a section view cut by B-B line in FIG. 8. As shown in FIG. 10, the electrode E2 constituting the upper electrode of the polysilicon capacitor PIP1 is connected with the wire L1b via the plug PLG2a penetrating through the interlayer insulating film IL1. On the other hand, the electrode E3 constituting the lower electrode of the polysilicon capacitor PIP2 is connected with the wire L1b via the plug PLG2b penetrating through the interlayer insulating film IL1. Because of this, it can be seen that the electrode E2 constituting the upper electrode of the polysilicon capacitor PIP1 and the electrode E3 constituting the lower electrode of the polysilicon capacitor PIP2 are connected by the wire L1b. The capacitive element in the first embodiment is configured as described above.

In the first embodiment, the lower electrode of the MOS capacitor MOS1 and the lower electrode of the MOS capacitor MOS2 are formed, for example, from the high-concentration semiconductor regions HS1, HS2, which are $n^{++}$-semiconductor regions, and this advantage will be described.

First, a capacitive element that uses a high-concentration semiconductor region ($n^{++}$-type semiconductor region) as a lower electrode of a MOS capacitor as in the first embodiment is assumed to be referred to as a MOS capacitor (1). Then, a capacitive element that uses a low-concentration p-type well as a lower electrode of the MOS capacitor is referred to as a MOS capacitor (2) and a capacitive element that uses a low-concentration n-type well as a lower electrode of the MOS capacitor is referred to as a MOS capacitor (3). As to the MOS capacitor (1) to the MOS capacitor (3) configured as described above, a relationship between a relative voltage to be applied to the upper electrode (polysilicon film) with the lower electrode as reference and a capacitance value will be described.

Figure 11:
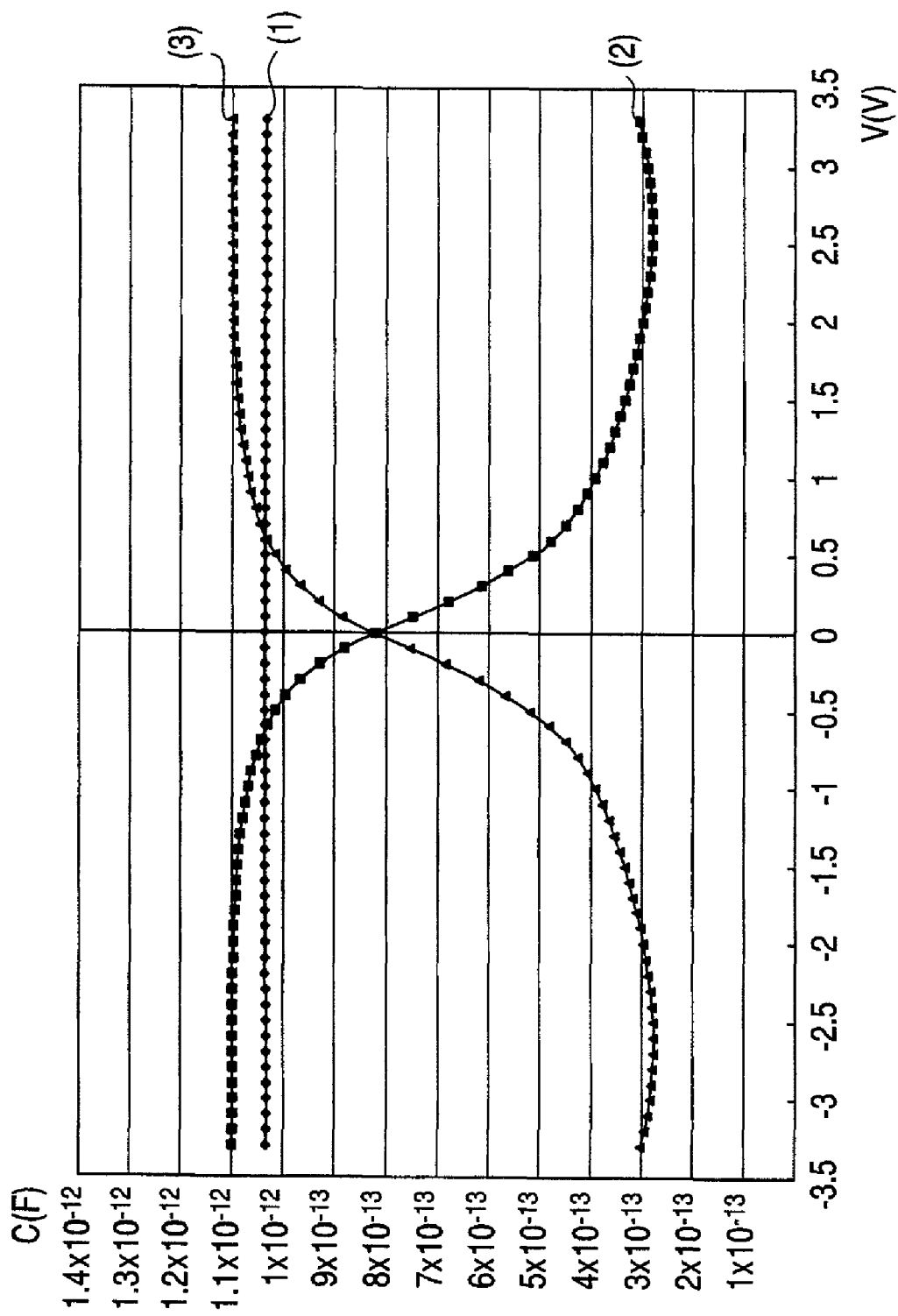
FIG. 11 is a graph illustrating a relationship between a relative voltage to be applied to an upper electrode on the basis of a lower electrode and a capacitance value.

FIG. 11 is a graph showing a relationship between a relative voltage to be applied to the upper electrode with the lower electrode as reference and a capacitance value in the above-described MOS capacitor (1) to MOS capacitor (3). It is seen that, as shown in FIG. 11, the capacitance value of the MOS capacitor (1) hardly changes even when the relative voltage to be applied to the upper electrode changes, for example, between −3.3 V and +3.3 V. This indicates that the capacitance of the MOS capacitor (1) does not have voltage dependence. For example, in the case shown in FIG. 6, in the MOS capacitor MOS1, the electrode E1, used as the upper electrode, is coupled to the low potential and in the MOS capacitor MOS2, E3, used as the upper electrode, is coupled to the high potential. That is, in the MOS capacitor MOS1, the electrode E1 used as the upper electrode is coupled to the potential lower than the high-concentration semiconductor region HS1 used as the lower electrode, and in the MOS capacitor MOS2, the electrode E3 used as the upper electrode is coupled to the potential higher than the high-concentration semiconductor region HS2 used as the lower electrode. That is, while in the MOS capacitor MOS1, a relatively negative voltage is applied to the upper electrode with the lower electrode as reference, in the MOS capacitor MOS2, a relatively positive voltage is applied to the upper electrode with the lower electrode as reference as a result. In this case, if the MOS capacitor (1) is used as the MOS capacitor MOS1 or the MOS capacitor MOS2, it is possible to use the MOS capacitor MOS1 and the MOS capacitor MOS2 in a state where the capacitance value is high. That is, according to the MOS capacitor (1), it is possible to use it as both the MOS capacitor MOS1 and the MOS capacitor MOS2 without the need to take into consideration the direction of the MOS capacitor (1) because the capacitance value does not have voltage dependence.

In contrast to this, it is seen that, in the MOS capacitor (2), the capacitance value drastically changes when the relative voltage to be applied to the upper electrode changes, for example, between −3.3 V and +3.3 V. Specifically, it is possible to obtain a high capacitance value when applying a relatively negative voltage to the upper electrode with the lower electrode as reference, however, when applying a relatively positive voltage to the upper electrode with the lower electrode as reference, the capacitance value is reduced. Because of this, it is possible to obtain a high capacitance value when using the MOS capacitor (2) as the MOS capacitor MOS1, however, only a low capacitance value when using the MOS capacitor (2) as the MOS capacitor MOS2. Consequently, when it is considered to use the MOS capacitor (2) in a state where its capacitance value is high, only the MOS capacitor MOS1 can be used of the MOS capacitor MOS1 and the MOS capacitor MOS2 coupled in series.

Similarly, it is seen that, in the MOS capacitor (3), the capacitance value drastically changes when the relative voltage to be applied to the upper electrode changes, for example, between −3.3 V and +3.3 V. Specifically, it is possible to obtain a high capacitance value when applying a relatively positive voltage to the upper electrode with the lower electrode as reference, however, when applying a relatively negative voltage to the upper electrode with the lower electrode as reference, the capacitance value is reduced. Because of this, it is possible to obtain a high capacitance value when using the MOS capacitor (3) as the MOS capacitor MOS2, however, only a low capacitance value when using the MOS capacitor (3) as the MOS capacitor MOS1. Consequently, when it is considered to use the MOS capacitor (3) in a state where its capacitance value is high, only the MOS capacitor MOS2 can be used of the MOS capacitor MOS1 and the MOS capacitor MOS2 coupled in series.

From the above, given the structure of the MOS capacitor (1), it can be used as both the MOS capacitor MOS1 and the MOS capacitor MOS2. This means that the MOS capacitor MOS1 and MOS capacitor MOS2 can be formed into the same capacitive element structure (structure of the MOS capacitor (1)). Further, because the capacitance of the MOS capacitor MOS1 and the capacitance of the MOS capacitor MOS2 do not have voltage dependence, the restrictions on the wiring layout with which the MOS capacitor MOS1 and the MOS capacitor MOS2 are connected are relaxed, and therefore, it is possible to obtain an effect to improve the degree of freedom in wiring layout.

In contrast to this, given the structure of the MOS capacitor (2) and the structure of the MOS capacitor (3), when it is considered to use them in a state where their capacitance values are high, the structure of the MOS capacitor (2) is used for the MOS capacitor MOS1 and the structure of the MOS capacitor (2) is used for the MOS capacitor MOS2. This means that it is necessary to form the MOS capacitor MOS1 and the MOS capacitor MOS2 into different capacitive element structures (structures of the MOS capacitor (2) and the MOS capacitor (3)). Further, it is necessary to determine wiring layouts of the MOS capacitor MOS1 and the MOS capacitor MOS2 by taking into account the voltage dependence of the capacitance value. Because of this, the number of restrictions on wiring layout increases.

As described above, while the MOS capacitor (1) does not have the voltage dependence of capacitance value, the MOS capacitor (2) and the MOS capacitor (3) have the voltage dependence of capacitance value. The reason for this will be described briefly. First, the reason why the MOS capacitor (1) does not have the voltage dependence will be described. In the MOS capacitor (1), a high-concentration semiconductor region including an $n^{++}$-type semiconductor region is used as the lower electrode. Then, the upper electrode is formed over the high-concentration semiconductor region via a capacitor insulating film. At this time, if a relatively positive voltage is applied to the upper electrode with the lower electrode as reference, electrons are attracted to the positive voltage and accumulated on the surface of the high-concentration semiconductor region, the lower electrode (accumulation region). Because of this, the lower electrode functions as an accumulation region and the capacitance is only that of the capacitor insulating film, and therefore, the capacitance value increases. That is, the distance between the upper electrode and the lower electrode is equal to the film thickness of the capacitor insulating film, and therefore, the capacitance value increases. Subsequently, if the voltage applied to the upper electrode is changed to a negative one, the accumulation region disappears and a depletion layer is formed. However, the impurity concentration of the high-concentration semiconductor region is high, and therefore, the depletion layer hardly extends, only to an ignorable extent. Because of this, there is almost no depletion layer capacitance due to the depletion layer, and therefore, the capacitance value does not change.

Next, the reason why the voltage dependence of capacitance value appears in the MOS capacitor (2) will be described. In the MOS capacitor (2), a low-concentration p-type well (p-type semiconductor region) is used as the lower electrode. Then, over the p-type well, the upper electrode is formed via a capacitor insulating film. At this time, if a relatively negative voltage is applied to the upper electrode with the lower electrode as reference, holes are attracted to the negative voltage and accumulated on the surface of the p-type well, the lower electrode (accumulation region). Because of this, the lower electrode functions as an accumulation region and the capacitance is only that of the capacitor insulating film, and therefore, the capacitance value increases. Subsequently, if the voltage applied to the upper electrode is changed to a positive one, the accumulation region disappears and a depletion layer is formed. At this time, because the impurity concentration of the p-type well is low, the depletion layer extends. As a result, the capacitance value of the MOS capacitor (2) becomes that when the capacitor of the capacitor insulating film and the depletion capacitor of the depletion layer are coupled in series. Because of this, if the voltage applied to the upper electrode is changed to a positive one, the capacitance value is reduced by an amount corresponding to the capacitance of depletion layer that has occurred. In particular, the higher the positive voltage, the more the depletion layer extends, and therefore, the capacitance value is further reduced.

Subsequently, the reason why the voltage dependence of capacitance value appears in the MOS capacitor (3) will be described. In the MOS capacitor (3), a low-concentration n-type well (n-type semiconductor region) is used as the lower electrode. Then, over the n-type well, the upper electrode is formed via a capacitor insulating film. At this time, if a relatively positive voltage is applied to the upper electrode with the lower electrode as reference, electrons are attracted to the positive voltage and accumulated on the surface of the n-type well, the lower electrode (accumulation region). Because of this, the lower electrode functions as an accumulation region and the capacitance is only that of the capacitor insulating film, and therefore, the capacitance value increases. Subsequently, if the voltage applied to the upper electrode is changed to a negative one, the accumulation region disappears and a depletion layer is formed. At this time, because the impurity concentration of the n-type well is low, the depletion layer extends. As a result, the capacitance value of the MOS capacitor (3) becomes that when the capacitor of the capacitor insulating film and the depletion capacitor of the depletion layer are coupled in series. Because of this, if the voltage applied to the upper electrode is changed to a negative one, the capacitance value is reduced by an amount corresponding to the capacitance of depletion layer that has occurred. In particular, the higher the negative voltage, the more the depletion layer extends, and therefore, the capacitance value is further reduced.

For the above-described reasons, it can be seen that the MOS capacitor (1) does not have the voltage dependence of capacitance value, however, the MOS capacitor (2) and the MOS capacitor (3) have the voltage dependence of capacitance value.

The semiconductor device in the first embodiment is configured as described above, and a method for manufacturing the same will be described below with reference to the drawings. In FIG. 12 to FIG. 24 in which a method for manufacturing a semiconductor device will be described, description will be given while schematically illustrating the memory cell formation region, the low withstand voltage MISFET formation region, the high withstand voltage MISFET formation region, and the capacitive element formation region simultaneously.

Figure 12:
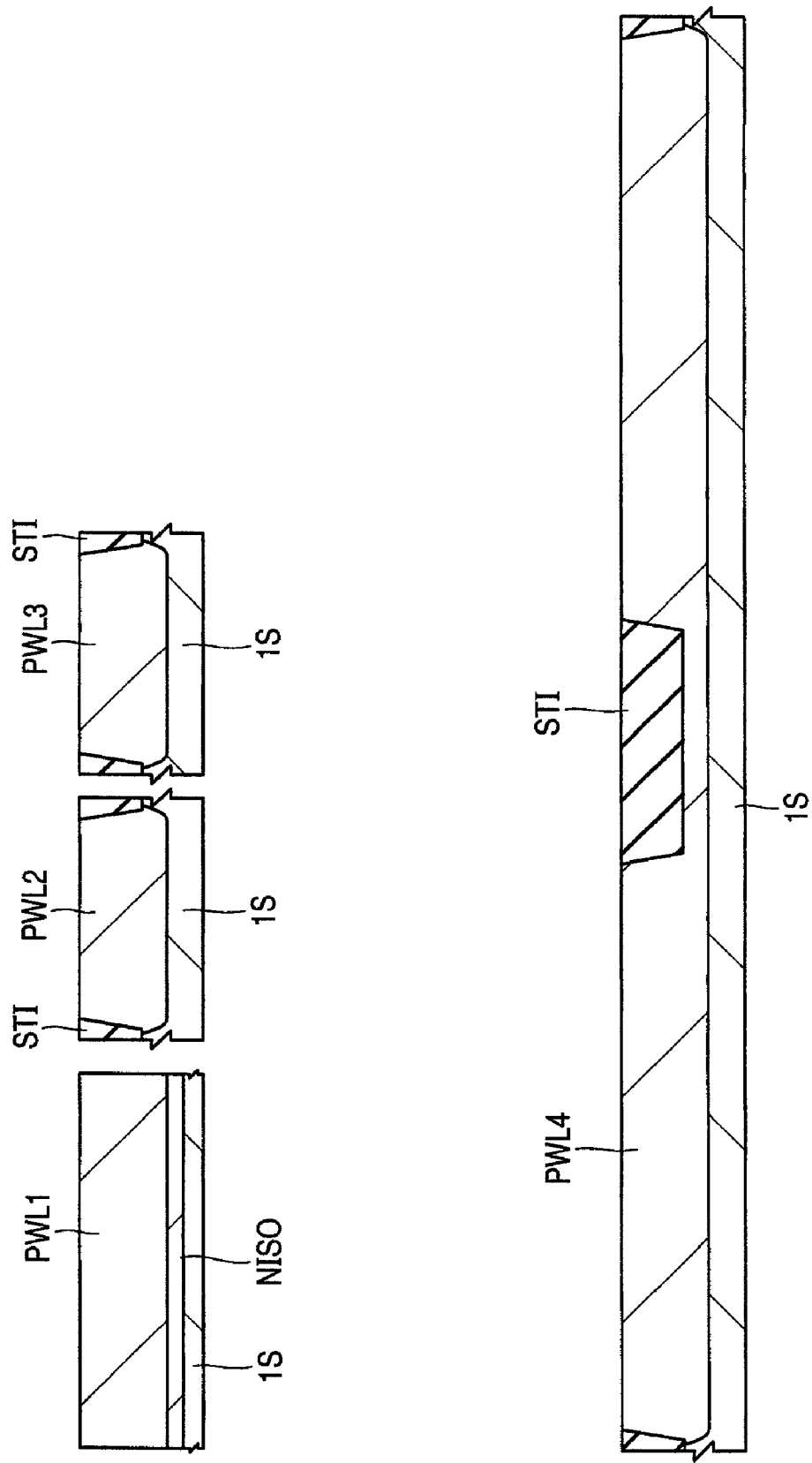
FIG. 12 is a section view illustrating a manufacturing process of a semiconductor device in the first embodiment.

First, as shown in FIG. 12, the semiconductor substrate 1S is prepared, which includes silicon single crystal into which p-type impurities, such as boron (B), have been introduced. At this time, the semiconductor substrate 1S is in a state of a semiconductor wafer in substantially the form of a disc. Then, the element isolation region STI is formed, which separates the low withstand voltage MISFET formation region and the high withstand voltage MISFET formation region of the semiconductor substrate 1S. The element isolation region STI is provided in order to prevent interference between elements. The element isolation region STI can be formed using, for example, the LOCOS (local oxidation of silicon) method or the STI (shallow trench isolation) method. For example, with the STI method, the element isolation region STI is formed as described below. That is, an element isolation groove is formed in the semiconductor substrate 1S using the lithography technique and the etching technique. Then, a silicon oxide film is formed over the semiconductor substrate 1S so as to be embedded in the element isolation groove and after that, unnecessary silicon oxide film formed over the semiconductor substrate 1S is removed by the CMP (chemical mechanical polishing) method. Due to this, it is possible to form the element isolation region STI in which the silicon oxide film is embedded only in the element isolation groove. In FIG. 12, the element isolation region STI is not formed in the memory cell formation region, however, in the capacitive element formation region, the element isolation region STI is formed.

Subsequently, the well isolation layer NISO is formed by introducing impurities into the semiconductor substrate 1S in the memory cell formation region. The well isolation layer NISO is formed by introducing n-type impurities, such as phosphorus and arsenic, into the semiconductor substrate 1S. Then, the p-type wells PWL1 to PWL4 are formed by introducing impurities into the semiconductor substrate 1S. The p-type wells PWL1 to PWL4 are formed by introducing p-type impurities, for example, boron, into the semiconductor substrate 1S by the ion implantation method. Specifically, the p-type well PWL1 is formed in the memory cell formation region and the p-type well PWL2 is formed in the low withstand voltage MISFET formation region. Similarly, the p-type well PWL3 is formed in the high withstand voltage MISFET formation region and the p-type well PWL4 is formed in the capacitive element formation region.

Next, as shown in FIG. 13, the high-concentration semiconductor region HS1 and the high-concentration semiconductor region HS2 are formed in the capacitive element formation region. The high-concentration semiconductor regions HS1, HS2 include an $n^{++}$-type semiconductor region and are formed by introducing n-type impurities, for example, phosphorus or arsenic, by the ion implantation method. At this time, the high-concentration semiconductor regions HS1, HS2 are regions in which the impurity concentration is the highest of the semiconductor regions formed in the semiconductor substrate 1S in the capacitive element formation region. For the high-concentration semiconductor region HS1 and the high-concentration semiconductor region HS2, the implantation of the same ion is performed and they are semiconductor regions with the same impurity concentration.

Next, as shown in FIG. 14, an insulating film 10 is formed over the semiconductor substrate 1S. The insulating film will function as the gate insulating film of a memory cell, the gate insulating film of a low withstand voltage MISFET, and the gate insulating film of a high withstand voltage MISFET, to be described later. Because of this, it is possible to form the insulating film 10 from a silicon oxide film, for example, using the thermal oxidation method. However, the insulating film 10 is not limited to the silicon oxide film, but can be modified in various ways, and the insulating film 10 may be formed by, for example, a silicon oxynitride film (SiON). That is, it may have a structure in which nitrogen is segregated at the boundary surface between the insulating film 10 and the semiconductor substrate 1S. The silicon oxynitride film has a significant effect for suppressing the occurrence of boundary surface level in the film and reducing electron trap compared to the silicon oxide film. As a result, it is possible to improve the hot-carrier resistance of the insulating film 10 and the insulation resistance. In addition, the silicon oxynitride film is more unlikely to allow impurities to penetrate therethrough compared to the silicon oxide film. Because of this, by using a silicon oxynitride film as the insulating film 10, it is possible to suppress the variations in the threshold voltage resulting from the diffusion of impurities in the gate electrode to the side of the semiconductor substrate 1S. In order to form a silicon oxynitride film, for example, it is only required to perform heat treatment of the semiconductor substrate 1S in an atmosphere including nitrogen, such as NO, $NO_2$, or $NH_3$.

It is also possible to obtain the same effect by performing heat treatment of the semiconductor substrate 1S in an atmosphere including nitrogen after forming the insulating film 10 including a silicon oxide film over the surface of the semiconductor substrate 1S, and segregating nitrogen to the boundary surface between the insulating film 10 and the semiconductor substrate 1S.

Further, it may also be possible to form the insulating film 10, for example, from a high-k dielectric film having the dielectric constant higher than that of the silicon oxide film. Conventionally, from the standpoint that the insulation resistance is high, the electric/physical stability at the boundary surface between silicon and silicon oxide is excellent, etc., a silicon oxide film is used as the insulating film 10. However, it has been demanded for the insulating film 10 to be extremely thin accompanying the miniaturization of element. If such a thin silicon oxide film is used as the insulating film 10, a so-called tunneling current is caused by electrons that flow through the channel of MISFET, tunneling the barrier formed by the silicon oxide film and flowing to the gate electrode.

Because of this, a material having a dielectric constant higher than that of the silicon oxide film is used and thereby a high-k dielectric film begins to be used recently, which has the same capacitance but is capable of increasing physical film thickness. With a high-k dielectric film, it is possible to increase physical film thickness with the same capacitance, and therefore, the leak current can be reduced. In particular, although the silicon nitride film has a dielectric constant higher than that of the silicon oxide film, it is desirable to use a high-k dielectric film having a dielectric constant higher than that of the silicon nitride film in the first embodiment.

For example, as a high-k dielectric film having a dielectric constant higher than that of the silicon nitride film, a hafnium oxide film ($HfO_2$ film) is used, which is one of hafnium oxides, however, instead of the hafnium oxide film, other hafnium-based insulating films, such as a hafnium aluminate film, HfON film (hafnium oxynitride film), Hf SiO film (hafnium silicate film), HfSiON film (hafnium silicon oxynitride film), and HfAlO film, can be used. Further, hafnium-based insulating films that have introduced oxides therein, such as tantalum oxide, niobium oxide, titanium oxide, zirconium oxide, lanthanum oxide, and yttrium oxide, can also be used. Because the hafnium-based insulating film has a dielectric constant higher than that of the silicon oxide film and the silicon oxynitride film, like the hafnium oxide film, the same effect when the hafnium oxide film is used can be obtained.

In the first embodiment, the film thicknesses of the insulating film 10 formed in the memory cell formation region, the high withstand voltage MISFET formation region, and the capacitive element formation region are the same (for example, 14 nm). In contrast to this, the insulating film 10 formed in the low withstand voltage MISFET formation region is thinner (for example, 7 nm). As described above, in order to form only the insulating film 10 in the low withstand voltage MISFET formation region into thinner one, only the insulating film 10 in the low withstand voltage MISFET formation region is partially etched using the photolithography technique and the etching technique after forming the thick insulating film 10 in all of the regions.

Then, as shown in FIG. 15, a polysilicon film 11 is formed over the insulating film 10. It is possible to form the polysilicon film 11 using, for example, the CVD method. Then, n-type impurities, such as phosphorus and arsenic, are introduced into the polysilicon film 11 using the photolithography technique and the ion implantation method.

Figure 16:
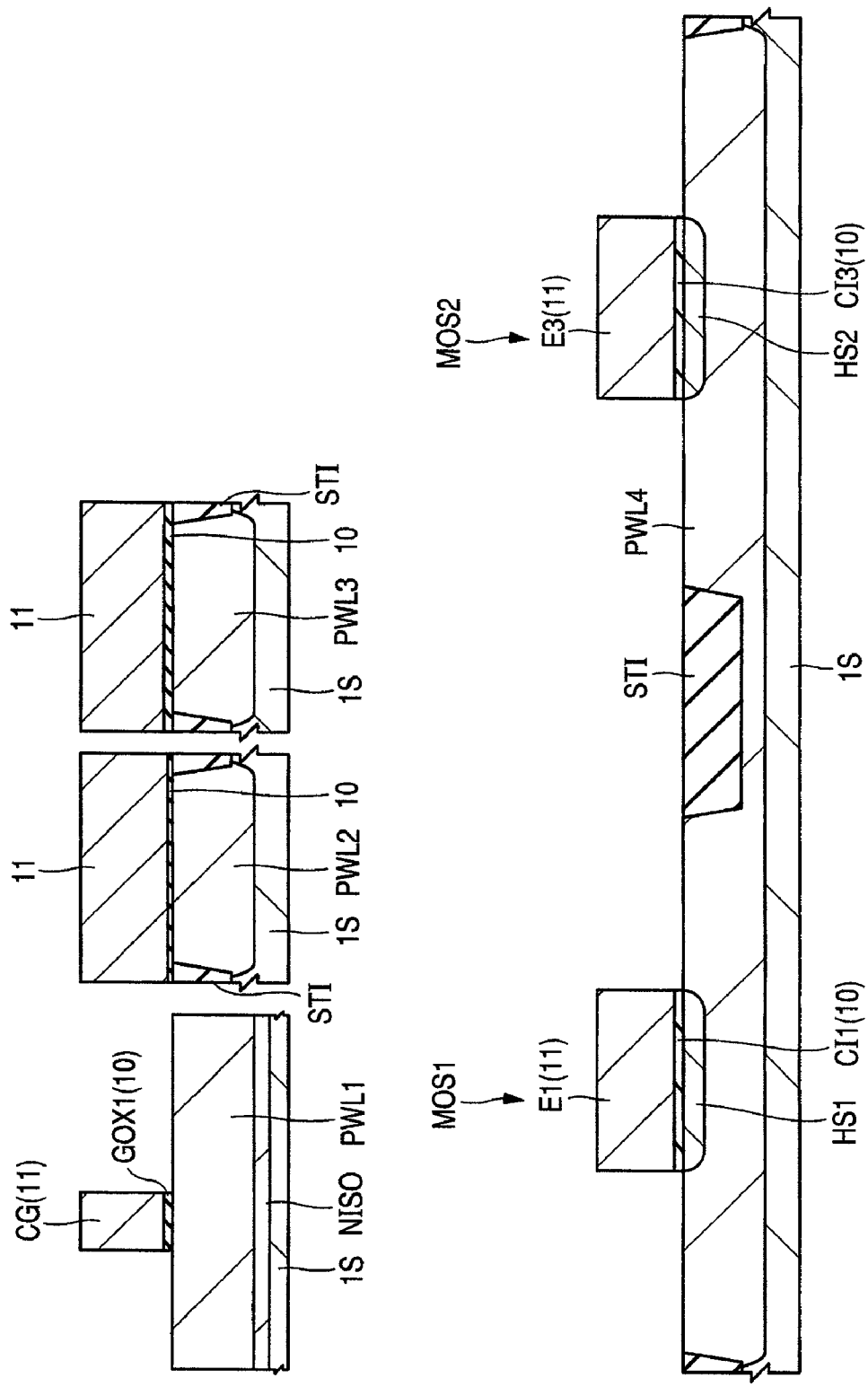
FIG. 16 is a section view illustrating a manufacturing process of the semiconductor device, following FIG. 15.

Next, as shown in FIG. 16, the polysilicon film 11 is processed by etching using a patterned resist film as a mask to form the control gate electrode CG in the memory cell formation region, and thus, the electrodes E1, E3 are formed in the capacitive element formation region. The control gate electrode CG is a gate electrode of a selection transistor of the memory cell. It can be seen that the capacitive element electrodes E1, E3 are formed in the process for forming the control gate electrode CG of the memory cell as described above. At this time, a gate insulating film GOX including the insulating film 10 is formed in the lower layer of the control gate electrode CG. Then, the insulating film 10 functions as the capacitor insulating films CI1, CI3 in the capacitive element formation region. Due to this, in the capacitive element formation region, the MOS capacitor MOS1 and the MOS capacitor MOS2 in which the high-concentration semiconductor regions HS1, HS2 are used as the lower electrode and the electrodes E1, E3 are used as the upper electrode are formed. By the way, in the low withstand voltage MISFET formation region and the high withstand voltage MISFET formation region, the polysilicon film 11 remains.

Here, into the polysilicon film 11 of the control gate electrode CG, n-type impurities have been introduced. Because of this, the work function value of the control gate electrode CG can be set to a value in the vicinity of the conductive band of silicon (4.15 eV), and therefore, it is possible to reduce the threshold voltage of the selection transistor, which is an n-channel type MISFET.

Subsequently, as shown in FIG. 17, n-type impurities, such as phosphorus and arsenic, are introduced in alignment with the control gate electrode CG using the photolithography technique and the ion implantation method. Thus, the n-type semiconductor region MV is formed in the memory cell formation region. This process is performed in order to adjust the threshold value of the memory transistor to be formed on the sidewall of the control gate electrode CG, as will be described later. At this time, the n-type semiconductor region MV is formed in alignment with the electrodes E1, E3 also in the capacitive element formation region.

Next, a laminated film is formed over the semiconductor substrate 1S, which covers the control gate electrode CG and the electrodes E1, E3 that function as the lower electrode. The laminated film is formed, for example, from the silicon oxide film 12, the silicon nitride film 13 formed over the silicon oxide film 12, and the silicon oxide film 14 formed over the silicon nitride film 13 (ONO film). The laminated film can be formed using, for example, the CVD method. Then, for example, the film thickness of the silicon oxide film 12 is 5 nm, that of the silicon nitride film 13 is 10 nm, and that of the silicon oxide film 14 is 5 nm.

The silicon nitride film 13 of the laminated film is a film that is used as a charge storage film of the memory transistor in the memory cell formation region. In the first embodiment, the silicon nitride film 14 is used as the charge storage film, however, it may also be possible to form it from other insulating films having a trap level as a charge storage film. For example, it is also possible to use a high-k dielectric film having a dielectric constant higher than that of the silicon nitride film, such as an aluminum oxide film (alumina film), hafnium oxide film, or tantalum oxide film, as a charge storage film. The laminated film is a film that is used as a capacitor insulating film in the capacitive element formation region.

Then, a polysilicon film 15 is formed over the laminated film. The polysilicon film 15 can be formed using, for example, the CVD method.

Figure 18:
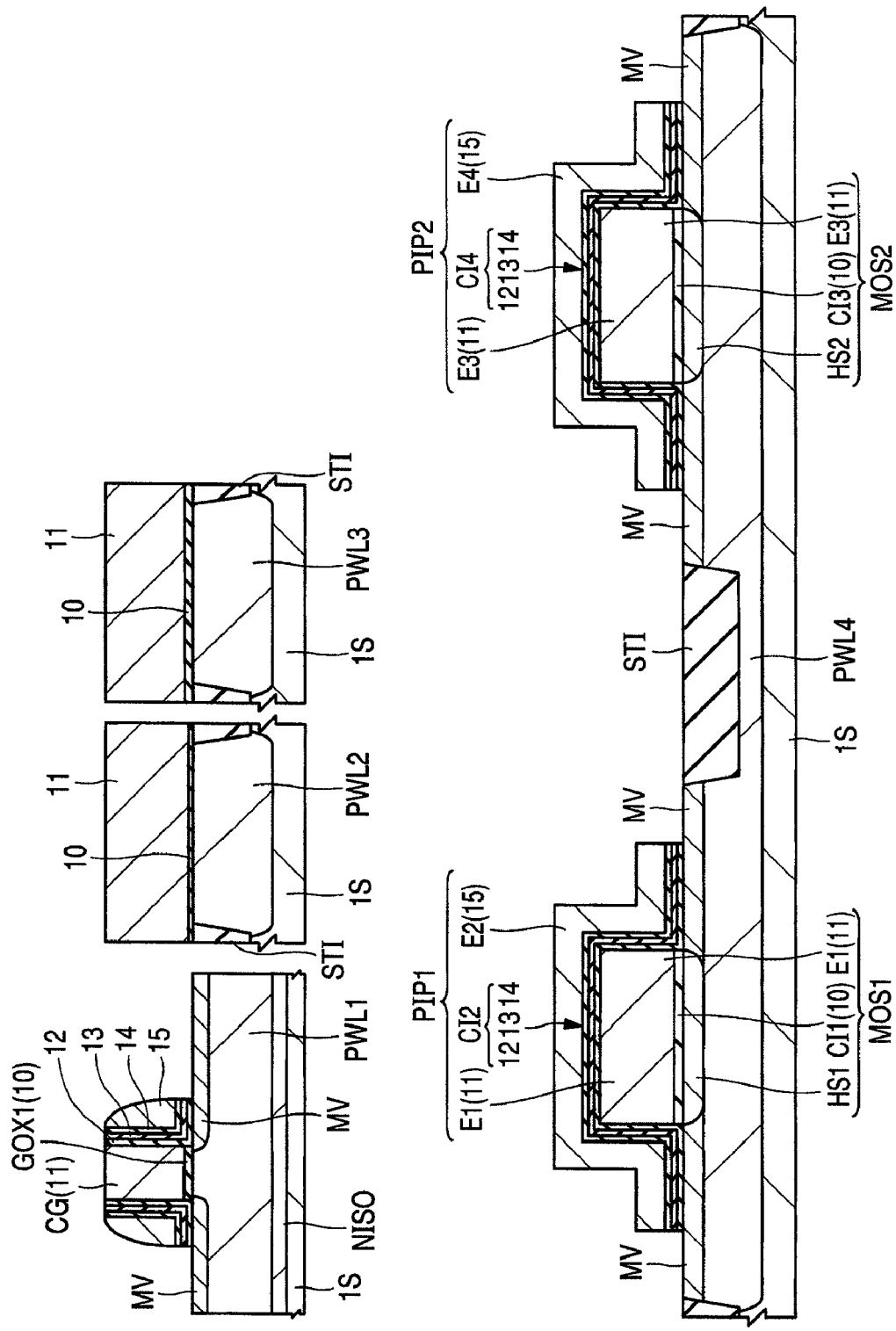
FIG. 18 is a section view illustrating a manufacturing process of the semiconductor device, following FIG. 17.

Next, as shown in FIG. 18, after applying a resist film over the semiconductor substrate 1S, patterning of the resist film is performed by subjecting it to exposure/developing processing. Patterning is performed such that the upper electrode formation region in the capacitive element formation region is covered and other regions are exposed.

Subsequently, using the patterned resist film as a mask, the polysilicon film 15 is subjected to anisotropy etching, and thereby, a sidewall including the laminated film and the polysilicon film 15 is left on both sides of the control gate electrode CG in the memory cell formation region. On the other hand, in the capacitive element formation region, the polysilicon film 15 remains only in the region covered with the resist film, and by the polysilicon film 15 that remains, the electrodes E2, E4 that function as the upper electrode are formed. In this stage, the electrodes E2, E4 that function as the upper electrode include the polysilicon film 15. After that, the patterned resist film is removed. In this process, the polysilicon film 15 is removed in the low withstand voltage MISFET formation region and the high withstand voltage MISFET formation region.

Then as shown in FIG. 19, by subjecting, after applying a resist film over the semiconductor substrate 1S, the resist film to exposure/developing processing, the resist film is patterned. Patterning is performed such that while the capacitive element formation region is entirely covered, part of the memory cell formation region is opened. Specifically, patterning is performed so that the sidewall formed on one of the sidewalls of the control gate electrode CG is exposed in the memory cell formation region.

Next, by etching using the patterned resist film as a mask, the sidewall exposed to the sidewall on the left-hand side of the control gate electrode CG is removed. At this time, the sidewall formed on the sidewall on the right-hand side of the control gate electrode CG is not removed because it is covered with the resist film. In the capacitive element formation region also, the electrodes E2, E4 that function as the upper electrode are not removed but remain because they are protected by the resist film. After that, the patterned resist film is removed.

Subsequently, the exposed ONO film (laminated film) is removed by performing etching. In this manner, in the memory cell formation region, the memory gate electrode MG in the form of a sidewall is formed only on the sidewall on the right-hand side of the control gate electrode CG via the laminated film (ONO film). At this time, the silicon nitride film 13 constituting the laminated film (ONO film) is used as the charge storage film EC. Then, the silicon oxide film 12 is used as the potential barrier film EV1 and the silicon oxide film 14 is used as the potential barrier film EV2. On the other hand, in the capacitive element formation region, only the laminated film (ONO film) covered by the electrodes E2, E4 remains and the laminated film (ONO film) formed in the lower layer of the electrodes E2, E4 is used as the capacitor insulating films CI2, CI4. That is, the capacitor insulating films CI2, CI4 include the silicon oxide film 12, the silicon nitride film 13, and the silicon oxide film 14. At this point of time, the memory gate electrode MG and the capacitive element electrodes E2, E4 in the memory cell are formed from a polysilicon film. Due to this, in the capacitive element formation region, it is possible to form the polysilicon capacitor PIP1 and the polysilicon capacitor PIP2 that use the electrodes E1, E3 as the lower electrode and the electrodes E2, E4 as the upper electrode.

Figure 20:
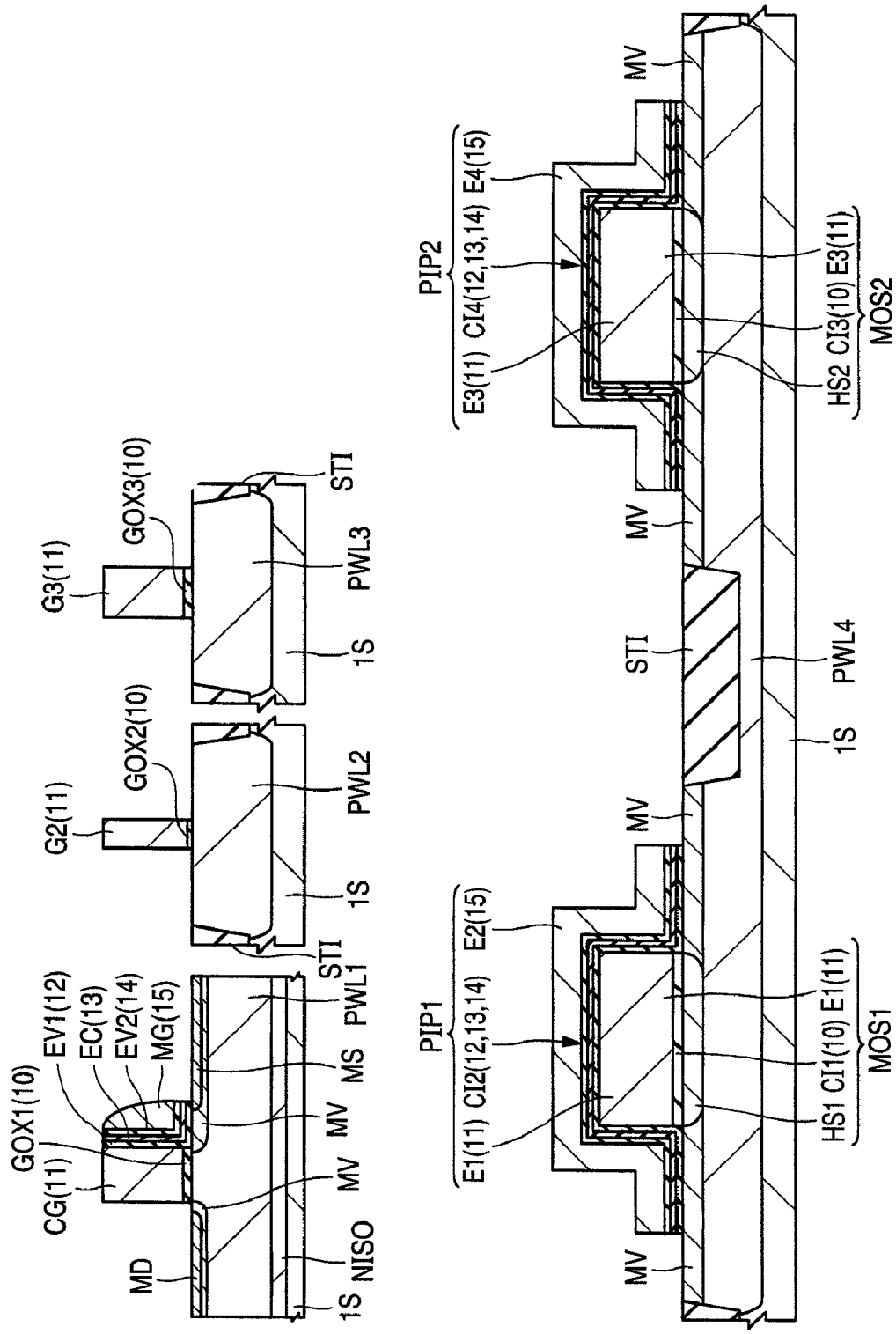
FIG. 20 is a section view illustrating a manufacturing process of the semiconductor device, following FIG. 19.

Next, as shown in FIG. 20, the shallow low-concentration impurity diffusion regions MD, MS in alignment with the control gate electrode CG and the memory gate electrode MG are formed in the memory cell formation region using the photolithography technique and the ion implantation method.

The shallow low-concentration impurity diffusion regions MD, MS are an n-type semiconductor region into which n-type impurities, such as phosphorus and arsenic, have been introduced.

After that, the gate electrode G2 is formed in the low withstand voltage MISFET formation region and the gate electrode G3 is formed in the high withstand voltage MISFET formation region using the photolithography technique and the etching technique. At this time, the gate insulating film GOX2 is formed in the lower layer of the gate electrode G2 and the gate insulating film GOX3 is formed in the lower layer of the gate electrode G3.

Figure 21:
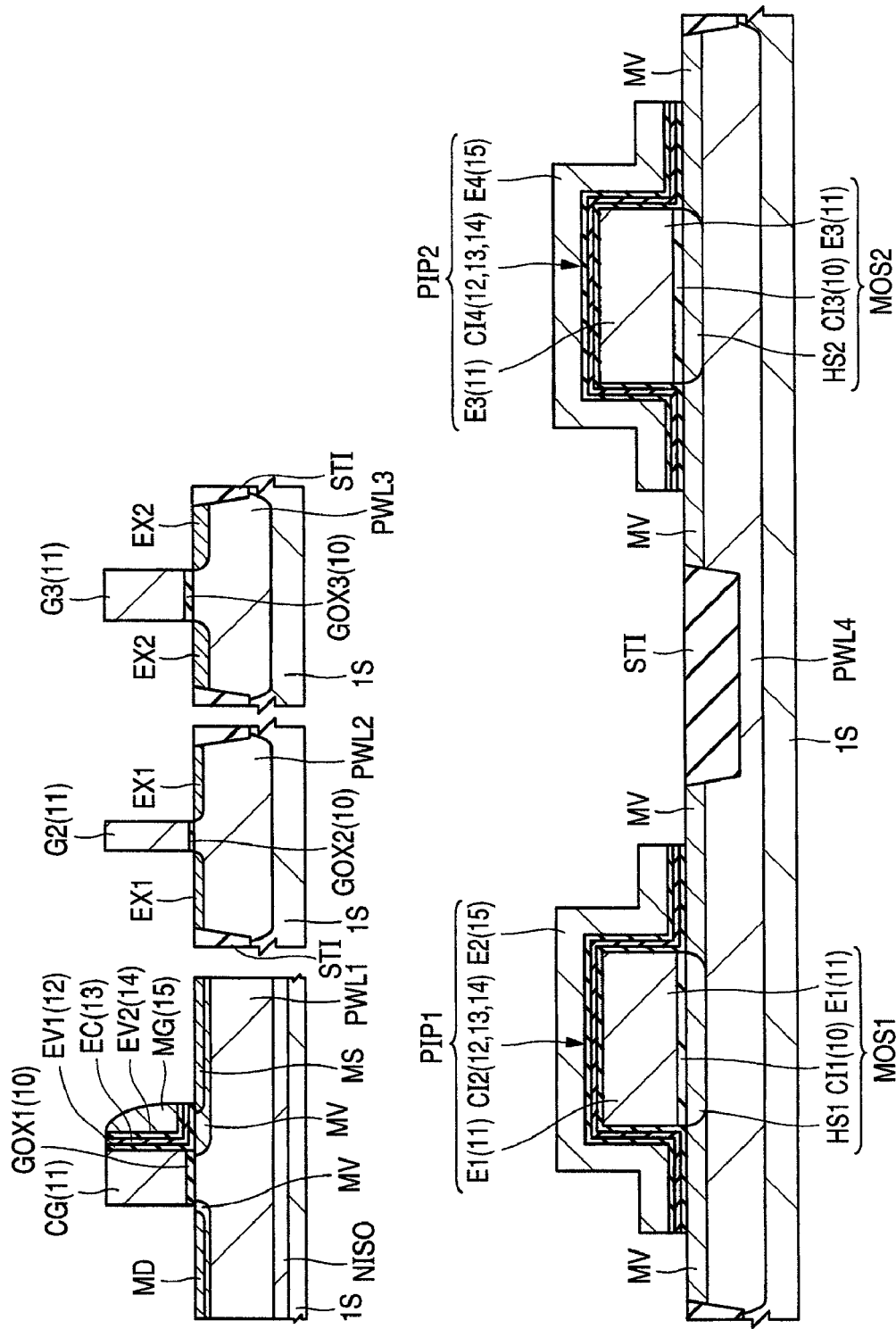
FIG. 21 is a section view illustrating a manufacturing process of the semiconductor device, following FIG. 20.

Subsequently, as shown in FIG. 21, the low-concentration impurity diffusion region EX1 including an n-type semiconductor region is formed in alignment with the gate electrode G2 and the low-concentration impurity diffusion region EX2 including an n-type semiconductor region is formed in alignment with the gate electrode G3 using the photolithography technique and the ion implantation method.

Figure 22:
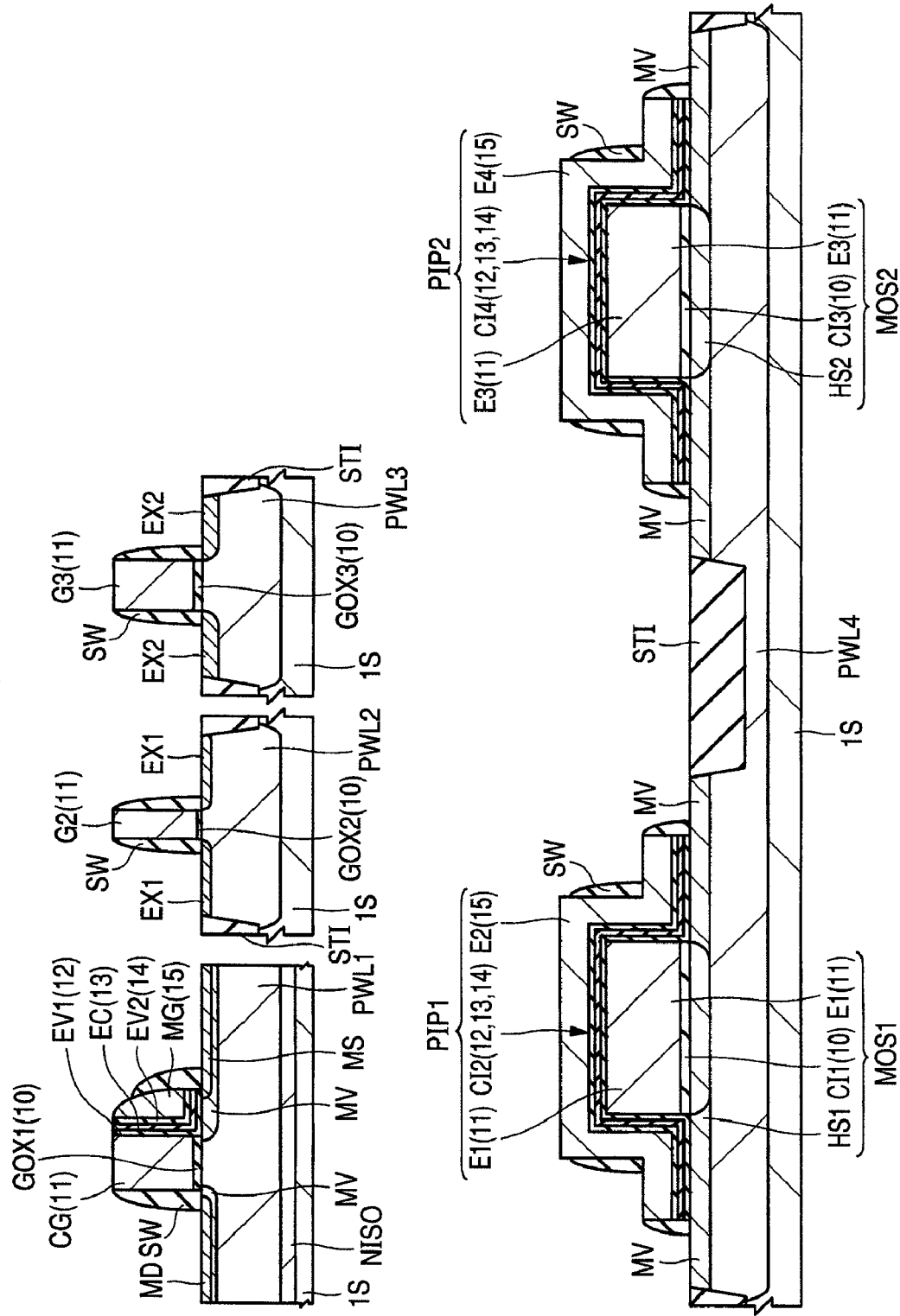
FIG. 22 is a section view illustrating a manufacturing process of the semiconductor device, following FIG. 21.

Then, as shown in FIG. 22, a silicon oxide film is formed over the semiconductor substrate 1S. The silicon oxide film can be formed using, for example, the CVD method. Then, by subjecting the silicon oxide film to anisotropic etching, the sidewall SW is formed. In the memory cell formation region, the sidewall SW is formed on the sidewall on the left-hand side of the control gate electrode CG and on the sidewall on the right-hand side of the memory gate electrode MG. Similarly, in the low withstand voltage MISFET formation region, the sidewall SW is formed on the sidewall on both sides of the gate electrode G2 and in the high withstand voltage MISFET formation region, the sidewall SW is formed on the sidewall on both sides of the gate electrode G3. On the other hand, in the capacitive element formation region, the sidewall SW is formed on the step part of the electrodes E2, E4. These sidewalls SW are formed from a single layer film of silicon oxide film, however, they are not limited and for example, it may also be possible to form the sidewall SW from a laminated film of a silicon nitride film and a silicon oxide film.

Figure 23:
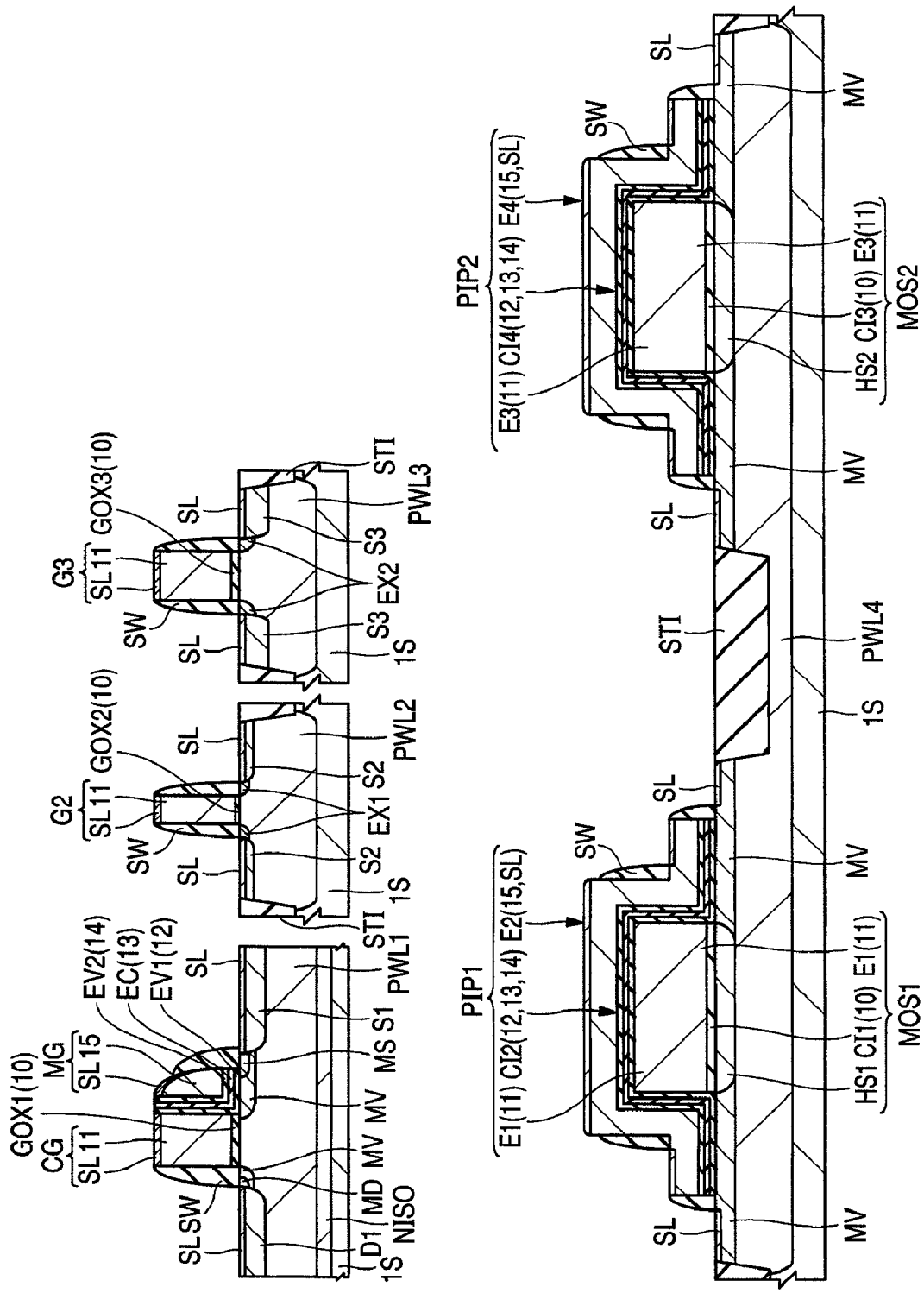
FIG. 23 is a section view illustrating a manufacturing process of the semiconductor device, following FIG. 22.

Next, as shown in FIG. 23, the deep high-concentration impurity diffusion regions S1, D1 in alignment with the sidewall are formed in the memory cell region using the photolithography technique and the ion implantation method. The deep high-concentration impurity diffusion regions S1, D1 are an n-type semiconductor region into which n-type impurities, such as phosphorus and arsenic, have been introduced. These deep high-concentration impurity diffusion regions S1, D1 and shallow low-concentration impurity diffusion regions MS, MD form the source region or the drain region of the memory cell. As described above, by forming the source region and the drain region by the shallow low-concentration impurity diffusion regions MS, MD and the deep high-concentration impurity diffusion regions S1, D1, it is possible to cause the source region and the drain region to have an LDD (Lightly Doped Drain) structure. Similarly, the deep high-concentration impurity diffusion regions S2, D2 in alignment with the sidewall SW are formed in the low withstand voltage MISFET formation region and deep high-concentration impurity diffusion regions S3, D3 in alignment with the sidewall SW are formed in the high withstand voltage MISFET formation region. The deep high-concentration impurity diffusion regions S2, D2 and the deep high-concentration impurity diffusion regions S3, D3 are an n-type semiconductor region into which n-type impurities, such as phosphorus and arsenic, have been introduced. The deep high-concentration impurity diffusion regions S2, D2 and the shallow low-concentration impurity diffusion region EX1 form the source region or the drain region of the low withstand voltage MISFET. Similarly, the deep high-concentration impurity diffusion regions S3, D3 and the shallow low-concentration impurity diffusion region EX2 form the source region or the drain region of the low withstand voltage MISFET. After forming the high-concentration impurity diffusion regions S1 to S3, D1 to D3 as described above, heat treatment at about 1,000° C. is performed. Due to this, the introduced impurities are activated.

Next, a cobalt film is formed over the semiconductor substrate 1S. At this time, in the memory cell formation region, the cobalt film is formed so as to come into direct contact with the exposed control gate electrode CG and the memory gate electrode MG. Similarly, the cobalt film comes into direct contact also with the deep high-concentration impurity diffusion regions S1, D1. Further, in the low withstand voltage MISFET formation region also, the cobalt film comes into contact with the gate electrode G2 and the deep high-concentration impurity diffusion regions S2, D2 and in the high withstand voltage MISFET formation region also, the cobalt film comes into contact with the gate electrode G3 and the deep high-concentration impurity diffusion regions S3, D3. On the other hand, in the capacitive element formation region, the cobalt film comes into direct contact with part of the electrodes E2, E4.

After that, the semiconductor substrate 1S is subjected to heat treatment. Due to this, in the memory cell formation region, the polysilicon films 11, 15 constituting the control gate electrode CG and the memory gate electrode MG are caused to react with the cobalt film to form the cobalt silicide film SL. Due to this, the control gate electrode CG and the memory gate electrode MG come to have a laminated structure of the polysilicon films 11, 15 and the cobalt silicide film SL, respectively. The cobalt silicide film SL is formed for the purpose of reducing the resistance of the control gate electrode CG and the memory gate electrode MG. Similarly, by the above-described heat treatment, over the surface of the high-concentration impurity diffusion regions S1, D1 also, silicon and the cobalt film react and thus the cobalt silicide film SL is formed. Because of this, it is possible to make an attempt to reduce the resistance also in the high-concentration impurity diffusion regions S1, D1.

Similarly, in the low withstand voltage MISFET formation region also, the polysilicon film 11 constituting the gate electrode G2 is caused to react with a cobalt film to form the cobalt silicide film SL. Due to this, the gate electrode G2 comes to have a laminated structure of the polysilicon film 11 and the cobalt silicide film SL, respectively. The cobalt silicide film SL is formed for the purpose of reducing the resistance of the gate electrode G2. By the above-described heat treatment, over the surface of the high-concentration impurity diffusion regions S2, D2 also, silicon and the cobalt film react and thus the cobalt silicide film SL is formed. Because of this, it is possible to make an attempt to reduce the resistance also in the high-concentration impurity diffusion regions S2, D2.

Further, in the high withstand voltage MISFET formation region also, the polysilicon film 11 constituting the gate electrode G3 is caused to react with a cobalt film to form the cobalt silicide film SL. Due to this, the gate electrode G3 comes to have a laminated structure of the polysilicon film 11 and the cobalt silicide film SL, respectively. The cobalt silicide film SL is formed for the purpose of reducing the resistance of the gate electrode G3. By the above-described heat treatment, over the surface of the high-concentration impurity diffusion regions S3, D3 also, silicon and a cobalt film react and thus the cobalt silicide film SL is formed. Because of this, it is possible to make an attempt to reduce the resistance also in the high-concentration impurity diffusion regions S3, D3.

On the other hand, in the capacitive element formation region also, the polysilicon film 15 constituting the electrodes E2, E4 is caused to react with a cobalt film to form the cobalt silicide film SL.

Then, the unreacted cobalt film is removed from the semiconductor substrate 1S. In the first embodiment, a configuration is such that the cobalt silicide film SL is formed, however, it may also be possible to form a nickel silicide film or a titanium silicide film instead of the cobalt silicide film SL. In the above-described manner, it is possible to form the memory cell in the memory cell formation region of the semiconductor substrate 1S and form the low withstand voltage MISFET in the low withstand voltage MISFET formation region. Further, it is possible to form the high withstand voltage MISFET in the high withstand voltage MISFET formation region and form the capacitive element in the capacitive element formation region. At this time, as for the capacitive element, it is possible to form one capacitor cell in which the MOS capacitor MOS1 and the polysilicon capacitor PIP1 are formed by lamination, and another capacitor cell in which the MOS capacitor MOS2 and the polysilicon capacitor PIP2 are formed by lamination.

Figure 24:
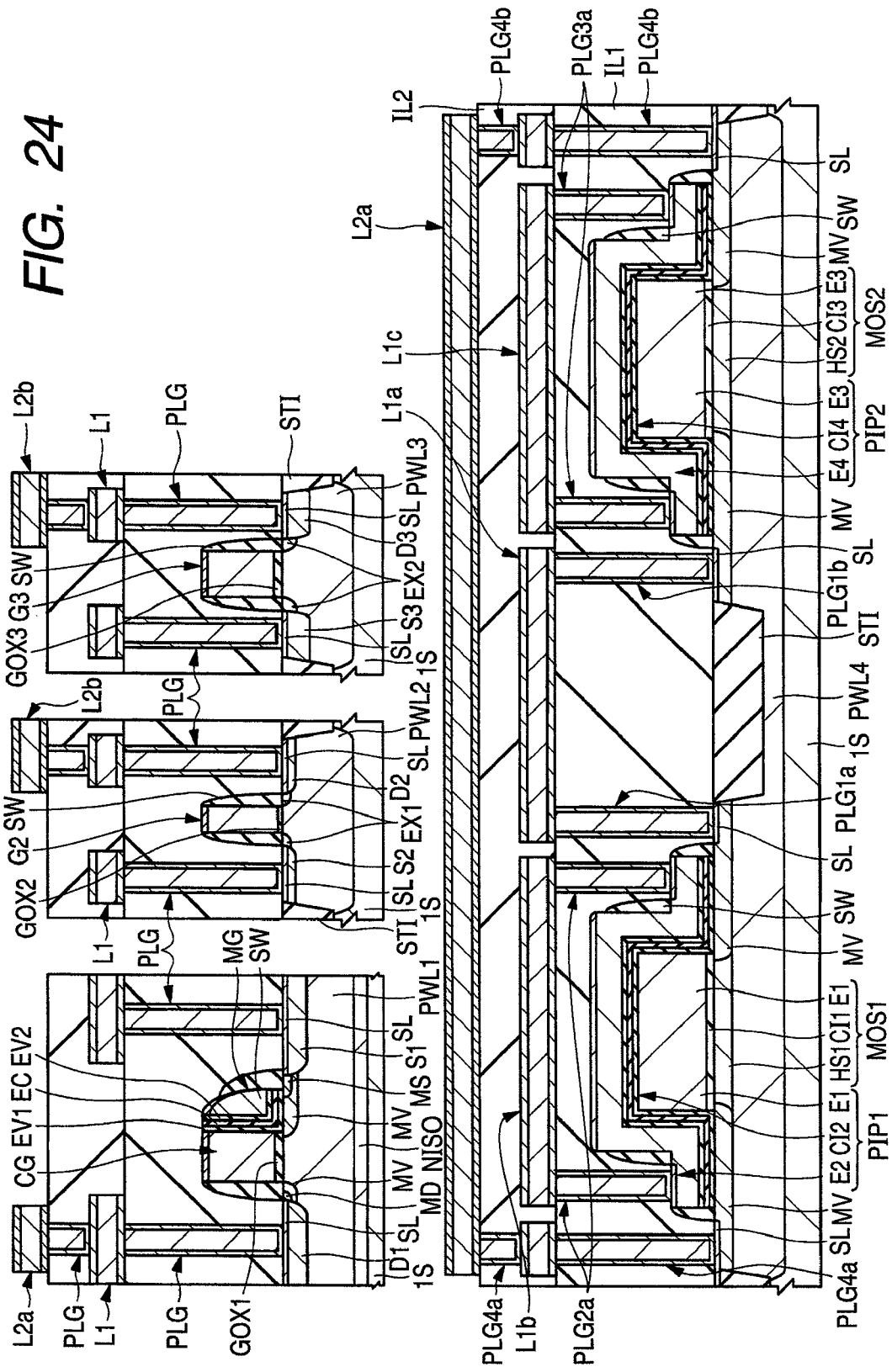
FIG. 24 is a section view illustrating a manufacturing process of the semiconductor device, following FIG. 23.

Next, the wiring process will be described with reference to FIG. 24. As shown in FIG. 24, the interlayer insulating film IL1 is formed over the main surface of the semiconductor substrate 1S. The interlayer insulating film IL1 is formed, for example, from a silicon oxide film and can be formed using the CVD method that uses, for example, TEOS (tetra ethyl ortho silicate) as a raw material. After that, the surface of the interlayer insulating film IL1 is flattened using, for example, the CMP (Chemical Mechanical Polishing) method.

Subsequently, a contact hole is formed in the interlayer insulating film IL1 using the photolithography technique and the etching technique. A plurality of contact holes is formed in the memory cell formation region, the low withstand voltage MISFET formation region, the high withstand voltage MISFET formation region, and the capacitive element formation region. Then, over the interlayer insulating film IL1 including the bottom and the inner wall of the contact hole, a titanium/titanium nitride film is formed. The titanium/titanium nitride film includes a laminated film of titanium film and titanium nitride film and can be formed using, for example, the sputtering method. This titanium/titanium nitride film has so-called barrier properties that prevent tungsten, which is material of a film to be embedded in a subsequent process, from diffusing into silicon.

Subsequently, a tungsten film is formed over the entire main surface of the semiconductor substrate 1S so as to be embedded in the contact hole. The tungsten film can be formed using, for example, the CVD method. Then, by removing the unwanted titanium/titanium nitride film and tungsten film formed over the interlayer insulating film IL1 by, for example, the CMP method, it is possible to form the plugs PLG, PLG1a, PLG1b, PLG2a, PLG3a, PLG4a and PLG4b.

Next, over the interlayer insulating film IL1 and the plugs PLG, PLG1a, PLG1b, PLG2a, PLG3a, PLG4a and PLG4b, a titanium/titanium nitride film, an aluminum film including copper, and a titanium/titanium nitride film are formed sequentially. These films can be formed using, for example, the sputtering method. Subsequently, these films are patterned using the photolithography technique and the etching technique to form the wires L1, L1a, L1b and L1c. Further, in the upper layer of the wires L1, L1a, L1b and L1c, a wire L2a and a wire L2b are formed, however, their description is omitted here. In this manner, it is possible to finally form the semiconductor device in the first embodiment.

Second Embodiment

In the above-described first embodiment, the case is described, where the high-concentration semiconductor regions HS1, HS2 are used as the lower electrode of the MOS capacitor MOS1 and the lower electrode of the MOS capacitor MOS2. In the second embodiment, an example will be described, in which the high-concentration semiconductor regions HS1, HS2 are not formed but a low-concentration n-type well is used as the lower electrode of the MOS capacitor MOS1 and a low-concentration p-type well is used as the lower electrode of the MOS capacitor MOS2.

Figure 25:
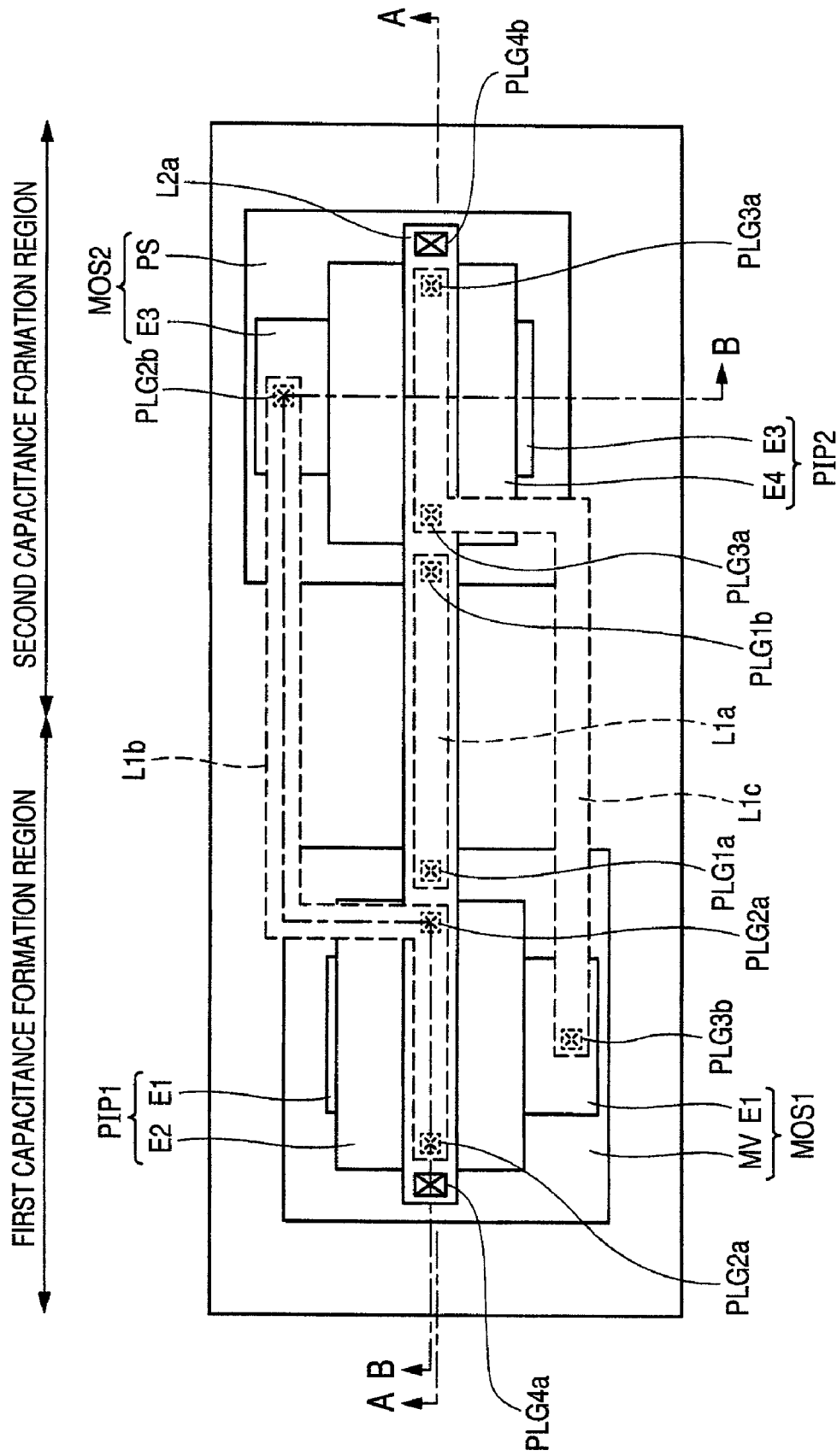
FIG. 25 is a plan view illustrating a layout configuration of capacitive elements in a second embodiment.

FIG. 25 is a plan view showing a connection configuration of capacitive elements in the second embodiment. On the left-hand side in FIG. 25, a first capacitance formation region is formed and on the right-hand side in FIG. 25, a second capacitance formation region is formed. In the first capacitance formation region formed on the left-hand side in FIG. 25, a capacitive element having a laminated structure of the MOS capacitor MOS1 and the polysilicon capacitor PIP1 is formed. Although an n-type well, which is the lower electrode of the MOS capacitor MOS1, is not seen, the n-type semiconductor region MV formed in this n-type well is shown schematically. On the other hand, in the second capacitance formation region formed on the right-hand side in FIG. 25, a capacitive element having a laminated structure of the MOS capacitor MOS2 and the polysilicon capacitor PIP2 is formed. Although a p-type well, which is the lower electrode of the MOS capacitor MOS2, is not seen, a p-type semiconductor region PS formed in this p-type well is shown schematically.

As described above, in the second embodiment, the lower electrode of the MOS capacitor MOS1 formed in the first capacitance formation region is formed from an n-type well and the lower electrode of the MOS capacitor MOS2 formed in the second capacitance formation region is formed from a p-type well. That is, in the above-described first embodiment, the lower electrodes of both the MOS capacitor MOS1 and the MOS capacitor MOS2 are formed by the high-concentration semiconductor regions HS1, HS2, an $n^{++}$-type semiconductor region, however, in the second embodiment, the lower electrode of the MOS capacitor MOS1 is formed by the n-type well, an n-type semiconductor region, and the lower electrode of the MOS capacitor MOS2 is formed by the p-type well, a p-type semiconductor region.

In the second embodiment also, the connection relationship between the capacitive element (MOS capacitor MOS1 and polysilicon capacitor PIP1) formed in the first capacitance formation region and the capacitive element (MOS capacitor MOS2 and polysilicon capacitor PIP2) formed in the second capacitance formation region is the same as that in the above-described first embodiment. For example, the n-type semiconductor region MV formed in the first capacitance formation region and the p-type semiconductor region PS formed in the second capacitance formation region are connected by the wire L2a via the plug PLG4a and the plug PLG4b as well as being connected by the wire L1a via the plug PLG1a and the plug PLG1b. In addition, the electrode E2 formed in the first capacitance formation region and the electrode E3 formed in the second capacitance formation region are connected by the wire L1b via the plug PLG2a and the plug PLG2b. Further, the electrode E1 formed in the first capacitance formation region and the electrode E4 formed in the second capacitance formation region are connected by the wire L1c via the plug PLG3a and the plug PLG3b.

Figure 26:
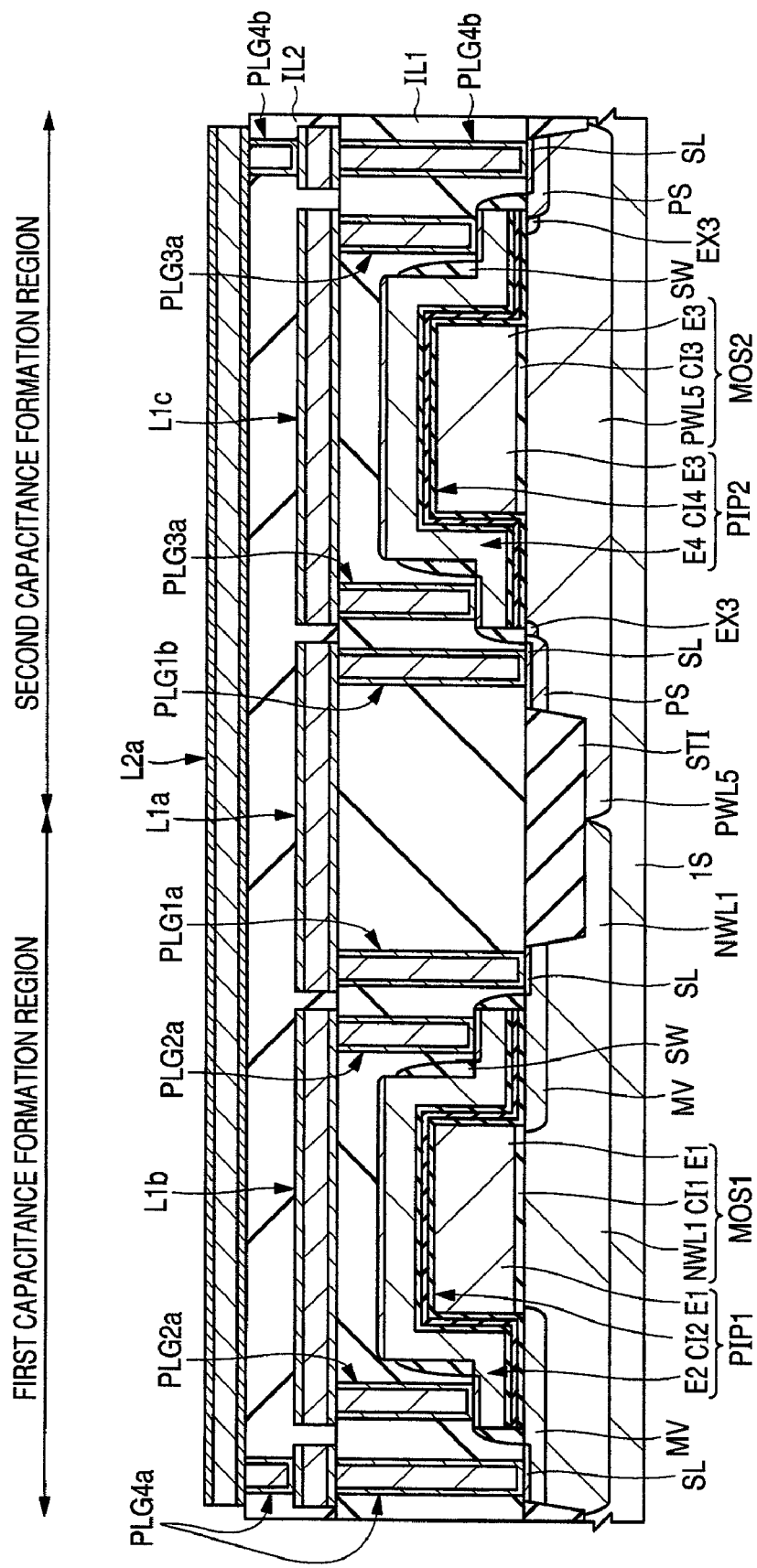
FIG. 26 is a section view cut along A-A line in FIG. 25.

FIG. 26 is a section view cut by A-A line in FIG. 25. As shown in FIG. 26, in the first capacitance formation region, an n-type well NWL1 is formed within the semiconductor substrate 1S and this n-type well NWL1 functions as the lower electrode of the MOS capacitor MOS1. Then, on both sides of the n-type well NWL1, the n-type semiconductor region MV is formed, and the right part of the n-type semiconductor region MV is connected with the wire L1a via the plug PLG1a penetrating through the interlayer insulating film IL1. Similarly, the left part of the n-type semiconductor region MV is connected with the wire L2a via the plug PLG4a formed in the interlayer insulating film IL1 and the interlayer insulating film IL2.

On the other hand, in the second capacitance formation region, a p-type well PWL5 is formed within the semiconductor substrate 1S and this p-type well PWL5 functions as the lower electrode of the MOS capacitor MOS2. Then, on both sides of the p-type well PWL5, a p-type semiconductor region EX3 and the p-type semiconductor region PS are formed, and the left part of the p-type semiconductor region PS is connected with the wire L1a via the plug PLG1b penetrating through the interlayer insulating film IL1. Similarly, the right part of the p-type semiconductor region PS is connected with the wire L2a via the plug PLG4b formed in the interlayer insulating film IL1 and the interlayer insulating film IL2.

Consequently, the n-type well NWL1 formed in the first capacitance formation region and the p-type well PWL5 formed in the second capacitance formation region are connected by the wire L1a and the wire L2a as a result. At this time, the n-type well NWL1 functions as the lower electrode of the MOS capacitor MOS1 and the p-type well PWL5 functions as the lower electrode of the MOS capacitor MOS2, and therefore, the lower electrode of the MOS capacitor MOS1 and the lower electrode of the MOS capacitor MOS2 are electrically connected by the wire L1a and the wire L2a as a result.

Figure 27:
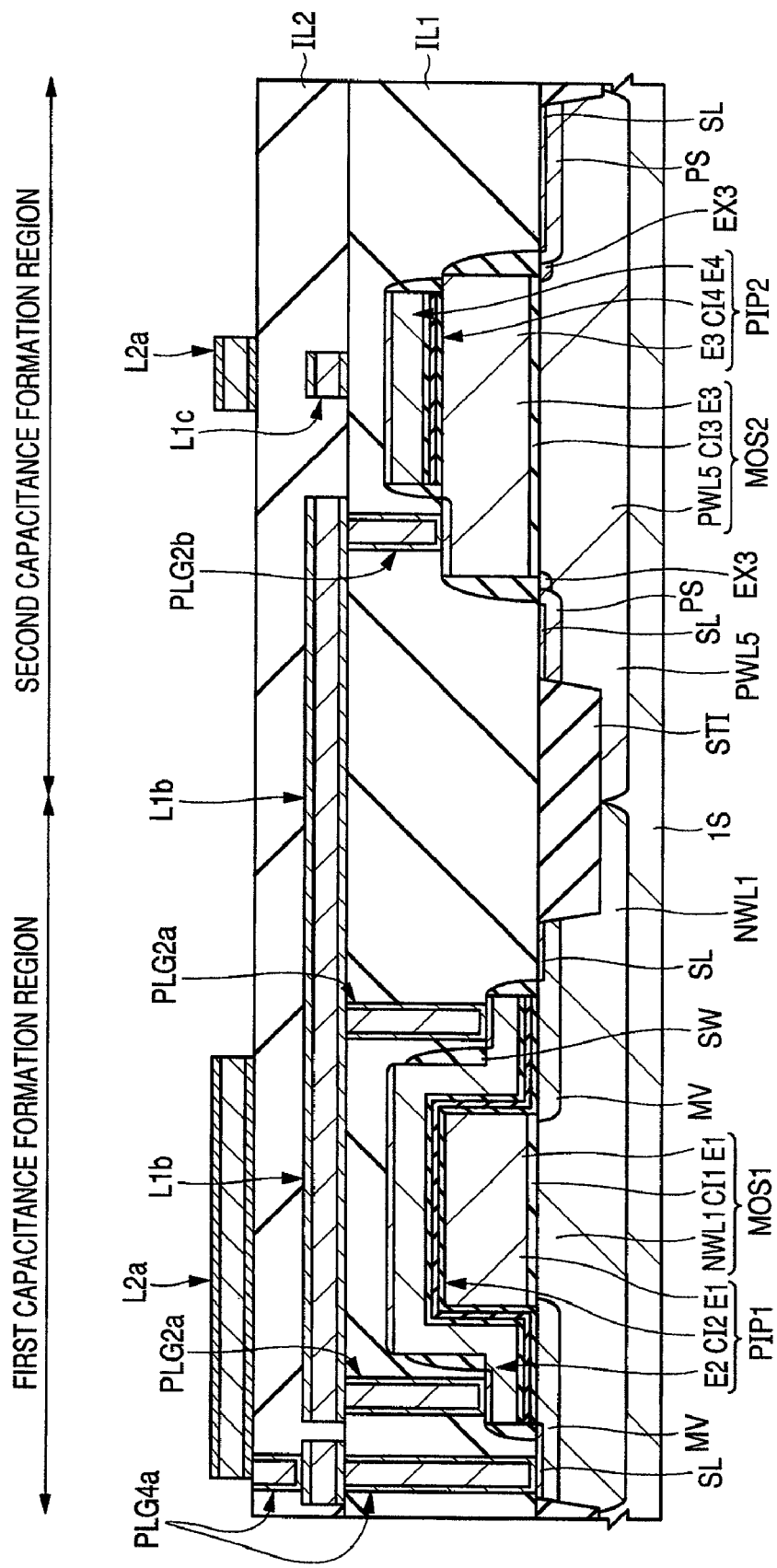
FIG. 27 is a section view cut along B-B line in FIG. 25.

FIG. 27 is a section view cut by B-B line in FIG. 25. As shown in FIG. 27, it can be seen that the electrode E2 formed in the first capacitance formation region and the electrode E3 formed in the second capacitance formation region are connected by the wire L1b via the plug PLG2a and the plug PLG2b penetrating through the interlayer insulating film IL1. The electrode E2 formed in the first capacitance formation region functions as the upper electrode of the polysilicon capacitor PIP1 and the electrode E3 formed in the second capacitance formation region functions as the lower electrode of the polysilicon capacitor PIP2, and therefore, the upper electrode of the polysilicon capacitor PIP1 and the lower electrode of the polysilicon capacitor PIP2 are connected by the wire L1b via the plug PLG2a and the plug PLG2b as a result.

In this manner, the capacitive element (MOS capacitor MOS1 and polysilicon capacitor PIP1) formed in the first capacitance formation region and the capacitive element (MOS capacitor MOS2 and polysilicon capacitor PIP2) formed in the second capacitance formation region are connected.

Figure 28:
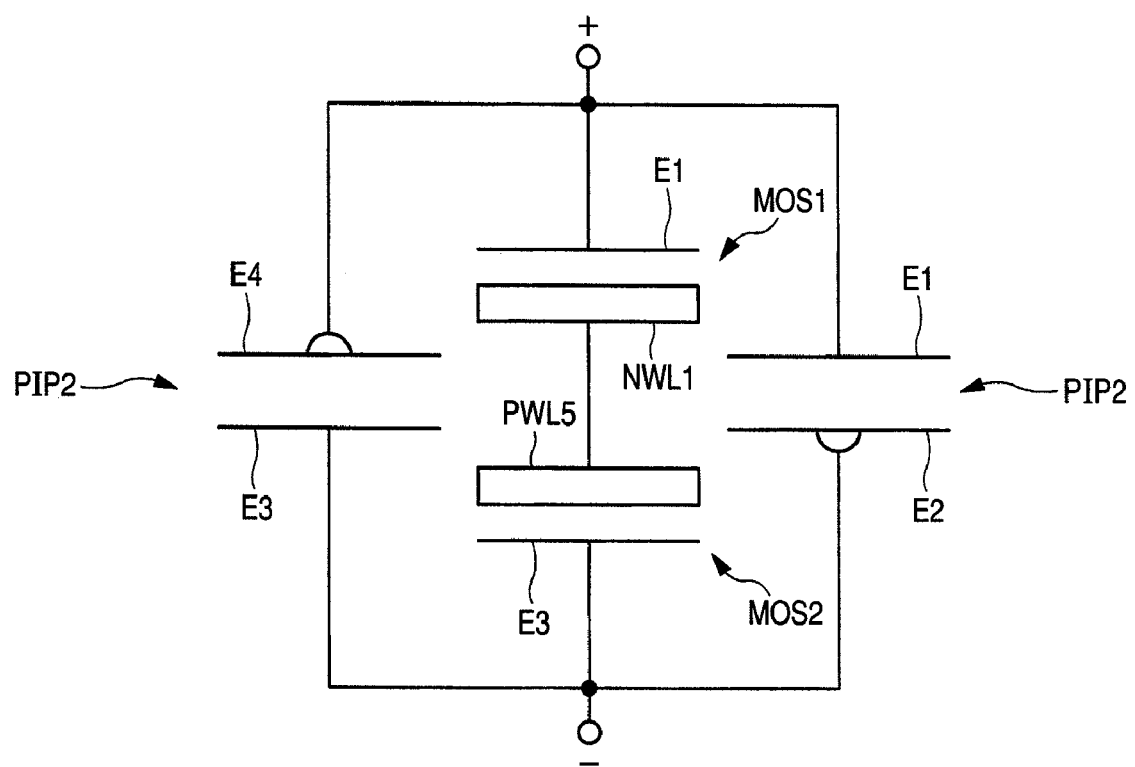
FIG. 28 is an equivalent circuit diagram illustrating a connection relationship of capacitive elements in the second embodiment.

FIG. 28 is an equivalent circuit diagram showing a connection relationship of capacitive elements in the second embodiment. As shown in FIG. 28, between the high potential (for example, power source potential) and the low potential (for example, reference potential), the MOS capacitor MOS1 and the MOS capacitor MOS2 are coupled in series and thereby a series capacitive element is formed, and the polysilicon capacitor PIP1 and the polysilicon capacitor PIP2 are coupled in parallel with the series capacitive element. For example, the semiconductor device in the second embodiment includes a power source wire to supply the power source potential and a reference wire to supply the reference potential, and the series capacitive element is coupled between the power source potential and the reference potential. At this time, the MOS capacitor MOS1 is coupled to the power source wire and the MOS capacitor MOS2 is coupled to the reference wire. Specifically, as shown in FIG. 28, the electrode E1 that functions as the upper electrode of the MOS capacitor MOS1 is coupled to the power source wire and the electrode E3 that functions as the upper electrode of the MOS capacitor MOS2 is coupled to the reference wire.

Consequently, in the second embodiment also, as in the above-described first embodiment, due to the first characteristic that the MOS capacitor MOS1 and the MOS capacitor MOS2 are coupled in series, it is possible to reduce the fraction defective of the products using capacitive elements. However, the capacitance value of the series capacitive element configured by coupling the MOS capacitor MOS1 and the MOS capacitor MOS2 in series is reduced, but it is possible to increase the capacitance value per unit capacitor cell due to the second characteristic that the polysilicon capacitor PIP1 and the polysilicon capacitor PIP2 are coupled in parallel with the series capacitive element. That is, according to the technical concept of the second embodiment, a remarkable effect can be exhibited that the fraction defective of products resulting from the pin hole defect of the MOS capacitor can be reduced and the capacitance value per unit capacitor cell can be increased.

Here, in the second embodiment, it is necessary to pay attention to the arrangement of the MOS capacitor MOS1 and the MOS capacitor MOS2. In FIG. 28, the MOS capacitor MOS1 is coupled to the high potential side and the MOS capacitor MOS2 is coupled to the low potential side. This is because, as explained in FIG. 11 in the above-described first embodiment, in the MOS capacitor MOS1, for example, the lower electrode is formed by the n-type well NWL1 with a low impurity concentration, and therefore, there exists voltage dependence of capacitance value. The MOS capacitor MOS1 in the second embodiment has voltage dependence corresponding to the MOS capacitor (3) shown in FIG. 11. Because of this, if the potential of the upper electrode (electrode E1) of the MOS capacitor MOS1 is arranged on the high potential side higher in potential than that of the n-type well NWL1, which is the lower electrode, it is possible to increase the capacitance value of the MOS capacitor MOS1.

On the other hand, in the MOS capacitor MOS2 also, the lower electrode is formed by the p-type well PWL5 with a low impurity concentration, and therefore, there exists voltage dependence of capacitance value. The MOS capacitor MOS2 in the second embodiment has voltage dependence corresponding to the MOS capacitor (2) shown in FIG. 11. Because of this, if the potential of the upper electrode (electrode E3) of the MOS capacitor MOS2 is arranged on the low potential side lower in potential than that of the p-type well PWL5, which is the lower electrode, it is possible to increase the capacitance value of the MOS capacitor MOS2.

From the above, it is desirable to couple the MOS capacitor MOS1 to the high potential side and couple the MOS capacitor MOS2 to the low potential side, as shown in FIG. 28, from the standpoint that the capacitance value of the MOS capacitor MOS1 and the capacitance value of the MOS capacitor MOS2 are both increased. In detail, while the electrode E1 that functions as the upper electrode of the MOS capacitor MOS1 is coupled to the high potential, the electrode E3 that functions as the upper electrode of the MOS capacitor MOS2 is coupled to the low potential. With such a configuration, it is possible to suppress the capacitance value of the capacitive element in the second embodiment from decreasing.

The capacitive element in the second embodiment is configured as described above and a method for manufacturing the capacitive element will be described below. The method for manufacturing a semiconductor device including the capacitive element in the second embodiment is substantially the same as that for manufacturing a semiconductor device in the above-described first embodiment, and therefore, different points will be described with emphasis placed thereon.

First, as in the above-described first embodiment, the element isolation region STI is formed in the semiconductor substrate 1S. Then, as shown in FIG. 29, impurities are introduced into the semiconductor substrate 1S in the memory cell formation region to form the well isolation layer NISO. After that, impurities are introduced into the semiconductor substrate 1S to form the p-type wells PWL1 to PWL3, the n-type well NWL1, and the p-type well PWL5. The p-type wells PWL1 to PWL3 and the p-type well PWL5 are formed by introducing p-type impurities, such as boron, for example, into the semiconductor substrate 1S by the ion implantation method. On the other hand, the n-type well NWL1 is formed by introducing n-type impurities, such as phosphorus and arsenic, for example, into the semiconductor substrate 1S by the ion implantation method. Specifically, the p-type well PWL1 is formed in the memory cell formation region and the p-type well PWL2 is formed in the low withstand voltage MISFET formation region. Similarly, the p-type well PWL3 is formed in the high withstand voltage MISFET formation region. Further, the n-type well NWL1 is formed in the first capacitance formation region of the capacitive element formation region and the p-type well PWL5 is formed in the second capacitance formation region of the capacitive element formation region. The n-type well NWL1 functions as the lower electrode of the MOS capacitor MOS1 and the p-type well PWL5 functions as the lower electrode of the MOS capacitor MOS2.

After that, in the second embodiment, the high-concentration semiconductor regions HS1, HS2 are not formed within the semiconductor substrate 1S, unlike the above-described first embodiment.

Next, after the same processes as those in FIG. 14 to FIG. 16, n-type impurities, such as phosphorus and arsenic, are introduced in alignment with the control gate electrode CG using the photolithography technique and the ion implantation method as shown in FIG. 30. In this manner, the n-type semiconductor region MV is formed in the memory cell formation region. This process is performed for the purpose of adjusting the threshold value of a memory transistor formed on a sidewall of the control gate electrode CG, to be described later. At this time, in the capacitive element formation region also, the n-type semiconductor region MV is formed in alignment with the electrode E1. However, the n-type semiconductor region MV is not formed in the second capacitance formation region. This is a point different from the above-described first embodiment.

Figure 31:
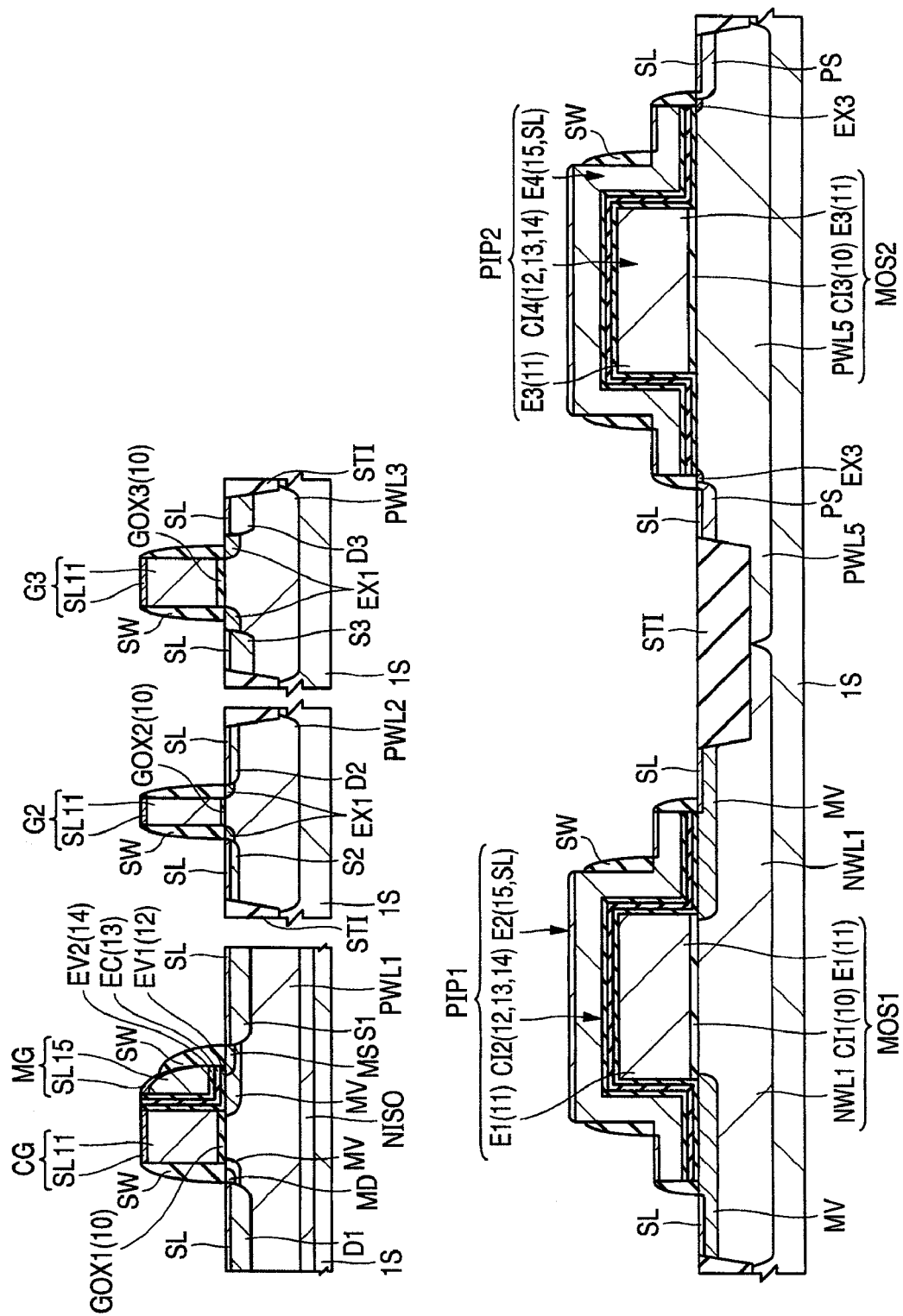
FIG. 31 is a section view illustrating a manufacturing process of the semiconductor device, following FIG. 30.

Subsequently, after the same processes as those in FIG. 18 to FIG. 21, the p-type semiconductor region EX3 is formed in the second capacitance formation region of the capacitive element formation region using the photolithography technique and the ion implantation method as shown in FIG. 31. Specifically, the p-type semiconductor region EX3 is formed in alignment with the electrode E4 formed in the second capacitance formation region. In the drawings attached to the present specification, only the n-channel type MISFET is shown schematically as the low withstand voltage MISFET and the high withstand voltage MISFET, however, actually, the p-channel type MISFET is also included in the low withstand voltage MISFET and the high withstand voltage MIS-FET. Because of this, it is possible to form the p-type semiconductor region EX3 in the second capacitance formation region by making use of the process for forming an extension region of the p-channel type MISFET (p-type semiconductor region).

Next, as in the above-described first embodiment, after forming the sidewall SW, the p-type semiconductor region PS is formed in alignment with the sidewall SW formed in the second capacitance formation region. It is also possible to form the semiconductor region PS by making use of the process for forming the source region and the drain region of the p-channel type MISFET. The subsequent processes are the same as those in the above-described first embodiment. In this manner, it is possible to form the semiconductor device in the second embodiment. Specifically, it is possible to form the lower electrode of the MOS capacitor MOS1 by the n-type well NWL1 and form the lower electrode of the MOS capacitor MOS2 by the p-type well PWL5. The second embodiment has an advantage that the manufacturing process can be simplified because it is possible to eliminate the process for forming the high-concentration semiconductor regions HS1, HS2, which is necessary in the above-described first embodiment.

Third Embodiment

The third embodiment is the same as the above-described second embodiment in that an n-type well with a low concentration is used as the lower electrode of the MOS capacitor MOS1 and a p-type well with a low concentration is used as the lower electrode of the MOS capacitor MOS2, however, differs from the second embodiment in the configuration of a drawn region drawn from the respective lower electrodes.

Figure 32:
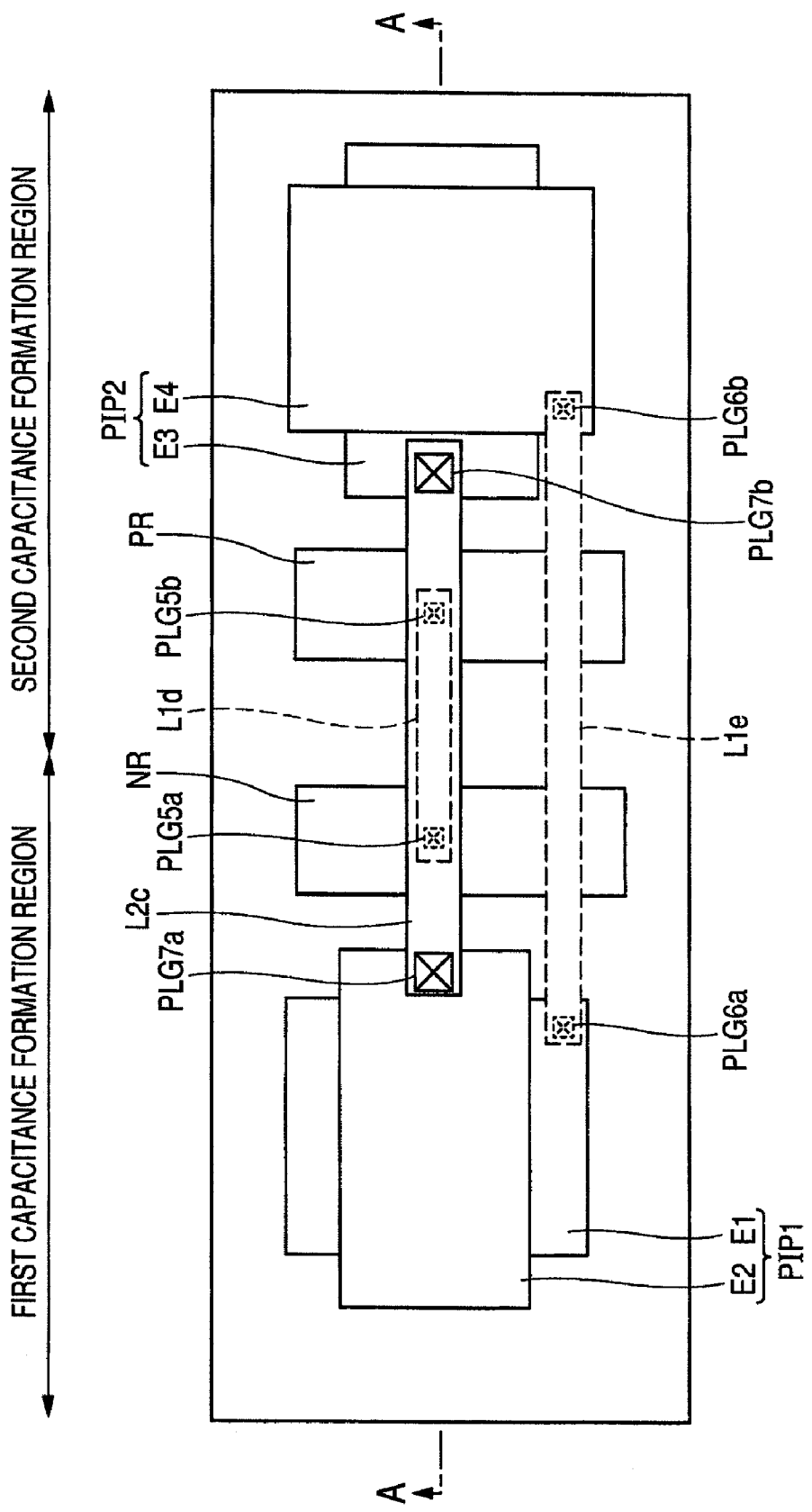
FIG. 32 is a plan view illustrating a layout configuration of capacitive elements in a third embodiment.

FIG. 32 is a plan view showing a connection configuration of capacitive elements in the third embodiment. On the left-hand side in FIG. 32, a first capacitance formation region is formed and on the right-hand side in FIG. 32, a second capacitance formation region is formed. In the first capacitance formation region formed on the left-hand side in FIG. 32, a capacitive element having a laminated structure of the MOS capacitor MOS1 and the polysilicon capacitor PIP1 is formed. Although an n-type well, which is the lower electrode of the MOS capacitor MOS1, is not seen, a drawn region electrically connected with this n-type well is shown schematically. The drawn region is formed by an n-type semiconductor region NR. On the other hand, in the second capacitance formation region formed on the right-hand side in FIG. 32, a capacitive element having a laminated structure of the MOS capacitor MOS2 and the polysilicon capacitor PIP2 is formed. Although a p-type well, which is the lower electrode of the MOS capacitor MOS2, is not seen, the drawn region electrically connected with this p-type well is shown schematically. This drawn region is formed by a p-type semiconductor region PR. Next, with reference to FIG. 32, the connection relationship between the capacitive element (MOS capacitor MOS1 and polysilicon capacitor PIP1) formed in the first capacitance formation region and the capacitive element (MOS capacitor MOS2 and polysilicon capacitor PIP2) formed in the second capacitance formation region will be described. For example, the n-type semiconductor region NR formed in the first capacitance formation region and the p-type semiconductor region PR formed in the second capacitance formation region are connected by a wire L1d via a plug PLG5a and a plug PLG5b. In addition, the electrode E2 formed in the first capacitance formation region and the electrode E3 formed in the second capacitance formation region are connected by a wire L2c via a plug PLG7a and a plug PLG7b. Further, the electrode E1 formed in the first capacitance formation region and the electrode E4 formed in the second capacitance formation region are connected by a wire L1e via a plug PLG6a and a plug PLG6b.

FIG. 33 is a section view cut by A-A line in FIG. 32. As shown in FIG. 33, in the first capacitance formation region, the n-type well NWL1 is formed within the semiconductor substrate 1S and this n-type well NWL1 functions as the lower electrode of the MOS capacitor MOS1. Then, the n-type semiconductor region NR, which is the drawn region, is formed so as to be electrically connected with the n-type well NWL1. The n-type semiconductor region NR is connected with the wire L1d via the plug PLG5a penetrating through the interlayer insulating film IL1.

On the other hand, in the second capacitance formation region, the p-type well PWL5 is formed within the semiconductor substrate 1S and this p-type well PWL5 functions as the lower electrode of the MOS capacitor MOS2. Then, the p-type semiconductor region PR, which is the drawn region, is formed so as to be electrically connected with the p-type well NWL5. The p-type semiconductor region PR is connected with the wire L1d via the plug PLG5b penetrating through the interlayer insulating film IL1.

Consequently, the n-type well NWL1 formed in the first capacitance formation region and the p-type well PWL5 formed in the second capacitance formation region are connected by the wire L1d as a result. At this time, the n-type well NWL1 functions as the lower electrode of the MOS capacitor MOS1 and the p-type well PWL5 functions as the lower electrode of the MOS capacitor MOS2, and therefore, the lower electrode of the MOS capacitor MOS1 and the lower electrode of the MOS capacitor MOS2 are electrically connected by the wire L1d as a result.

Further, as shown in FIG. 33, it can be seen that the electrode E2 formed in the first capacitance formation region and the electrode E3 formed in the second capacitance formation region are connected by the wire L2c via the plug PLG7a and the plug PLG7b penetrating through the interlayer insulating film IL1 and the interlayer insulating film IL2. The electrode E2 formed in the first capacitance formation region functions as the upper electrode of the polysilicon capacitor PIP1 and the electrode E3 formed in the second capacitance formation region functions as the lower electrode of the polysilicon capacitor PIP2, and therefore, the upper electrode of the polysilicon capacitor PIP1 and the lower electrode of the polysilicon capacitor PIP2 are connected by the wire L2c via the plug PLG7a and the plug PLG7b as a result.

In addition, in the third embodiment, the position at which the plug PLG7a is formed is one at which the electrode E1 and the electrode E2 do not overlap like the plug PLG2a in the above-described first embodiment and the above-described second embodiment. This also applies to the plug PLG6b.

In this manner, the capacitive element (MOS capacitor MOS1 and polysilicon capacitor PIP1) formed in the first capacitance formation region and the capacitive element (MOS capacitor MOS2 and polysilicon capacitor PIP2) formed in the second capacitance formation region are coupled.

As described above, the capacitive elements in the third embodiment are also coupled as shown in the equivalent circuit diagram shown in FIG. 28. Consequently, in the third embodiment also, due to the first characteristic that the MOS capacitor MOS1 and the MOS capacitor MOS2 are coupled in series, it is possible to reduce the fraction defective of products using capacitive elements. However, the capacitance value of the series capacitive element configured by coupling the MOS capacitor MOS1 and the MOS capacitor MOS2 in series is reduced, but it is possible to increase the capacitance value per unit capacitor cell due to the second characteristic that the polysilicon capacitor PIP1 and the polysilicon capacitor PIP2 are coupled in parallel with the series capacitive element. That is, according to the technical concept of the third embodiment, a remarkable effect can be exhibited that the fraction defective of products resulting from the pin hole defect of the MOS capacitor can be reduced and the capacitance value per unit capacitor cell can be increased.

The capacitive element in the third embodiment is configured as described above and a method for manufacturing the same will be described below. The method for manufacturing a semiconductor device including the capacitive element in the third embodiment is substantially the same as that for manufacturing a semiconductor device in the above-described second embodiment. However, it is necessary to form the n-type semiconductor region NR and the p-type semiconductor region PR shown in FIG. 33 in the third embodiment. For example, it is also possible to form the n-type semiconductor region NR by making use of the process for forming the n-type semiconductor region MV to be formed in a memory cell as in the above-described first embodiment and the above-described second embodiment and, for example, to form it by making use of the process for forming the low-concentration impurity diffusion region EX1 and the high-concentration impurity diffusion regions S1, D1 in the low withstand voltage MISFET, or the low-concentration impurity diffusion region EX2 and the high-concentration impurity diffusion regions S2, D2 in the high withstand voltage MISFET. In addition, it is possible to form the p-type semiconductor region PR by making use of the process for forming the source region and the drain region in the p-channel type MISFET. From the above, the third embodiment has an advantage that the degree of freedom to form the n-type semiconductor region NR and the p-type semiconductor region PR, which are the drawn regions, is improved as a result.

Fourth Embodiment

In the above-described first to third embodiments, the examples are shown in which the capacitive element having a laminated structure is formed by the same process as that in which the nonvolatile memory that accumulates charges in the charge storage film EC is formed, however, in the fourth embodiment, as shown in FIG. 34, an example is shown in which it is formed by the same process as that in which a nonvolatile memory that accumulates charges in a floating gate electrode FG is formed.

That is, in the memory cell formed in the memory cell formation region of a nonvolatile memory, charges are accumulated in the floating gate electrode FG formed over the semiconductor substrate 1S (p-type well PWL1) via a gate insulating film GOX4. Over the floating gate electrode FG, the control gate electrode CG is formed via a potential barrier film EV3. Here, the gate insulating film GOX4 includes, for example, a silicon oxide film. The floating gate electrode FG includes, for example, a polysilicon film (polycrystal silicon film). The potential barrier film EV3 includes a laminated film (ONO film) of the silicon oxide film 12, the silicon nitride film 13, and the silicon oxide film 14. The control gate electrode CG includes, for example, a polysilicon film 20, a tungsten silicide film 21, etc.

Then, in the capacitance formation region, the MOS capacitor MOS1 and the polysilicon capacitor PIP1 are formed. In the MOS capacitor MOS1, the n-type well NWL1 is used as the lower electrode and the electrode E1 is used as the upper electrode, and between the n-type well NWL1 and the electrode E1, the capacitor insulating film CI1 is formed. In the polysilicon capacitor PIP1, the electrode E1 is used as the lower electrode and the electrode E2 is used as the upper electrode, and between the electrode E1 and the electrode E2, the capacitor insulating film CI2 is formed. Here, the capacitor insulating film CI1 is formed by the same process as that in which the gate insulating film GOX4 is formed and the electrode E1 is formed by the same process as that in which the floating gate electrode FG is formed. Further, the capacitor insulating film CI2 is formed by the same process as that in which the potential barrier film EV3 is formed and the electrode E2 is formed by the same process as that in which the control gate electrode CG is formed. That is, the capacitor insulating film CI1 is formed from the same silicon oxide film as that from which the gate insulating film GOX4 is formed and the electrode E1 is formed from the same polysilicon film as that from which the floating gate electrode FG is formed. Then, the capacitor insulating film CI2 is formed from the laminated film of the silicon oxide film 12, the silicon nitride film 13, and the silicon oxide film 14, which are the same as those of the laminated film from which the potential barrier film EV3 is formed, and the electrode E2 is formed from the polysilicon film 20 and the tungsten silicide film 21, which are the same as those from which the control gate electrode CG is formed.

As the nonvolatile memory in the fourth embodiment, mention is made of a flash memory of NOR or NAND type.

It is possible to obtain the same effect as that in the above-described first to third embodiments by realizing the connection relationship between capacitive elements shown in the above-described first to third embodiments using a plurality of capacitive elements having the laminated structure shown in the fourth embodiment.

In the above, the invention accomplished by the present inventors has been specifically described based on the embodiments. However, it cannot be overemphasized that the present invention is not restricted to the embodiments, and it can be changed variously within the range not departing from the gist.

In the above-describe embodiments, a cobalt silicide film is shown as an example as a silicide film, however, a nickel silicide film may be accepted.

In addition, in the above-described embodiments, the case is shown as an example, where a conductive film including aluminum as its main component is used as a wire, however, a conductive film including copper as its main component may be used for formation. In such a case, the wiring structure can be formed by forming a groove in the interlayer insulating film IL1 or IL2 and embedding a conductive film including copper as its main component into the groove.

The present invention can be broadly used for the manufacturing industry which manufactures a semiconductor device.

What is claimed is:

1. A semiconductor device having a first capacitance formation region and a second capacitance formation region in a semiconductor substrate, the semiconductor device comprising:
   a first capacitive element including: (a1) a first lower electrode having a first semiconductor region formed in the semiconductor substrate; (a2) a first capacitor insulating film formed over the first semiconductor region; and (a3) a first upper electrode having a first conductive film formed over the first capacitor insulating film; and
   a second capacitive element including: (b1) a second lower electrode having the first conductive film; (b2) a second capacitor insulating film formed over the first conductive film; and (b3) a second upper electrode having a second conductive film formed over the second capacitor insulating film,
   formed in the first capacitance formation region, and
   a third capacitive element including: (c1) a third lower electrode having a second semiconductor region formed in the semiconductor substrate; (c2) a third capacitor insulating film formed over the second semiconductor region; and (c3) a third upper electrode having a first conductive film formed over the first capacitor insulating film, and
   a fourth capacitive element including: (d1) a fourth lower electrode having the first conductive film; (d2) a fourth capacitor insulating film formed over the first conductive film; and (d3) a fourth upper electrode having a second conductive film formed over the second capacitor insulating film,
   formed in the second capacitance formation region,
      wherein the first capacitive element and the third capacitive element are coupled in series to form a series capacitive element;
      wherein the series capacitive element and the second capacitive element are coupled in parallel; and
      wherein the series capacitive element and the fourth capacitive element are also coupled in parallel.

2. The semiconductor device according to claim 1,
   wherein the first semiconductor region and the second semiconductor region are a semiconductor region of the same conductivity type,
   wherein the first semiconductor region has the highest impurity concentration among semiconductor regions existing in the semiconductor substrate in the first capacitance formation region, and
   wherein the second semiconductor region has the highest impurity concentration among semiconductor regions existing in the semiconductor substrate in the second capacitance formation region.

3. The semiconductor device according to claim 2,
   wherein the first semiconductor region and the second semiconductor region are an n-type semiconductor region with the same concentration.

4. The semiconductor device according to claim 1,
   wherein all of the series capacitive element formed by coupling in series the first capacitive element and the third capacitive element, the second capacitive element coupled in parallel with the series capacitive element, and the fourth capacitive element coupled in parallel with the series capacitive element are coupled between a first potential and a second potential lower than the first potential.

5. The semiconductor device according to claim 4, further having in the semiconductor substrate:
   a low withstand voltage MISFET formation region in which a low withstand voltage MISFET operating using a first power source potential is formed; and
   a high withstand voltage MISFET formation region in which a high withstand voltage MISFET operating using a second power source potential higher than the first power source potential is formed.

6. The semiconductor device according to claim 5,
   wherein the series capacitive element, the second capacitive element, and the fourth capacitive element are used in a circuit that uses the low withstand voltage MISFET.

7. The semiconductor device according to claim 6,
wherein the first potential is the first power source potential that operates the low withstand voltage MISFET and the second potential is a reference potential.

8. The semiconductor device according to claim 1,
wherein the semiconductor substrate further has a memory cell formation region in which a nonvolatile memory cell is formed,
wherein the nonvolatile memory cell includes: (e1) a gate insulating film formed on the semiconductor substrate; (e2) a control gate electrode formed on the gate insulating film; and (e3) a memory gate electrode formed on one of sidewalls of the control gate electrode via an insulating film, and
wherein the insulating film includes a first potential barrier film, a charge storage film formed over the first potential barrier film, and a second potential barrier film formed over the charge storage film.

9. The semiconductor device according to claim 8,
wherein the gate insulating film, the first capacitor insulating film, and the third capacitor insulating film are formed from the same film,
wherein the control gate electrode is formed by processing the first conductive film,
wherein the insulating film, the second capacitor insulating film, and the fourth capacitor insulating film are formed from the same film, and
wherein the memory gate electrode is formed by processing the second conductive film.

10. The semiconductor device according to claim 9,
wherein the first conductive film and the second conductive film are formed from a polysilicon film.

11. The semiconductor device according to claim 10,
wherein the insulating film and the second capacitor insulating film are formed from a laminated film including a first silicon oxide film, a silicon nitride film, and a second silicon oxide film.

12. The semiconductor device according to claim 1,
wherein the first semiconductor region is an n-type well and the second semiconductor region is a p-type well.

13. The semiconductor device according to claim 12,
wherein all of the series capacitive element formed by coupling in series the first capacitive element and the third capacitive element, the second capacitive element coupled in parallel with the series capacitive element, and the fourth capacitive element coupled in parallel with the series capacitive element are coupled between a first potential and a second potential lower than the first potential.

14. The semiconductor device according to claim 13,
wherein, among the series capacitive elements coupled between the first potential and the second potential, the first capacitive element is arranged on the first potential side and the third capacitive element is arranged on the second potential side.

15. The semiconductor device according to claim 14,
wherein the first upper electrode of the first capacitive element is coupled to the first potential and the third upper electrode of the third capacitive element is coupled to the second potential.

16. The semiconductor device according to claim 15,
wherein the first potential is a power source potential and the second potential is a reference potential.

* * * * *